United States Patent [19]

Takahashi

[11] Patent Number: 4,566,071
[45] Date of Patent: Jan. 21, 1986

[54] APPARATUS FOR AUTOMATICALLY INSERTING ELECTRONIC PARTS INTO PRINTED CIRCUIT BOARD

[75] Inventor: Hiroshi Takahashi, Mito, Japan

[73] Assignee: Ikegami Tsushinki Co. Ltd., Tokyo, Japan

[21] Appl. No.: 451,842

[22] Filed: Dec. 21, 1982

[30] Foreign Application Priority Data

Dec. 26, 1981 [JP] Japan .................................. 56-210608

[51] Int. Cl.$^4$ .............................................. H05K 3/30
[52] U.S. Cl. ..................................... 364/468; 29/740;
364/189; 364/131
[58] Field of Search ................ 364/468, 488, 489, 490,
364/491; 318/640; 29/739, 740, 741, 710;
361/400

[56] References Cited

U.S. PATENT DOCUMENTS

| | | | |
|---|---|---|---|
| 4,103,814 | 8/1978 | Nishioka ......................... | 318/640 X |
| 4,202,092 | 5/1980 | Shibasaki et al. ..................... | 29/741 |
| 4,212,075 | 6/1980 | Cleversey et al. ............... | 364/489 X |
| 4,327,484 | 5/1982 | Asai et al. .......................... | 29/739 X |
| 4,386,464 | 6/1983 | Yanai et al. ......................... | 29/739 X |
| 4,401,234 | 8/1983 | Droira et al. ...................... | 29/741 X |
| 4,451,324 | 5/1984 | Ichikawa et al. .................. | 29/739 X |

Primary Examiner—Jerry Smith
Assistant Examiner—Allen MacDonald

Attorney, Agent, or Firm—Spencer & Frank

[57] ABSTRACT

An automatic insertor for inserting pins of ICs into holes formed in a printed circuit board includes a cassette holding section for holding a number of cassettes, each of which contains a plurality of ICs of the same kind, an IC discharging section for selectively discharging desired ICs successively from given cassettes, an IC carrier section for carrying the ICs successively supplied from the cassettes into an inlet of an IC rail arranged in inclined fashion, an inferior IC rejecting section for removing inferior ICs when the pins of the IC are deformed beyond an acceptable range, a first gate for stopping the ICs supplied from the inferior IC rejecting section and supplying the stopped ICs at a given timing, a pin correcting and cutting section for correcting the position and posture of IC pins and cutting the tips of the IC pins into V-shape, a second gate for temporarily retaining the ICs supplied from the pin correcting and cutting section, a polarity detecting and inverting section for detecting the polarity of ICs and turning the ICs over 180° when the detected polarity is opposite to that denoted during a copy mode, a third gate for temporarily retaining the ICs, and an inserting section for gripping the IC pins and inserting them into the holes in the printed circuit board, which is mounted on an XY table which is driven by positional data stored during the copy mode into given inserting positions.

30 Claims, 161 Drawing Figures

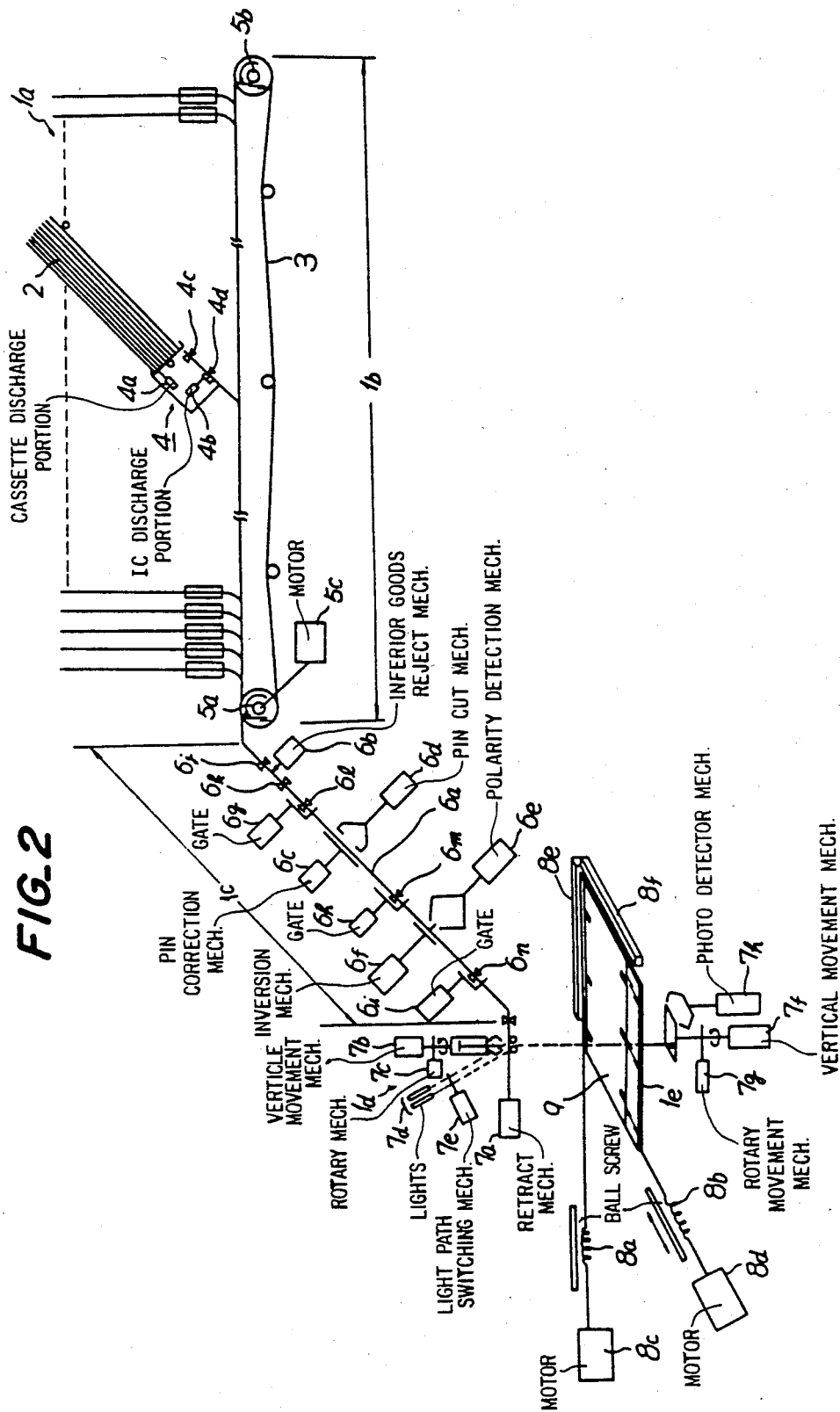

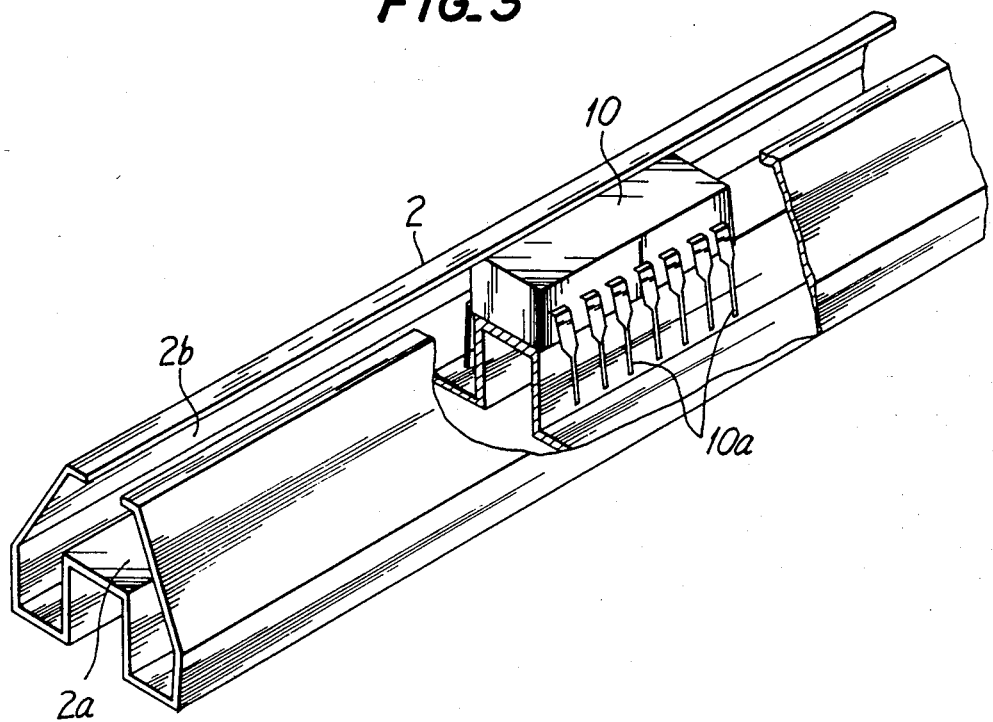

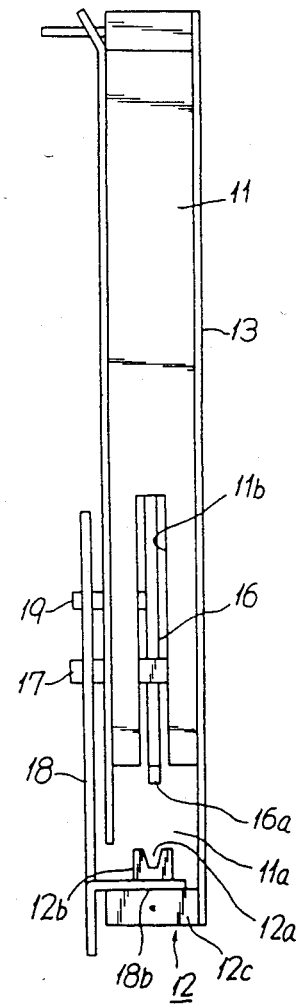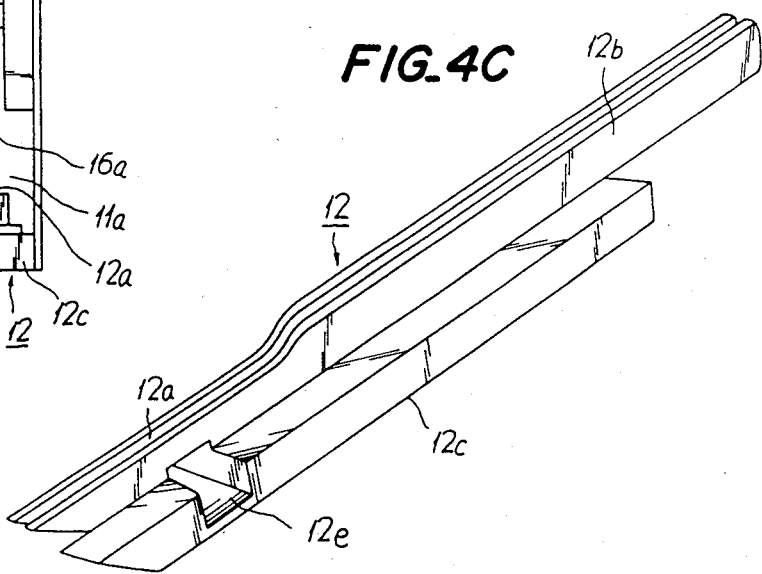

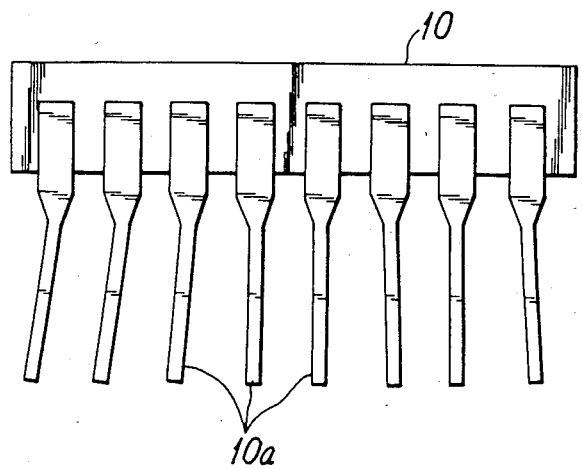
FIG_5A
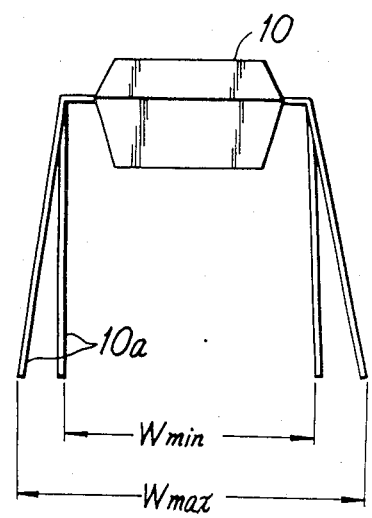
FIG_5B
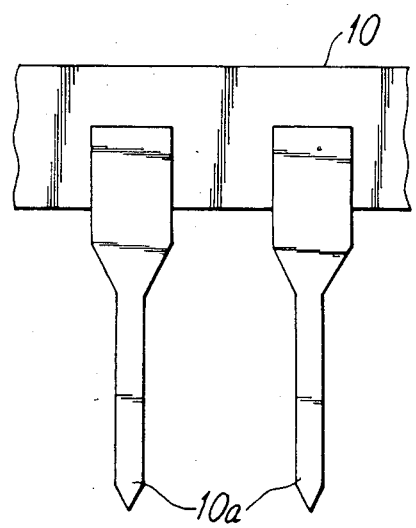
FIG_5C

FIG_6A
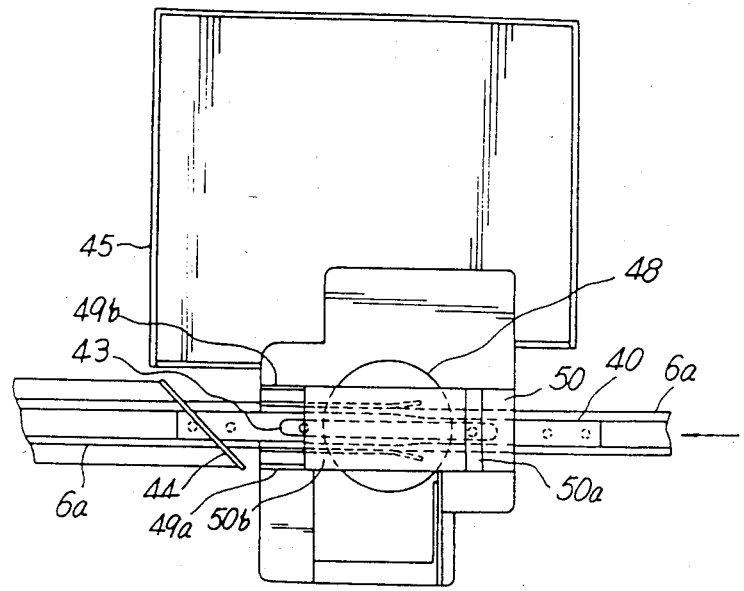
FIG_6B
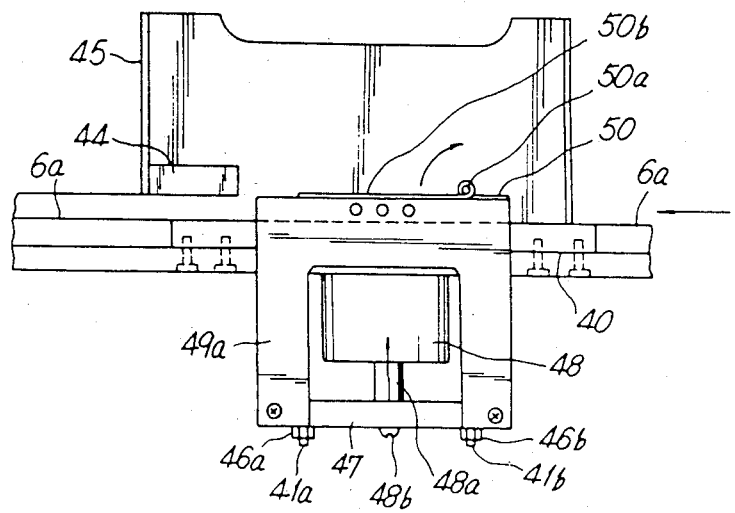

FIG. 7A
FIG. 7B
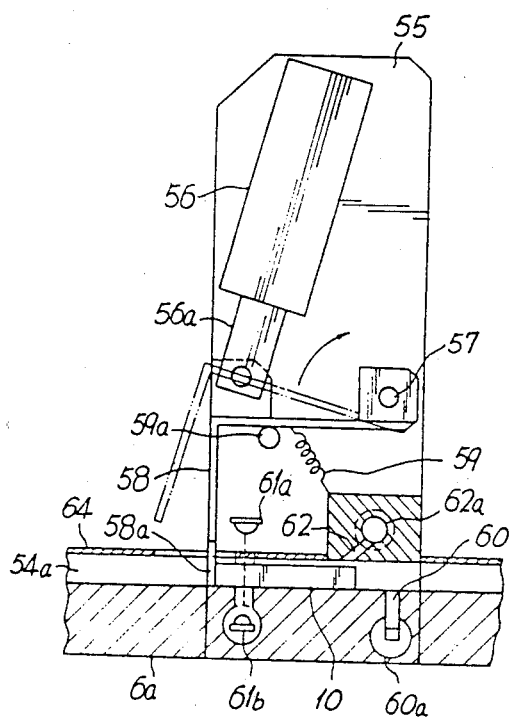
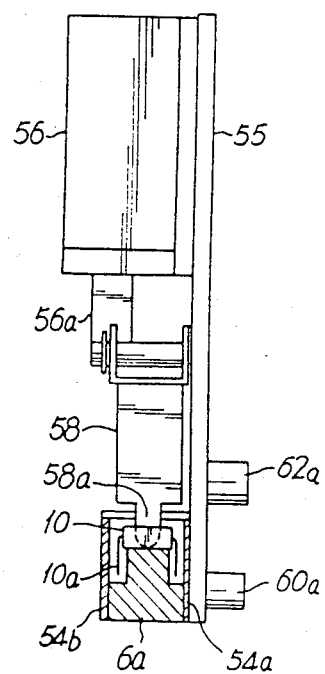

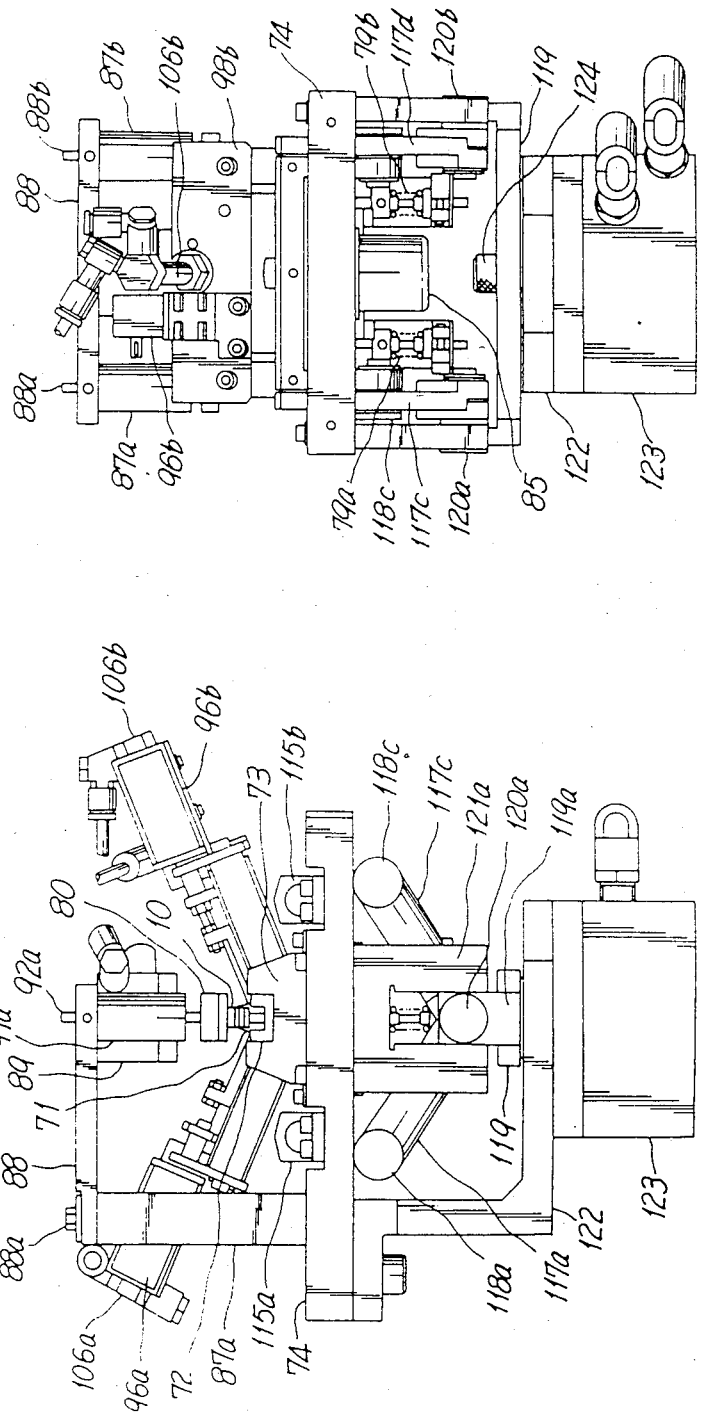

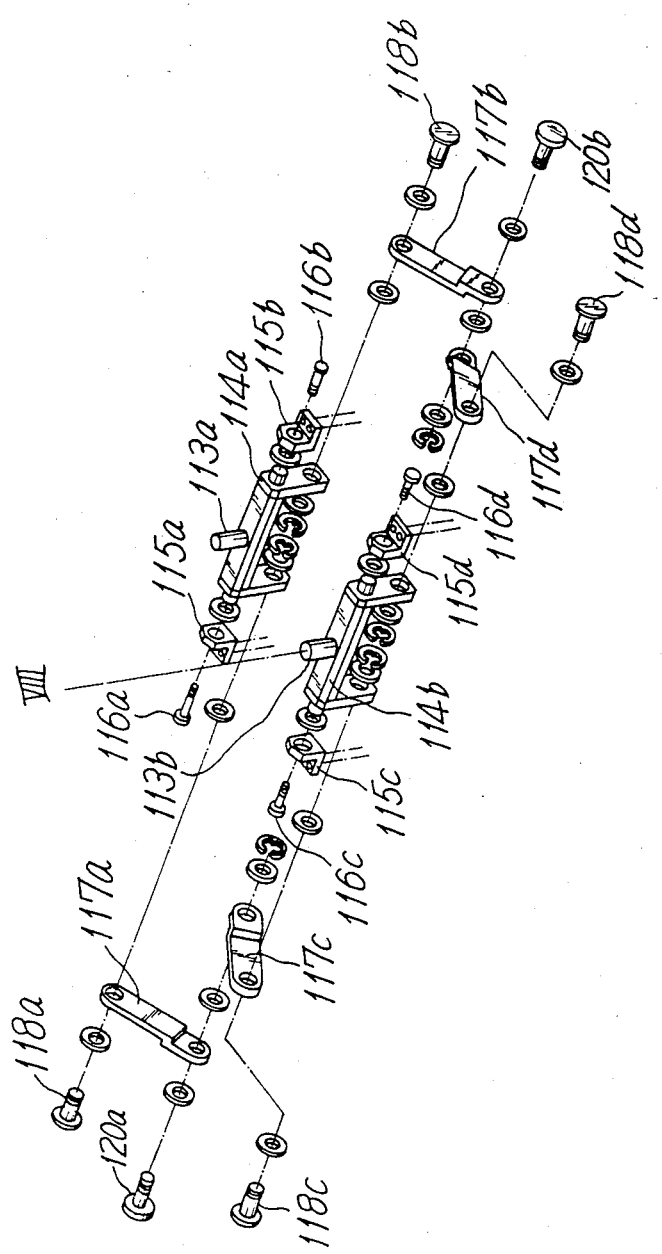

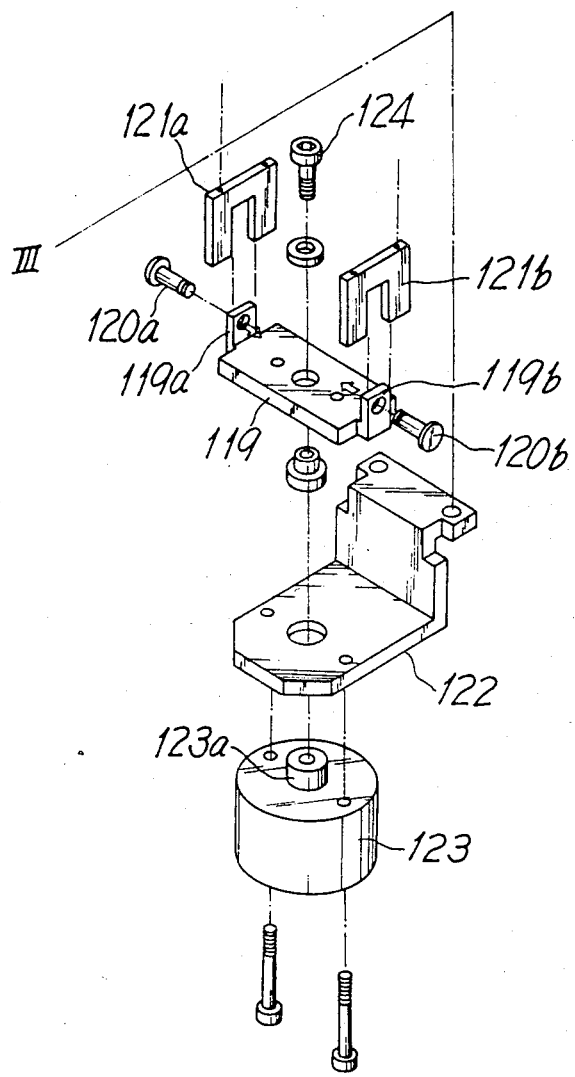

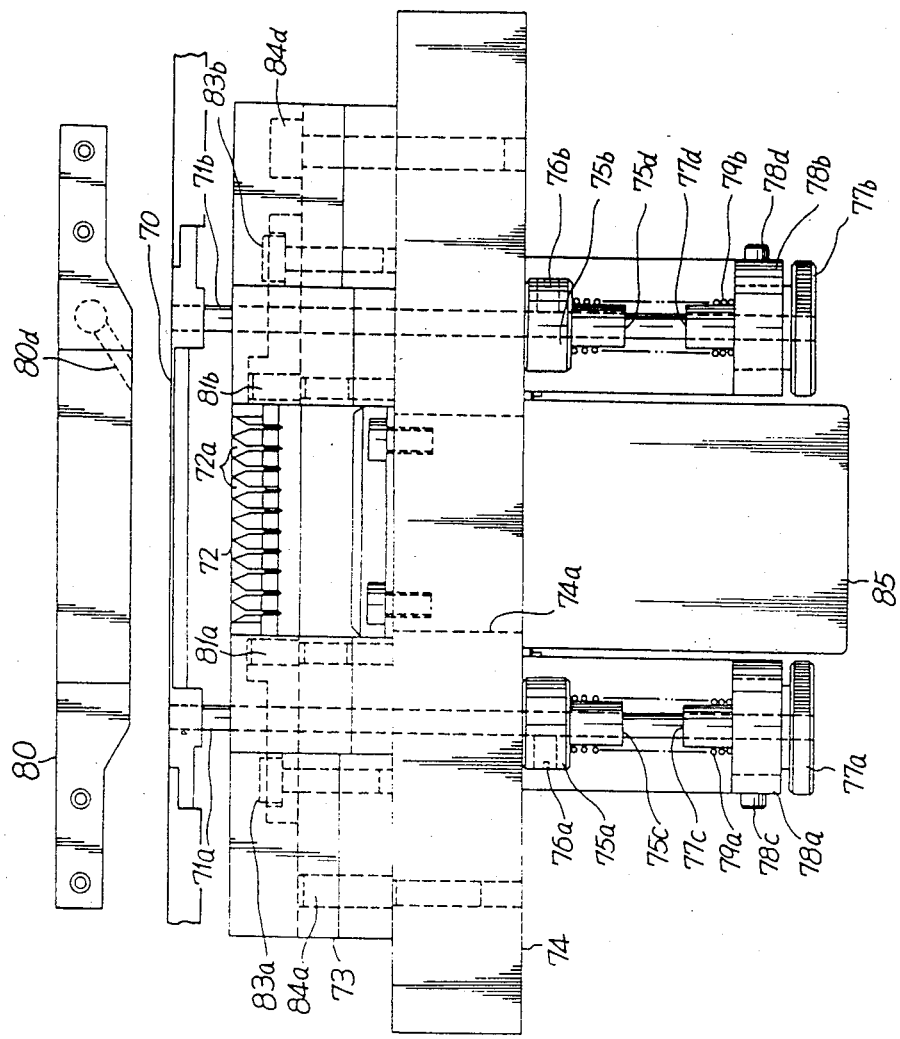

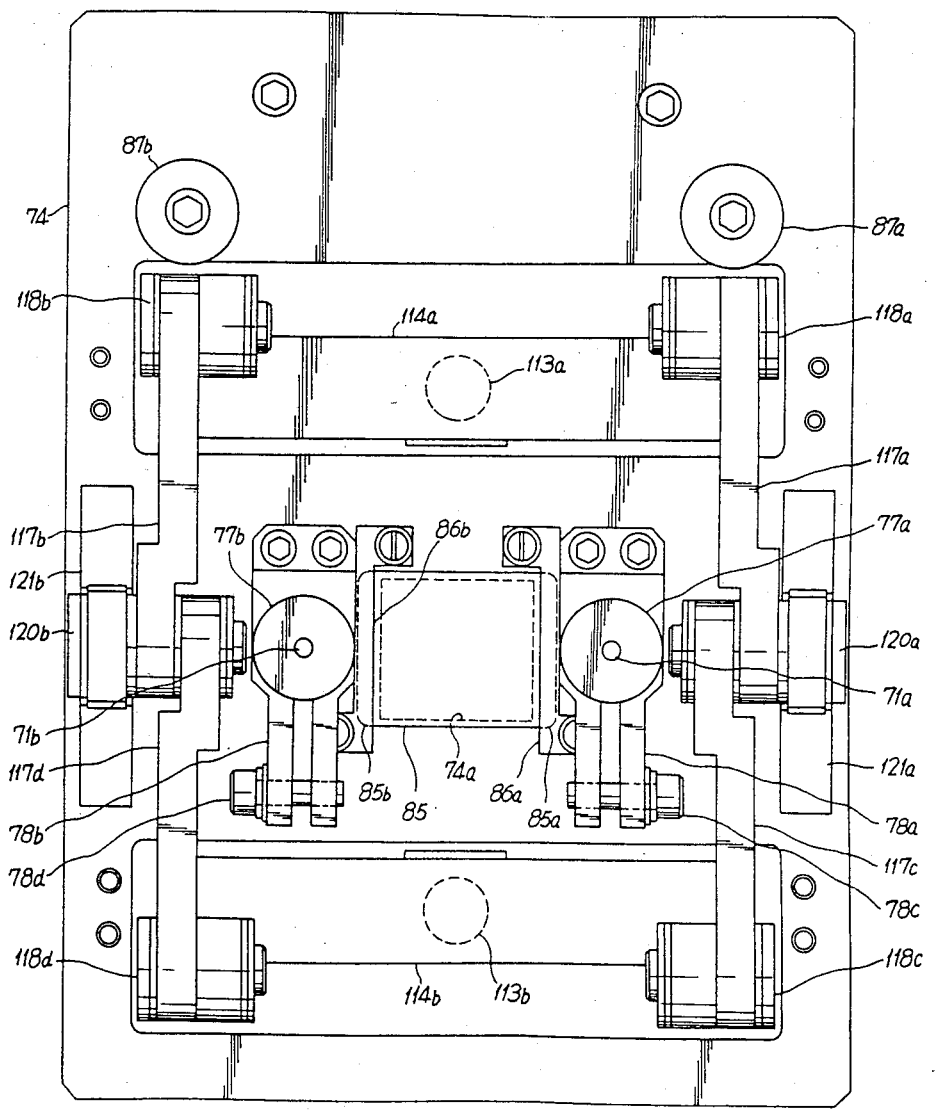
FIG_11

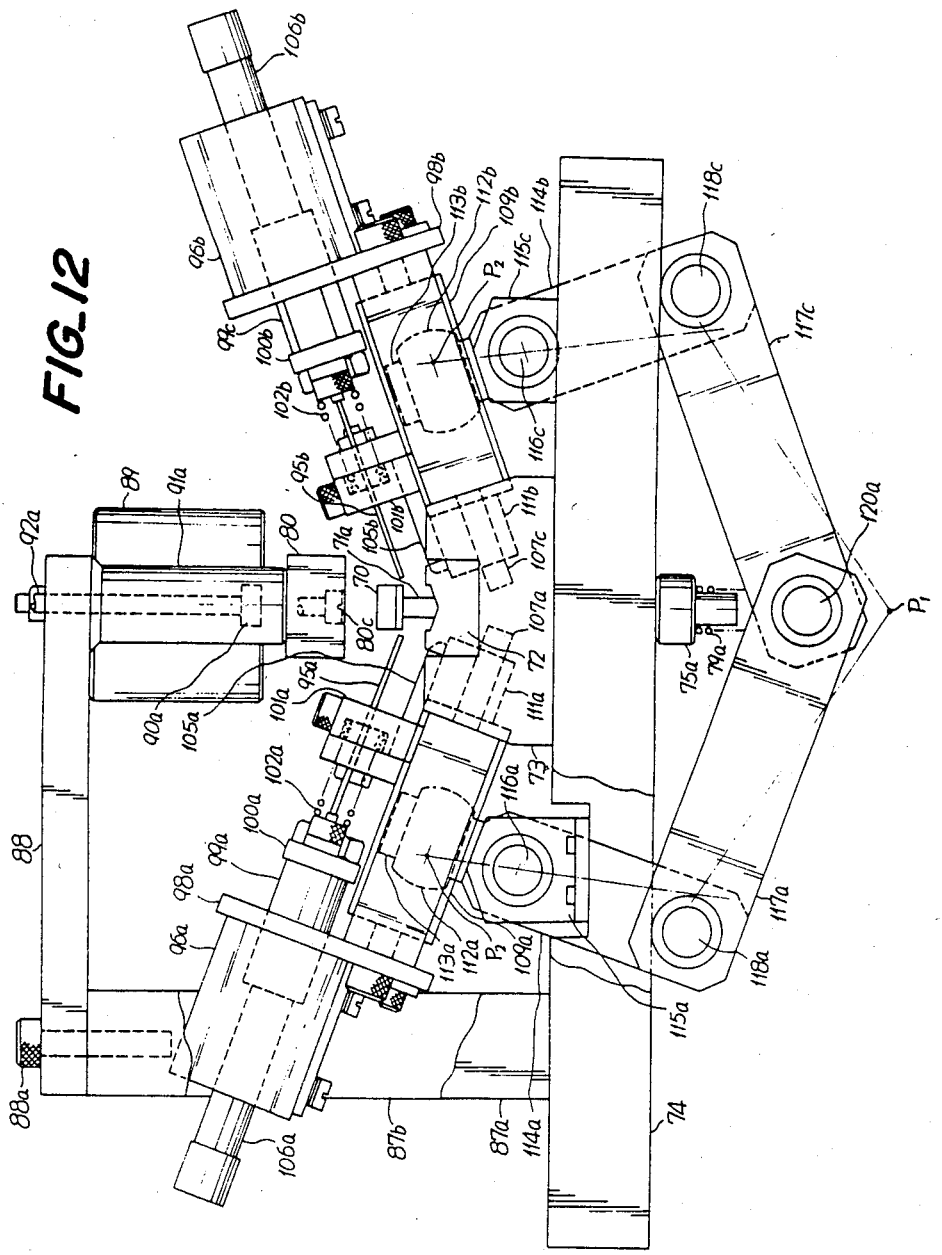

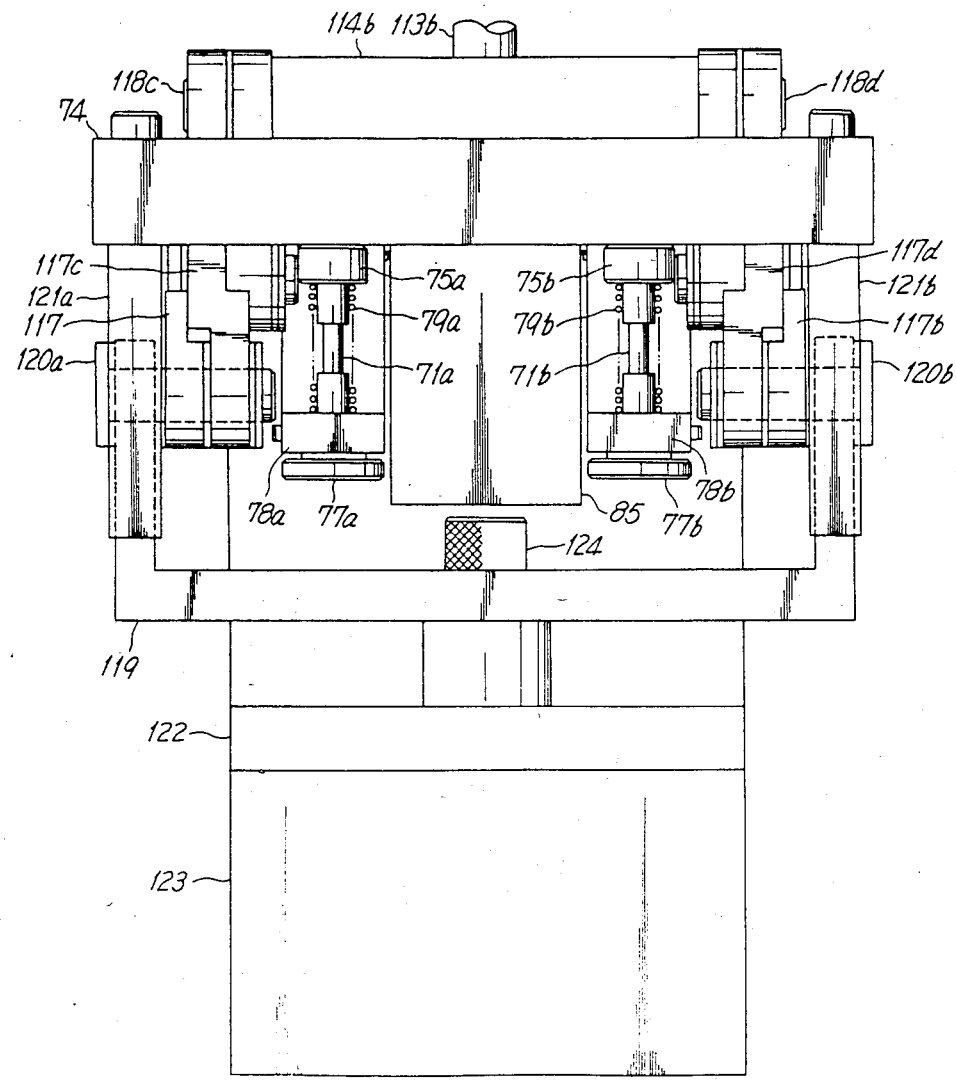

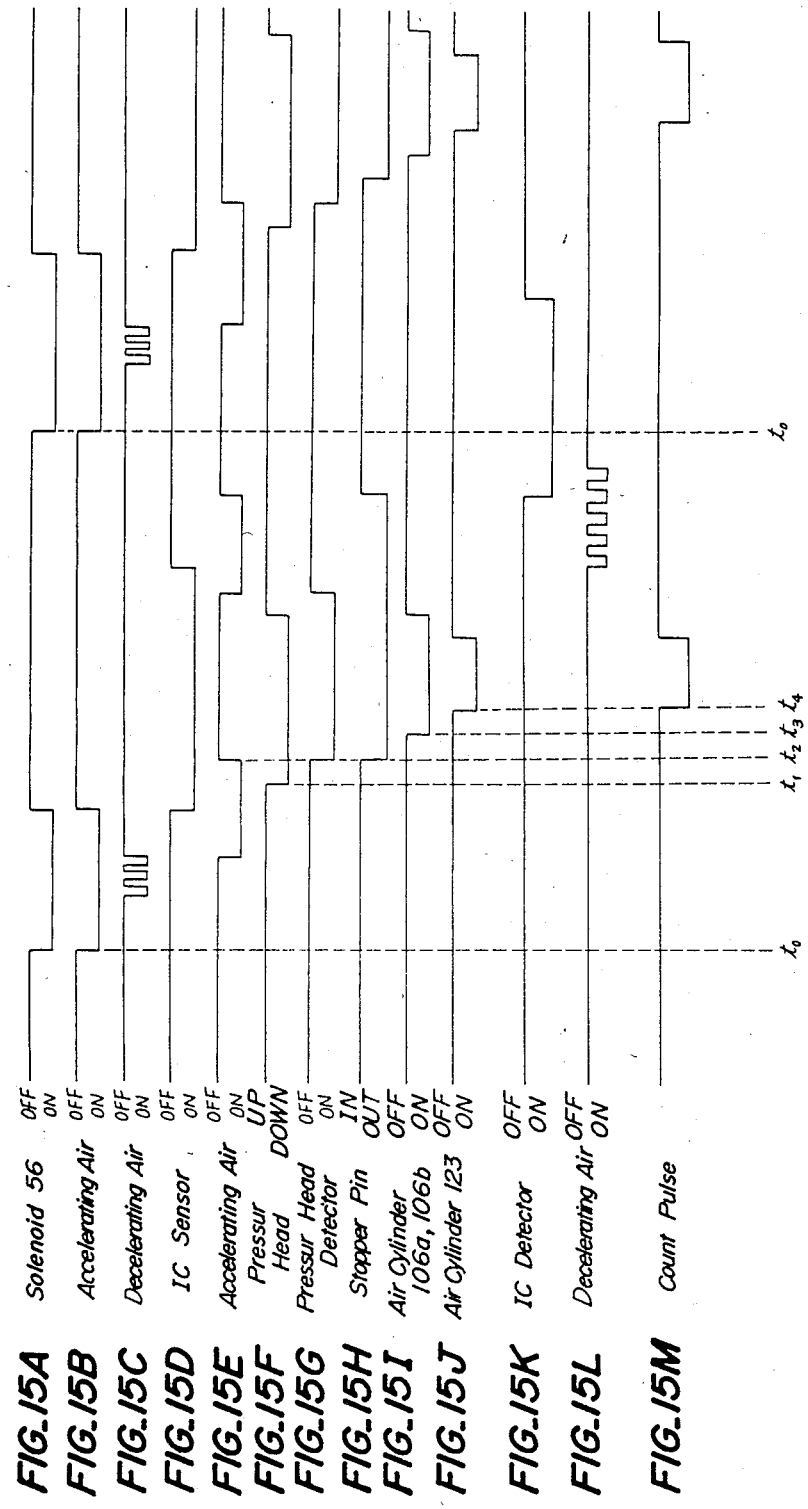

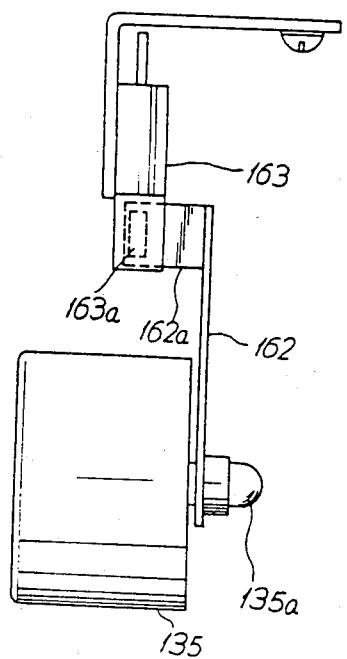
FIG_18C

FIG_20

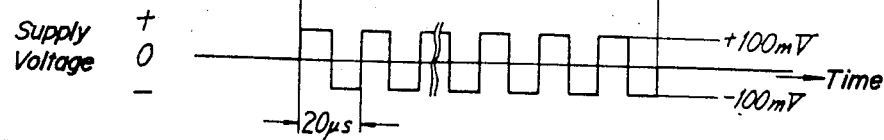
FIG_22A
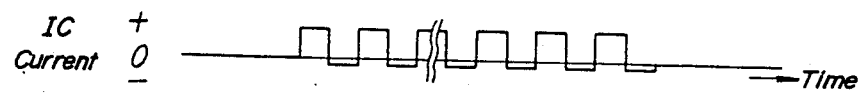
FIG_22B
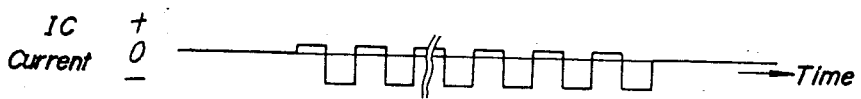
FIG_22C
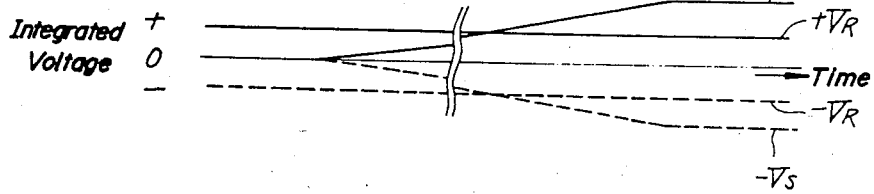
FIG_22D

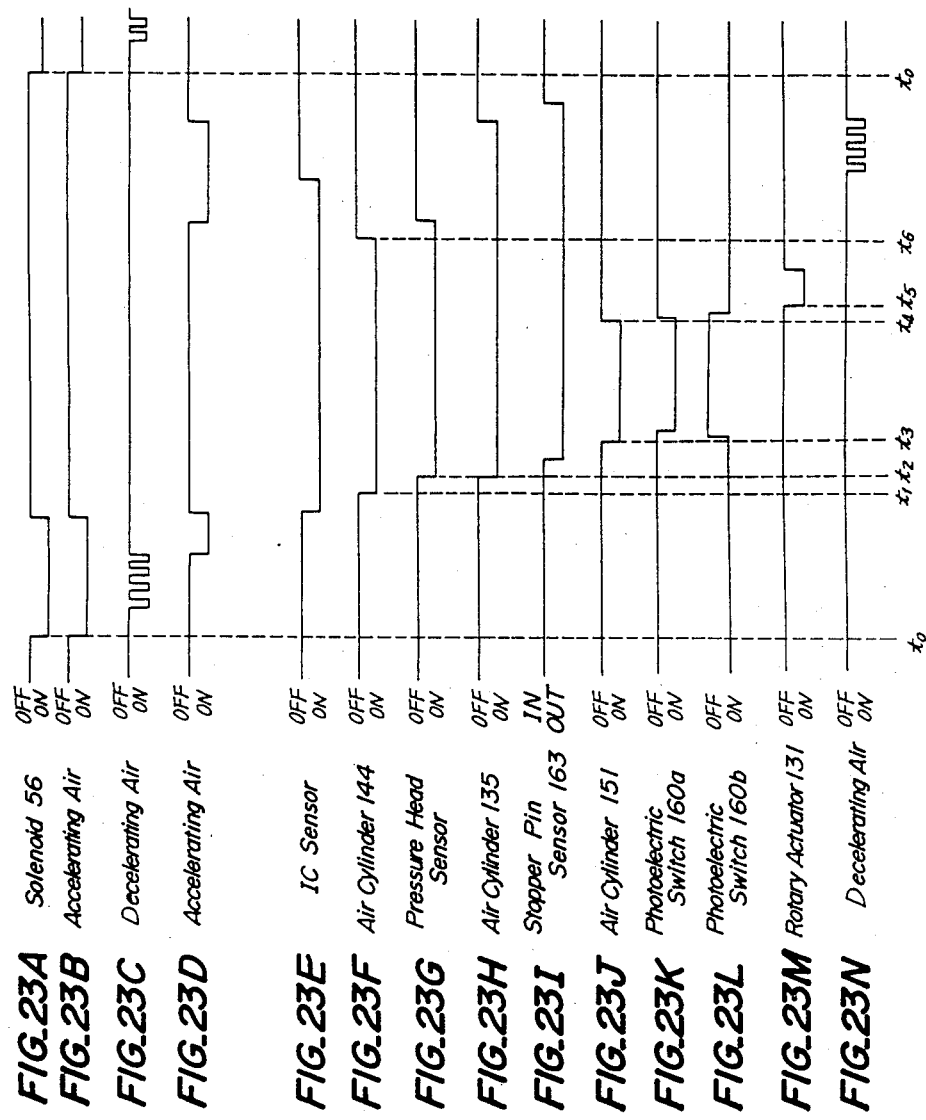

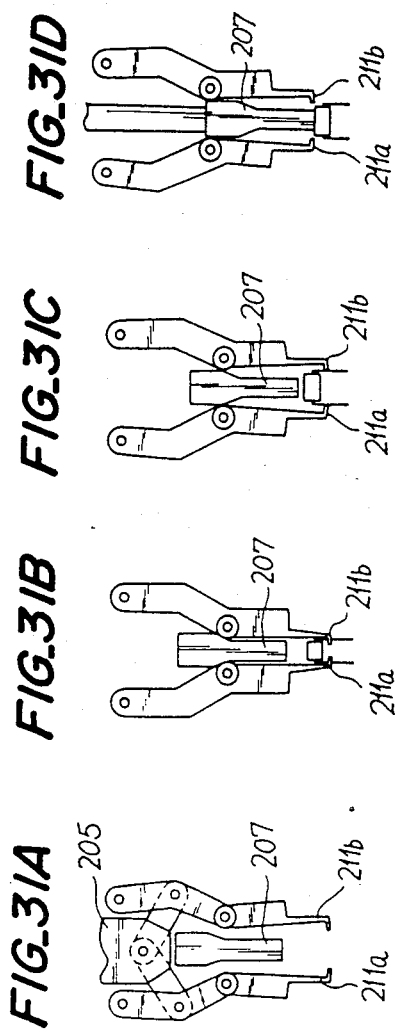

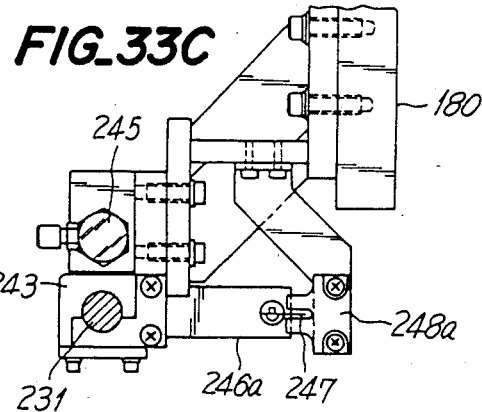
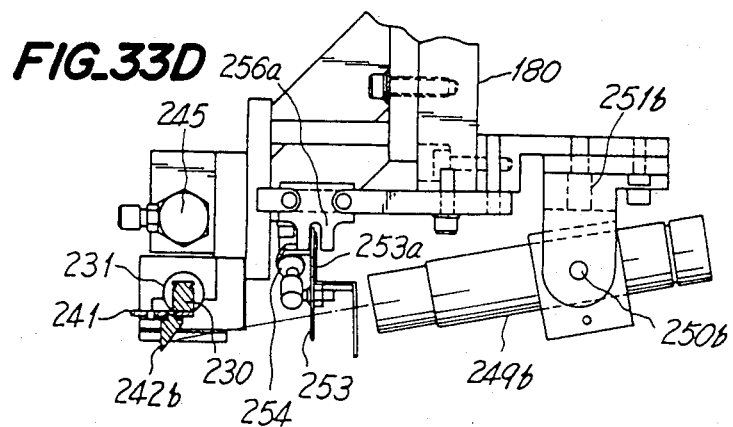
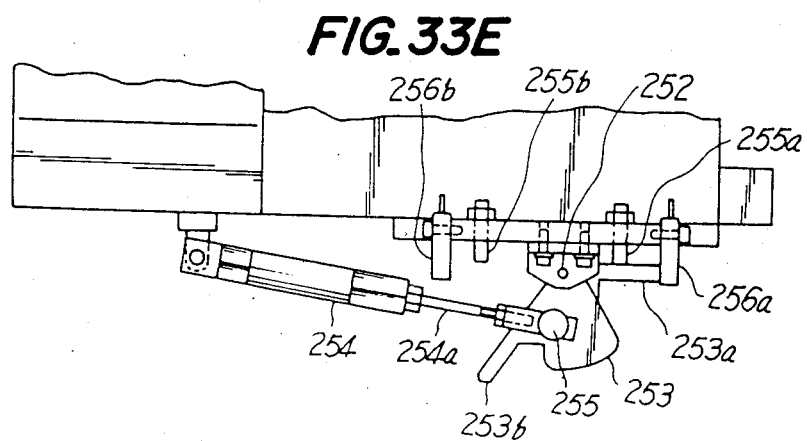

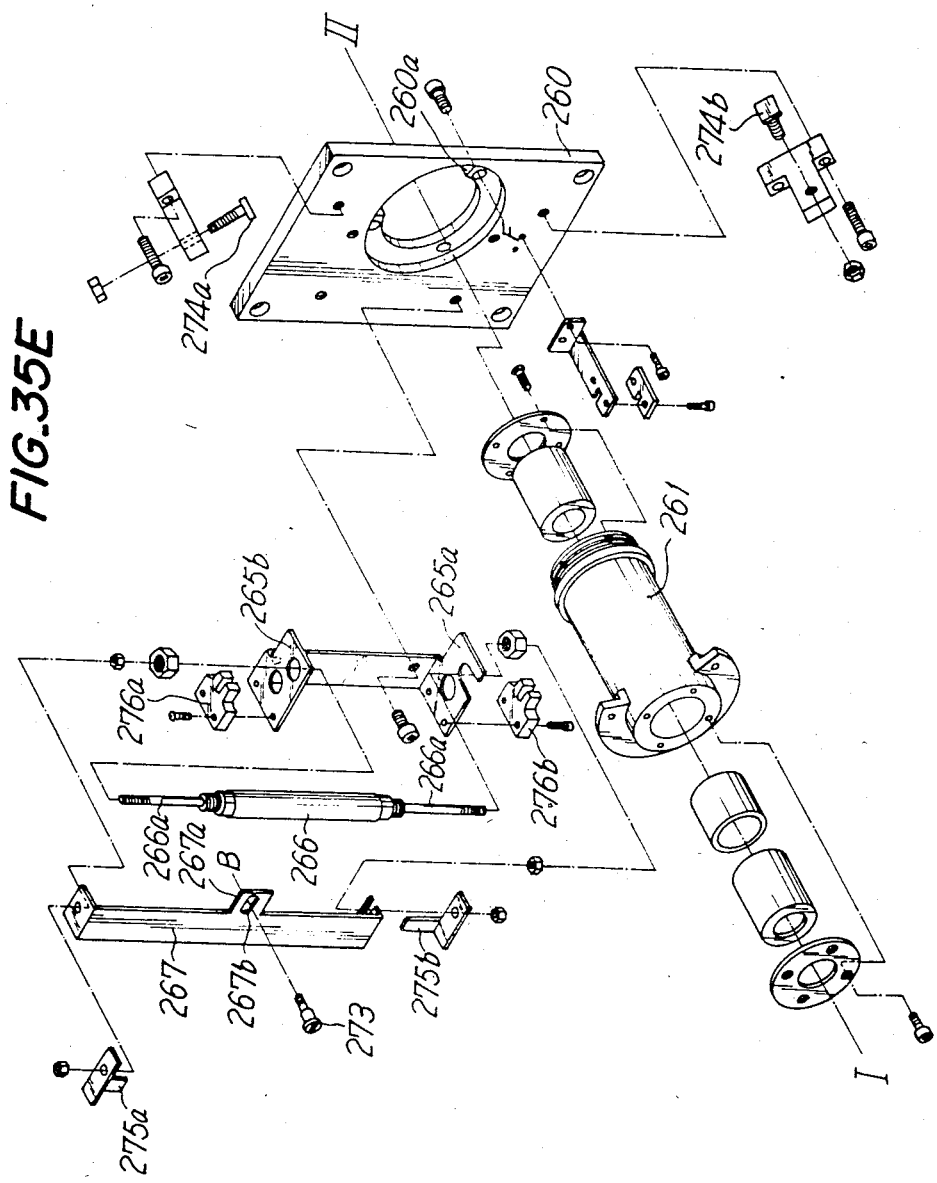

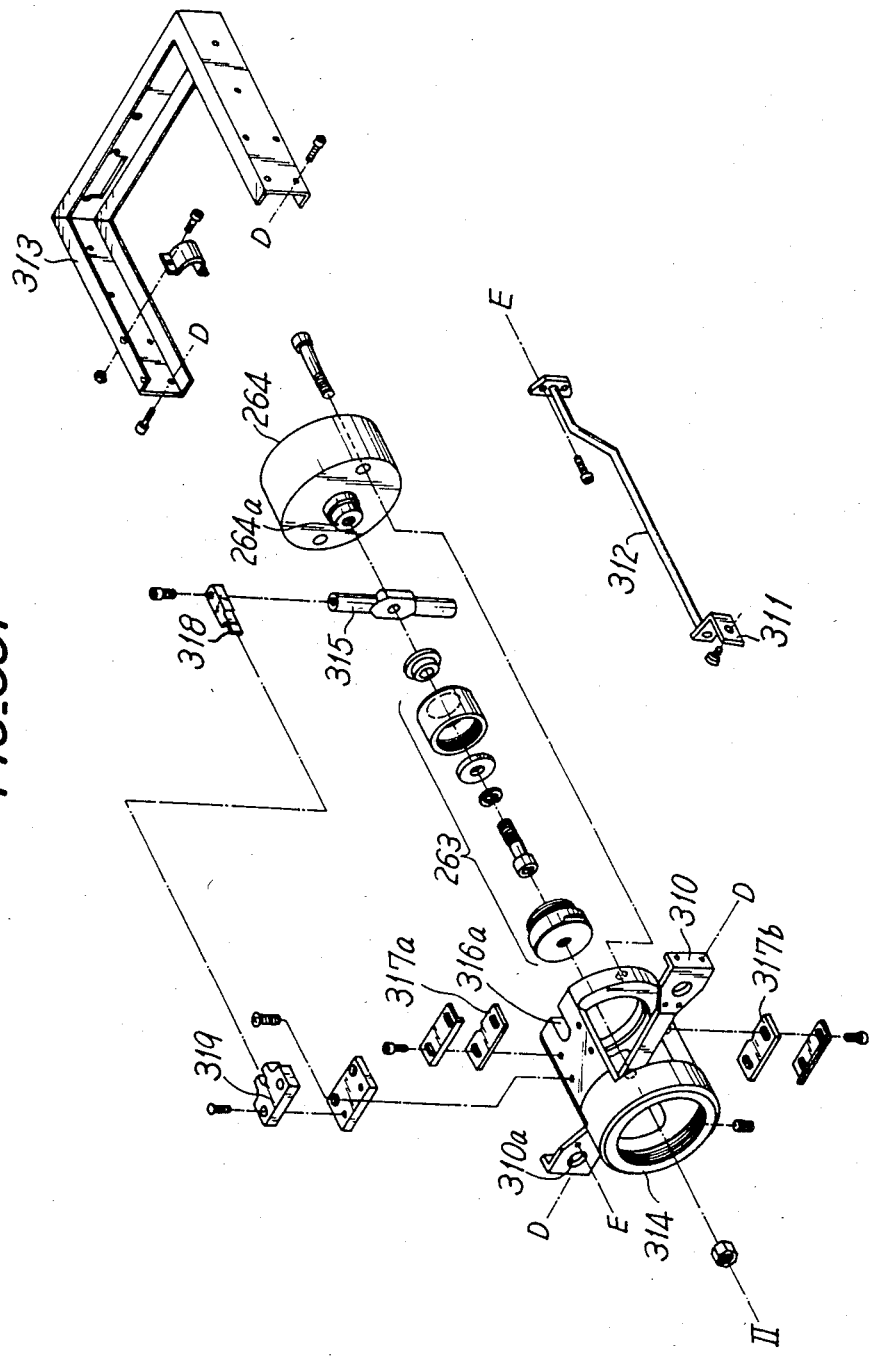

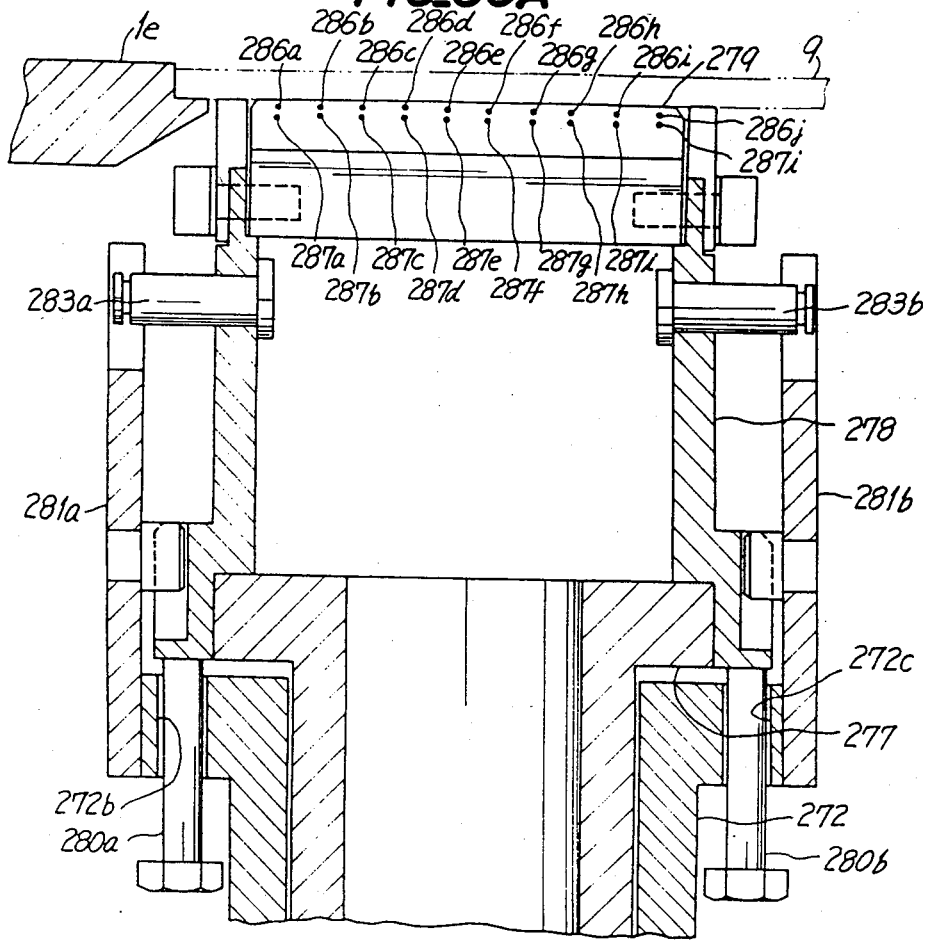
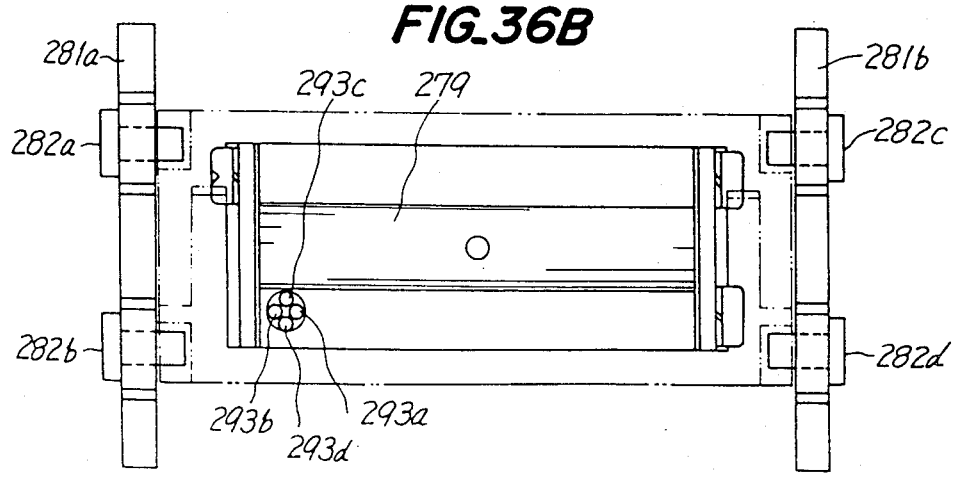

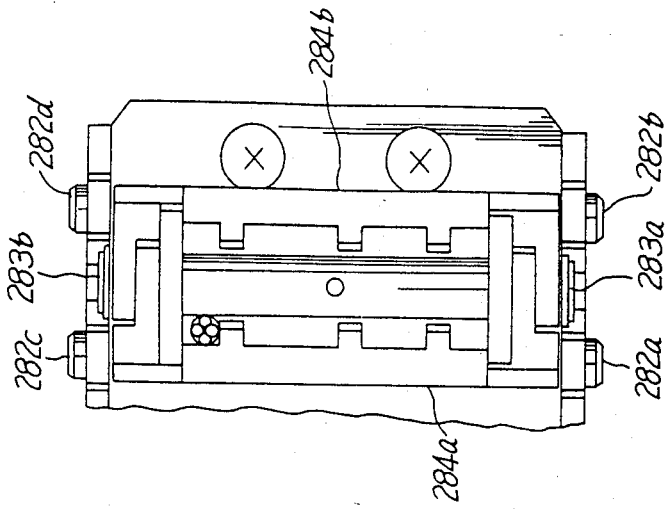
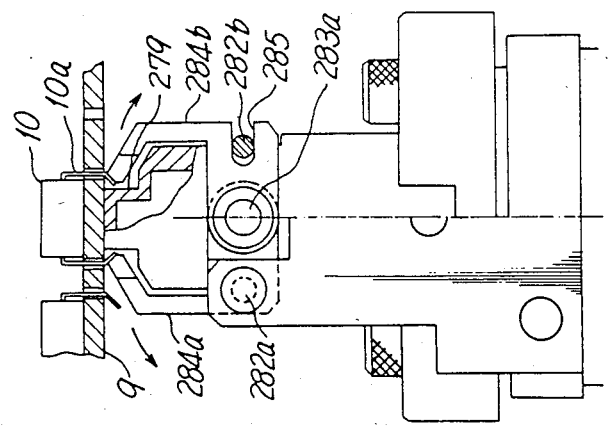

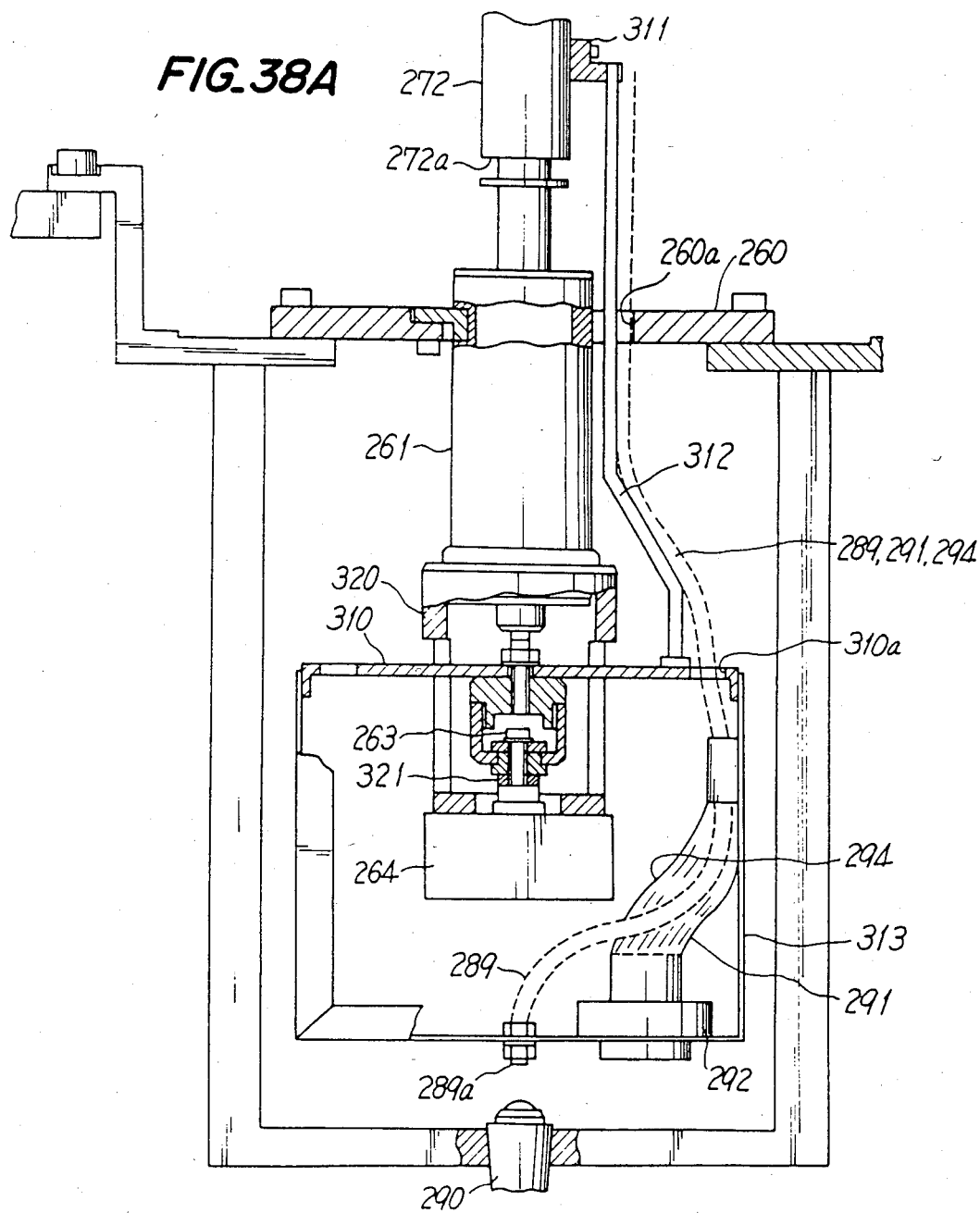

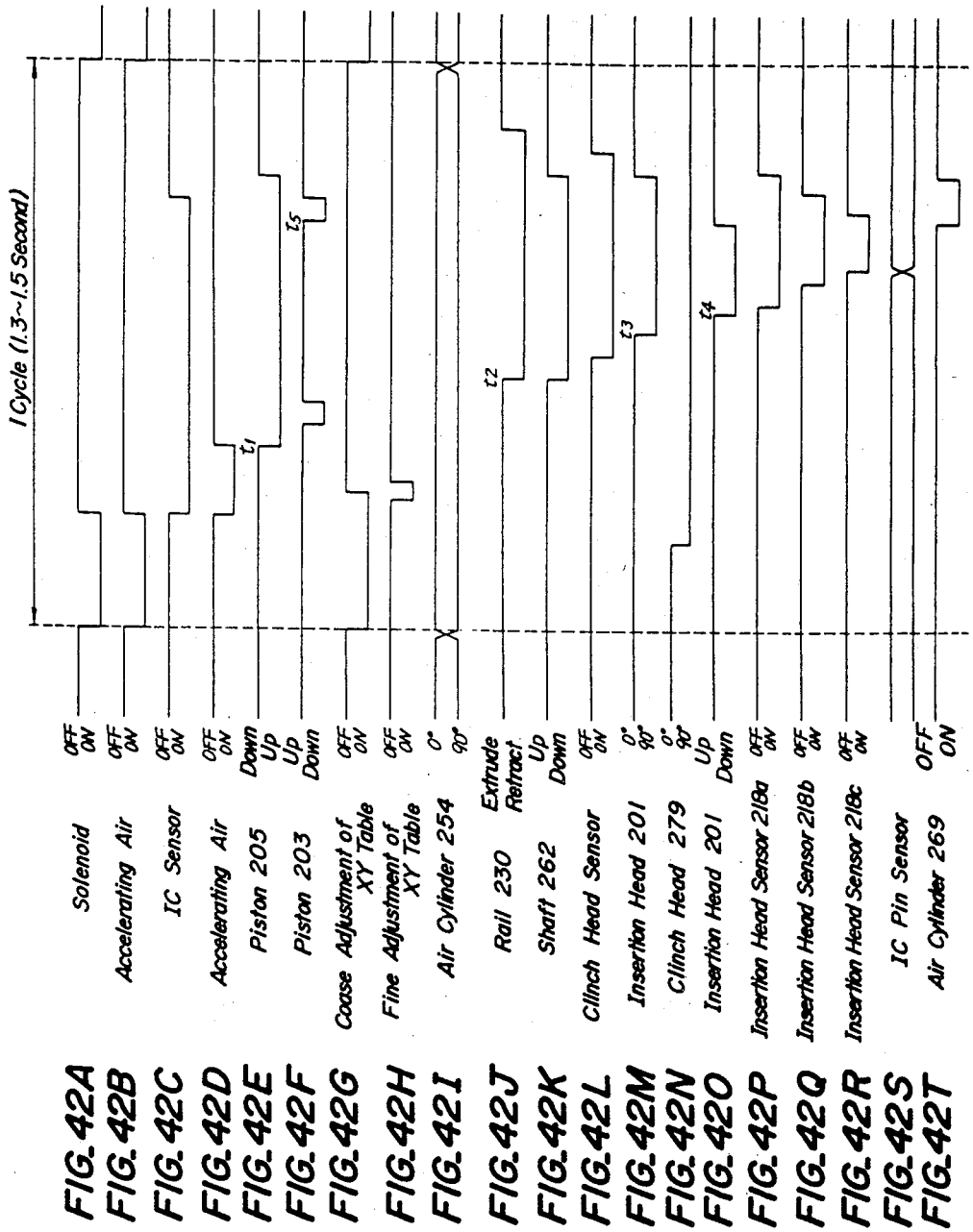

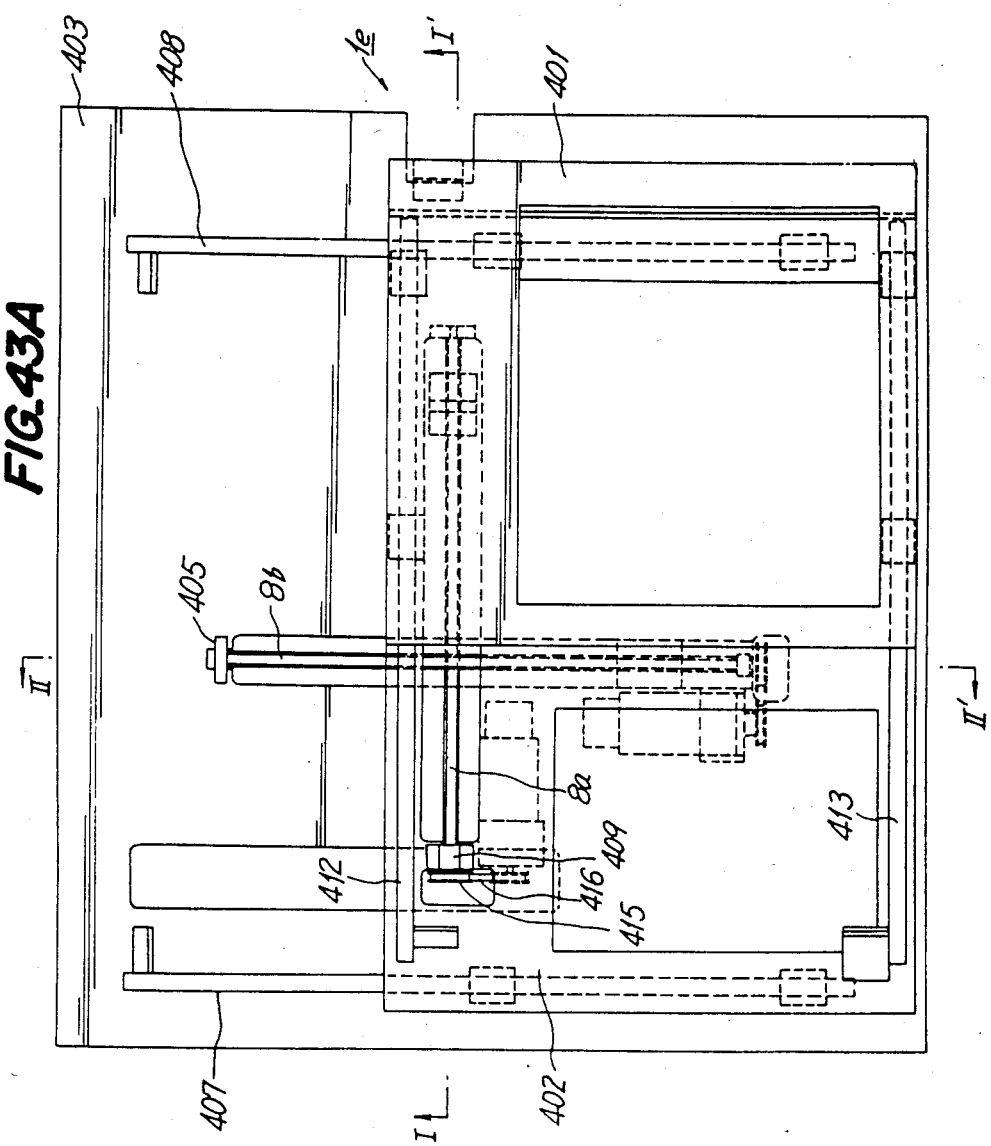

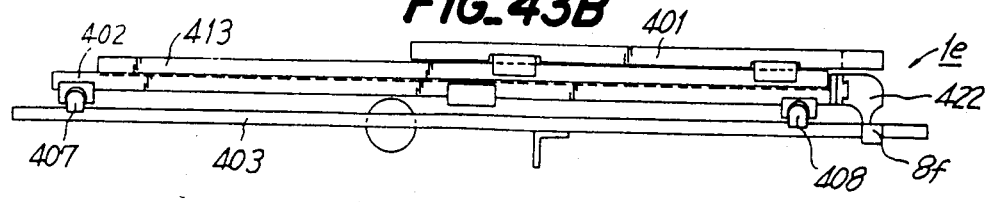
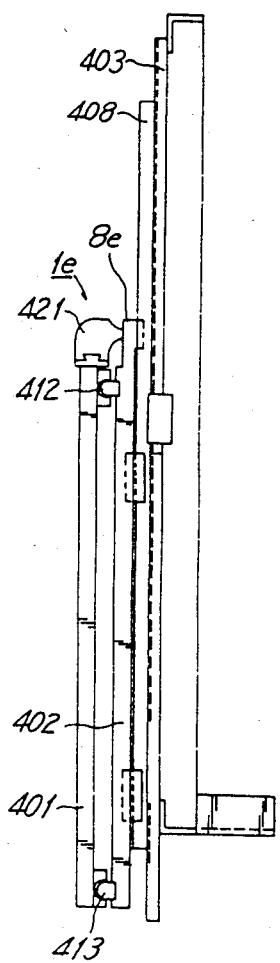

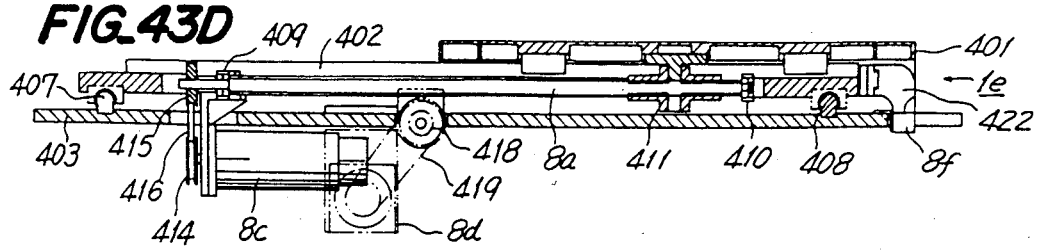
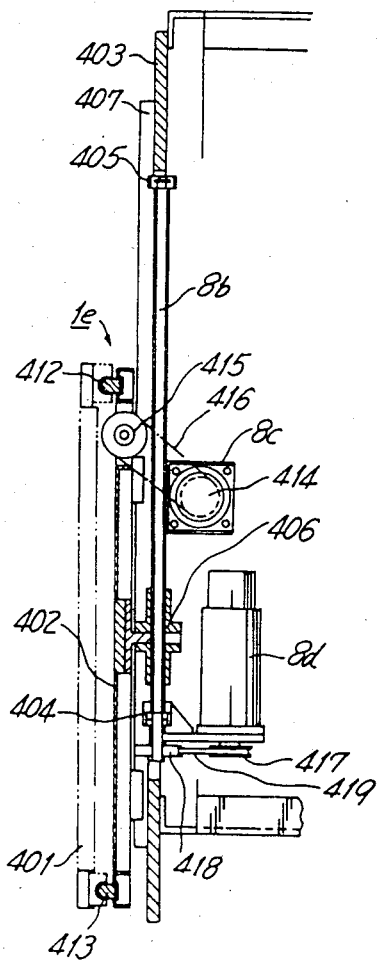

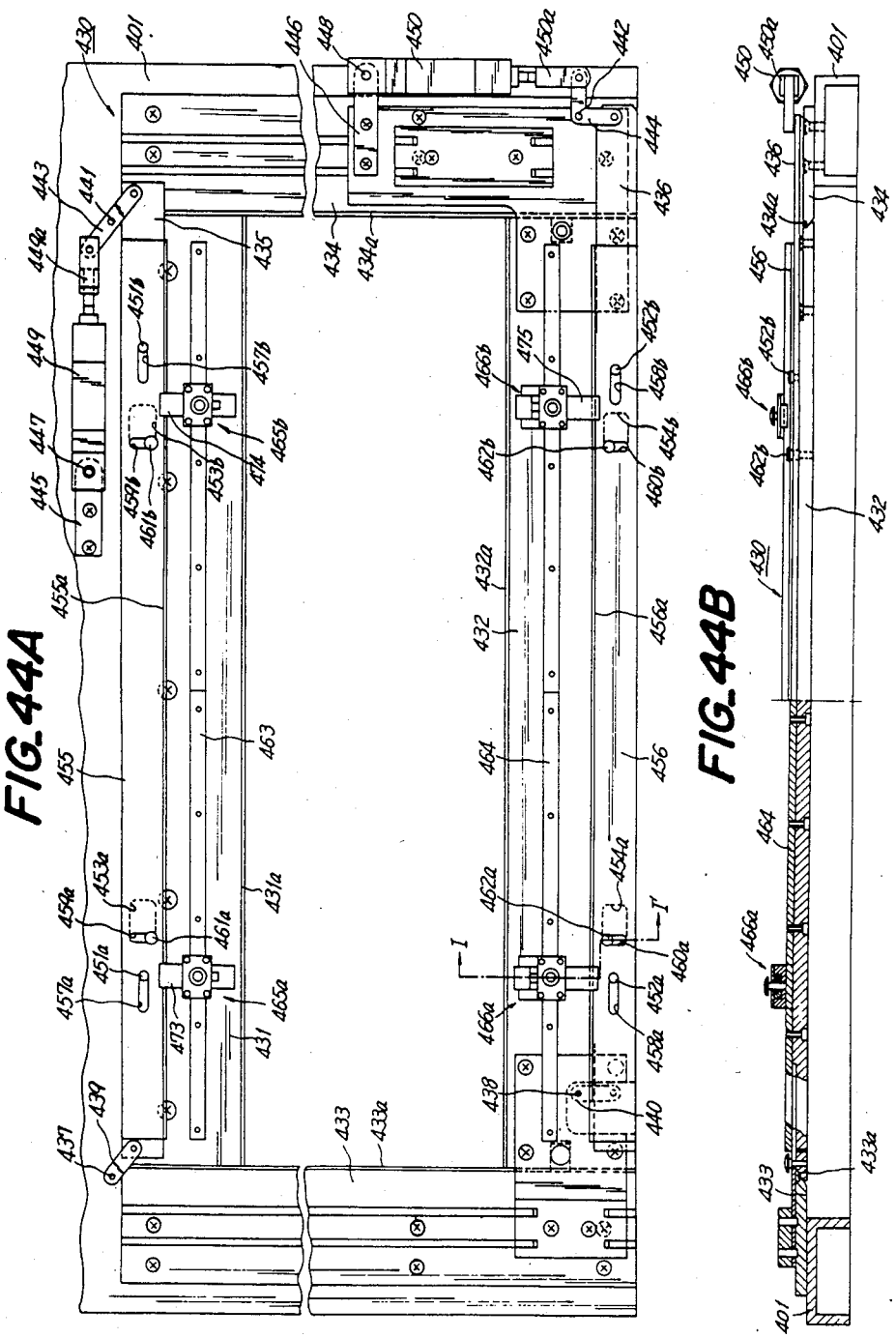

APPARATUS FOR AUTOMATICALLY INSERTING ELECTRONIC PARTS INTO PRINTED CIRCUIT BOARD

BACKGROUND OF THE INVENTION

This invention relates to an apparatus for automatically inserting semiconductor devices or electronic parts with pins such as integrated circuits, semiconductor elements, resistors, capacitors and the like into holes formed in a printed circuit borad at predetermined positions.

Various kinds of electronic circuit elements with pins such as semiconductor devices have hitherto been charged in a printed circuit board by hand, but manual operations for selecting predetermined electronic parts, correcting the shape and position of pins and inserting the pins into predetermined holes of the printed circuit board are very troublesome and the operation efficiency is very low. The number of assemblies made by a single worker per day is therefore limited to a smaller number and the considerably increasing demand cannot be supplied anymore. For the above reason, an apparatus for automatically inserting semiconductor devices or electronic parts with pins into the printed circuit board has been developed and put to practical use. For example, there has been developed an apparatus for automatically inserting ICs by setting particular addresses at IC charging positions on a printed circuit board with the use of a computer. In this known automatic IC insereter, data for controlling the operation of the apparatus must be provided by means of a tape from the outside and thus there are many disadvantages in that preparation work for forming a programme is complicated, a change of the programme is not easy and the inserter itself is very difficult to handle in practice. In addition, since the addresses at the IC inserting positions on the printed circuit board are fixed, insertion becomes impossible if the position of the board is shifted even slightly with respect to an inserting head. As a countermeasure therefor, two reference holes are bored in the printed circuit board and a pair of projections are provided on a table, and when the printed circuit board is set on the table correctly, the projections are inserted into the reference holes. Such a method takes additional time, and operations for forming the reference holes on the printed circuit board and troublesome detachment of the printed circuit board from the table are encountered. In this connection, it should be noted that in the known inserter, the insertion and detachment of the board with respect to the table are not automatically but manually operated by workers. It is further proposed to make the diameter of the IC pin inserting holes in the board larger than the width of the pins to some extent in order to absorb the positional error between the holes and the table, but if the inserting hole is made too large, the pins might not be soldered firmly and this results in unstable electrical connections. There is hence a limitation on the diameter of the holes.

The other prior automatic insertor employs a copying system in order to overcome the above disadvantages to some measure, so as to save time required for forming a programme and to deal with any change promptly and easily. But, in this known inserter, pins are not precisely corrected (or shaped), so that the rate of proper insertion is low, such as 90 to 95%, and inferior goods are frequently produced. Morever, the above disadvantage about positioning of the printed circuit board to the table is not solved yet. As to correction or shaping of an IC pin, when the pin is inserted into the hole of the printed circuit board, the pin is gripped, bent inward and inserted into the hole, and as a result, the pin cannot be inserted if the pin is originally bent too far inward or if it is bent in a lateral direction. In addition, the pin is cut only after insertion into the hole of the printed circuit board.

Further, in the above-described prior IC insertor, rail-like cassettes storing a number of ICs of the same kind in a row are arranged along an inclined guide in the perpendicular direction, but the number of ICs stored in one cassette is comparatively small, such as 24. It is often necessary to exchange an empty cassette with a new cassette filled with ICs, so that operation is burdensome. In order to remove such disadvantage, one might consider juxtaposing a pluarlity of cassettes filled with ICs of the same kind, but this would produce another disadvantage in that the whole apparatus would become large and difficult to operate. Such disadvantages become more prominent when the kind of ICs to be inserted into the printed circuit board is increased.

SUMMARY OF THE INVENTION

The present invention has for its object to provide a novel and useful apparatus for automatically inserting electronic parts with pins into holes formed in a printed circuit board, which apparatus can have a high correct insertion rate by correcting and cutting the pins prior to the insertion.

It is another object of the invention to provide an automatic inserting apparatus in which necessary data for effecting the automatic insertion can be simply and accurately stored during a copy mode.

It is another object of the invention to provide an automatic inserting apparatus which can effect automatic insertion at a high speed; nevertheless respective electronic parts can be retained at various treating portions for a relatively long time.

It is still another object of the invention to provide an automatic inserting apparatus in which a large number of cassettes containing electronic parts to be inserted can be set, and thus cassettes can be easily supplemented.

According to the invention, an apparatus for automatically inserting pins of electronic parts into holes formed in a printed circuit board at predetermined inserting positions comprises means comprising a table movable in mutually orthogonal X and Y directions, while the printed circuit board is mounted on the table;

means for holding a number of cassettes, each of which contains a plurality of electronic parts of the same kind;

means for discharging selectively electronic parts one by one from given cassettes onto an inlet of an electronic part feeding path;

means provided in the electronic part feeding path for correcting the shape and posture of the pins of electronic parts and for cutting the tips of the pins into V-shapes;

means provided at the outlet of the electronic part feeding path for gripping the pins of electronic part and inserting the pins into holes formed at a given inserting position in the printed circuit board mounted on the table; and means for controlling the above mentioned means in such a manner that during a copy mode, position data of the respective inserting positions on the printed circuit board and electronic part data representing the kinds of electronic parts to be inserted at respective inserting positions are stored in a memory, and during an insertion mode, the position data is successively read out of the memory to drive the table into such a position that the inserting position is aligned with an insertion axis of the inserting means and the electronic part data is read out of the memory to control the discharging means in such a manner that given electronic parts are successively discharged from given cassettes mounted on the cassette holding means.

BRIEF DESCRIPTION OF THE DRAWINGS

FIG. 2 is a schematic diagram outlining the construction of each portion shown in FIG. 1;

FIG. 3 is a perspective view, partly broken away, of an embodiment of an IC cassette according to the invention;

FIGS. 4A, 4B and 4C show an embodiment of a cassette charging and discharging portion;

FIGS. 5A, 5B and 5C show the state of IC pins;

FIGS. 6A to 6E show an embodiment of an inferior goods rejecting mechanism;

FIGS. 7A to 7D show an embodiment of a gate mechanism;

FIGS. 8A and 8B are a side view and a front view showing an external appearance of an IC pin correction and cut mechanism;

FIGS. 9A to 9E are exploded perspective views showing the construction of the mechanism shown in FIG. 8;

FIG. 10 is a front view of a mechanism for vertically movably supporting a movable rail portion;

FIG. 11 is a bottom view of FIG. 10;

FIG. 12 is a side view mainly showing a pressure head, a movable correction head and a movable blade;

FIG. 14 is a front view showing a part of FIG. 13;

FIGS. 15A to 15M are timing charts explaining the opration of the correction and cut mechanism;

FIGS. 18A to 18C are a front view, a plan view and a side view showing a stopper mechanism by enlarged scale;

FIGS. 22A to 22D are signal waveforms for explaining the action of the polarity measuring circuit;

FIGS. 23A to 23N are timing charts showing the action of the polarity detection and inversion mechanism;

FIGS. 31A to 31D are schematic diagrams for exlaining the action of the insertion head;

FIGS. 33A to 33E show the construction of a retract mechanism;

FIGS. 35A to 35F show the construction of a clinch mechanism;

FIGS. 36A to 36C show the construction of the clinch head portion;

FIGS. 37A and 37B show the construction of the clinch head portion;

FIGS. 38A and 38B show a manner of mounting an optical fiber bundle;

FIGS. 42A to 42T are timing charts for explaining the action of the insertion portion;

FIGS. 43A to 43E show the construction of an XY table;

FIGS. 44A to 44D show the construction of a clamp mechanism of a printed board;

DESCRIPTION OF THE PREFERRED EMBODIMENTS

Figure 1B:
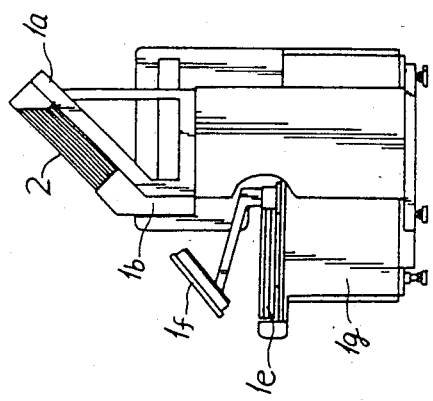
FIGS. 1A, 1B and 1C are a front view, a side view and a plan view showing the external appearance of an embodiment of the automatic insertor according to the invention.
Figure 1C:
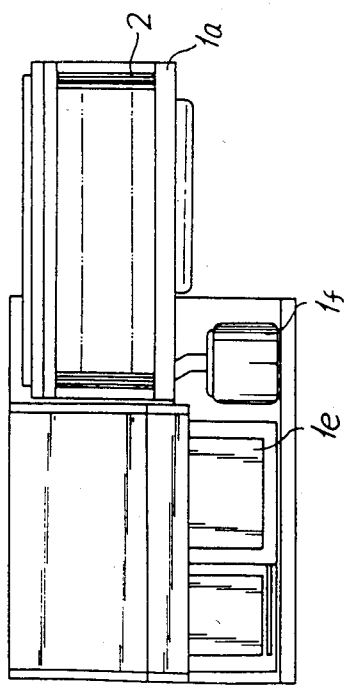
Figure 1A:
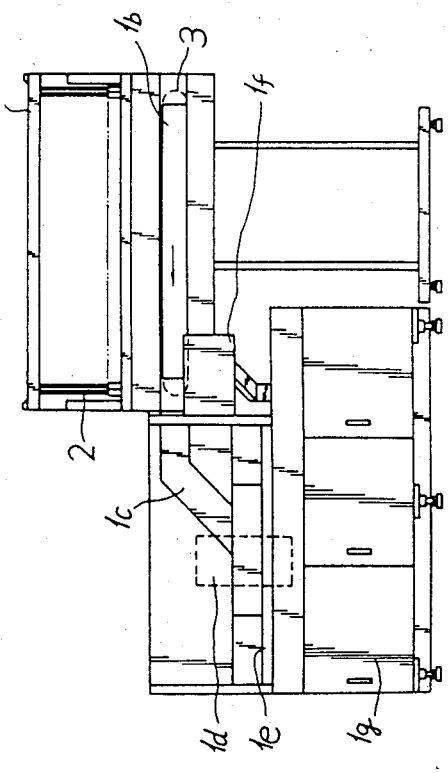

FIGS. 1A, 1B and 1C are external views showing one embodiment according to the present invention of an automatic insertion apparatus for inserting electronic elements with pins, particularly ICs, into a printed circuit board, FIG. 1A being a front view, FIG. 1B being a side view, and FIG. 1C being a plan view. A cassette filling portion 1a is bent forward, where 96 cassettes 2 are arranged in rows, and in each row ten cassettes are superimposed one upon the other as shown in the side view. As will be explained later on, the same kind of ICs are charged or contained in each cassette, and ten cassettes 2 filled with the same ICs are superimposed in the perpendicular direction and charged in a cassette holder. From the lowermost cassette, ICs are successively dropped to the front side by gravity. In addition, the empty cassette 2 is dropped downward from the cassette holder and accumulated in a cassette receiver. An IC selectively discharged from the cassette 2 drops onto an IC carrier portion 1b for moving the dropped ICs in the horizontal direction. The carrier portion 1b is provided with an endless belt 3 as shown by a dotted line in FIG. 1A, and the endless belt 3 is constantly rotated in the anti-clockwise direction during the operation of insertion. An IC dropped from the cassette filling portion 1a is sent to the left by the belt 3 in FIG. 1A and enters into a treating portion 1c. The treating portion 1c serves to reject inferior goods, to correct the position, shape or the like of IC pins, to cut the ends of the pins into V-shape, and to detect an inverse polarity and the like as explained later on. The thus treated IC is sent to an inserting portion 1d, where the IC pins are gripped by an inserting head, moved toward the printed circuit board and inserted into the holes of the prined circuit board. The printed circuit board is placed on an XY table 1e, clamped by a clamp means, which will be explained later on, and driven by an X motor and a Y motor. A moving amount in the X and Y directions is read by linear scales. Further, an operation console 1f is provided for controlling each kind of action such as copy control action or the like. The operation console 1f is rotatably supported by a perpendicular axis and can be set at an easily operable position. In addition, a disk portion 1g includes an electric power supply source, a control circuit, a driving circuit, an air pump and the like.

FIG. 2 is a schematic diagram showing the whole construction of the automatic insertion apparatus shown in FIG. 1. The cassette filling portion 1a is shown in detail by viewing one cassette filling mechanism from the side. Ten cassettes 2 are filled by superimposing above and below and ICs filled in the lowermost cassette are discharged onto the carrier belt 3 in succession. This IC discharge mechanism 4 will be explained later on in detail. The IC discharge mechanism 4 comprises a cassette discharge portion 4a, an IC discharge portion 4b and photoelectric detectors 4c and 4d shown by a mark X. The belt 3 of the IC carrier portion 1b is wound around rollers 5a and 5b, and the roller 5a is coupled to a motor 5c. The motor is always energized when the insertion apparatus is operable. The IC treating portion 1c includes a rail 6a inclined at an angle of about 45°, and along the rail are provided an inferior goods reject mechanism 6b, a pin correction mechanism 6c, a pin cut mechanism 6d, a polarity detection mechanism 6e, and an inversion mechanism 6f. In the middle of each treating mechanism are further provided gate mechanisms 6g-6i together with IC detectors 6j-6n. The gate mechanisms 6g-6i compensate for differences in treating time in each treating mechanism, increase the carrier speed in each treating mechanism and improve the treating speed.

In the inserting portion 1d are arranged a retract mechanism 7a, a vertical movement mechanism 7b for an insertion head for gripping ICs, a rotary mechanism 7c for rotating the insertion head around the inserting axis by 90°, a pair of light sources 7d for positioning an inserting hole, and a light path switching mechanism 7e for switching a light path of these light sources, these components being arranged above the printed circuit board. Below the printed circuit board are arranged a mechanism 7f for vertically moving a clinch stand, a mechanism 7g for rotating the clinch stand, a photoelectric detector mechanism 7h for detecting insertion of the IC pins into the printed circuit board and the like. The XY table 1e can be moved in the X and Y directions through ball screws 8a and 8b by an X axis motor 8c and a Y axis motor 8d, and in order to detect their moving amount, an X linear scale 8e and a Y linear scale 8f are provided. On the XY table 1e is provided a mechanism for detachably mounting a printed circuit board 9.

FIG. 3 is a perspective view showing the construction of the cassette 2 for receiving ICs. The whole cassette is formed by a plastic mold. A frusto-conical projection 2a is formed at the bottom portion, on which is placed IC 10, and then pins 10a of the IC 10 enter into grooves formed between the projection 2a and side walls. The upper portion is made narrow, a slit-like opening 2b is formed in the upper portion, and from the opening can be seen characters, symbols and the like described on the upper surface of the IC 10.

Cassette filling portion

Figure 4A:
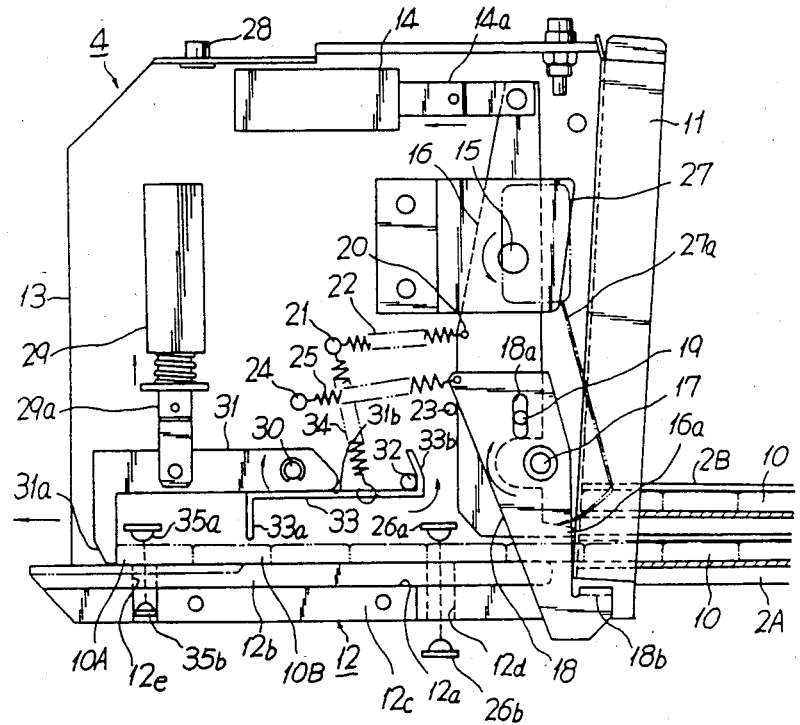

FIG. 4a is a plan view showing an embodiment of the IC discharge mechanism 4 of the cassette filling portion 1a, FIG. 4B is a side view thereof, and FIG. 4C is a perspective view of a rail portion. The IC discharge mechanism 4 in this embodiment is thin and flat as a whole so as not to increase the width when a number of mechanisms are aligned side by side. FIG. 4A also shows the cassette 2 containing the ICs 10. That is, one end of the cassette 2 is inserted into a cassette holding frame 11 having a U-shaped cross section, and the other end thereof is held by the similar holding frame shown in FIG. 1B. The upper end of the cassette holding frame 11 is widened outwardly for easily inserting the cassette. The lower end of the cassette holding frame 11 is formed with an opening 11a for sending the IC 10 inserted into the cassette 2 onto a rail 12 of the IC discharge mechanism 4 as shown in FIG. 4B. The rail 12 is provided with a projection 12b formed with a groove 12a in the longitudinal direction and a base portion 12c integral with the projection 12b as best shown in FIG. 4C. The rail 12 is fixed to a base plate 13 of the IC discharge mechanism 4 together with a print circuit (not shown) for controlling the mechanism 4 by means of screws.

First of all, a mechanism for discharging the IC cassettes 2 from the lowermost one in succession from the cassette holding frame 11 will be described. To the base plate 13 is fixed a first solenoid 14, and its plunger 14a is coupled with one end of a first lever 16 rotatably arranged around a shaft 15. At the lower portion of the first lever 16 is formed a projection 16a. To a shaft 17 provided in the base plate 13 is rotatably fixed a second lever 18, and a pin 19 provided on the first lever 16 is inserted into an elongated hole 18a formed in the second lever 18. At the lower end of the second lever 18 is provided an engaging piece 18b bent in the perpendicular direction with respect to the plane of FIG. 4, and the lower surface of the cassette 2 is engaged by this engaging piece. Between a pin 20 fixed to the first lever 16 and a pin 21 fixed to the base plate 13 is mounted a coiled spring 22, and the lever 16 is biased to rotate in the direction opposite to the direction of an arrow shown around the shaft 15. This rotation is limited by a stopper pin 23 fixed to the base plate 13. Between the second lever 18 and a pin 24 secured to the base plate 13 extends a pulling coiled spring 25, and the second lever 18 is biased to rotate in the direction opposite to the direction of the arrow around the shaft 17. This rotation is also limited by the stopper pin 23.

FIG. 4A shows the condition in which the lowermost cassette 2A is held by the engaging piece 18b of the lever 18, and the IC 10 is set in the cassette shown by cross section. After all ICs in the cassette 2A are discharged, the cassette 2A is dropped from the cassette holding frame 11. To this end, adjacent the rail 12 are arranged a light source 26a and a light receiver 26b constituting a first IC detector. When there is no IC at the position of the detector, light emitted from the light source 26a is directly received by the light receiver through a hold 12d so as to detect the absence of an IC. The solenoid 14 is then energized by this detecting output, and its plunger 14a is moved in the direction of an arrow. Then the lever 16 is rotated around the shaft 15 in the direction of the arrow, the projection 16a of the lever 16 is projected into an inner cavity of the projection 2a of the second cassette 2B from the bottom, so as to hold the cassette 2B. At the same time, the lever 18 is rotated around the shaft 17 in the direction of the arrow by cooperating with the elongated hole 18a and the pin 19, and the engaging piece 18b escapes from the cassette holding frame 11. The lowermost cassette 2A is therefore dropped by gravity. After a predetermined time, when the solenoid 14 is deenergized, the levers 16 and 18 are returned into the initial condition shown in FIG. 4 by the action of the springs 22 and 25. In this case, the cassette 2B is released from the projection 16a, and the cassette 2B is dropped, but the engaging piece 18b of the lever 18 again enters into the cassette holding frame 11, thereby engaging the cassette 2B with the projection 16a. In this manner, the cassettes 2 are dropped from the cassette holding frame 11 successively. At the lower portion of the cassette filling portion 1a is a receiving stand for receiving the dropping cassette.

The groove 11b is formed in the cassette holding frame 11 as clearly shown in FIG. 4B, so as to detect the cassette 2 by projecting the end of an actuator 27a of a microswitch 27 through the groove as shown by a chain line in FIG. 4A. When the last cassette remains in the cassette holding frame 11, the actuator 27a is driven, a detection signal is transmitted from the microswitch 27, and a lamp 28 is lighted. Therefore, an operator can supply new cassettes by inspecting the lamp 28.

The mechanism for discharging the ICs 10 one by one will be explained hereinafter. The second solenoid 29 is fixed to the base plate 13 and coupled with a lever 31 arranged to rotate a plunger 29a around a shaft 30. The lever 31 is formed with an engaging piece 31a extended perpendicularly downward. Under the condition of FIG. 4A, the end of the engaging piece 31a projects into the groove 12a of the rail 12 so as to stop the movement of the IC array. Between the lower surface of the lever 31 and a shaft 32 secured to the base plate 13 extends a lever 33, the left end of the lever 33 being bent perpendicularly downward to form an engaging piece 33a, and the right end thereof being formed into an arc to be rotated around the shaft 32. Between the lever 33 and the pin 21 extends a pulling coiled spring 34 to bias the lever 33 to be pushed toward the lever 31 and the shaft 32.

Under the condition shown in FIG. 4A, the top IC 10A is engaged with the engaging piece 31a of the lever 31. When the solenoid 29 is energized, the lever 31 is rotated around the shaft 30 in the direction of an arrow, the engaging piece 31a of the lever 31 retreats to the upper portion of the rail 12, and the top IC 10A is discharged in the direction of an arrow due to gravity. At the same time, the left portion of lever 33 is pushed by the right end 31b of the lever 31 and is rotated around the shaft 32 in the direction of an arrow shown around the shaft 32 and therefore, the tip of engaging piece 33a contacts the surface of the next IC 10B and holds it. In this case, in order to avoid some rotation of the lever 32 after the tip of engaging piece 33a is brought into contact with IC 10B, the lever 33 is separated from the shaft 32. After the discharge of the top IC 10A has been detected by a detector comprising a light receiver 35b arranged in a cavity 12e bored in the rail 12 and a light source 35a, when the solenoid 29 is deenergized after the elapse of a predetermined time, the levers 31 and 33 are returned to the condition shown in FIG. 4A by the action of the spring 34, and the IC row is moved to the left by one IC. In practice, the rail 12 is inclined at an angle of about 45° with respect to the horizontal level.

As described above, when the solenoid 14 is selectively energized, the cassettes 2 set in the cassette holding frame 11 are successively discharged from the lower portion. Each of the cassette holding frames 11 in this embodiment can hold ten cassettes 2 filled with the same kind of ICs 10, so that it is not necessary to frequently supply new cassettes filled with ICs, and working efficiency is improved by a large margin. In addition, the cassette holding frames 11 are aligned in a row in the horizontal direction, and the cassettes 2 are superimposed one upon the other in each holding frame in the perpendicular direction, so that the whole cassette filling portion 1a does not become large, and maneuverability becomes very fine. Further, ICs 10 can selectively be discharged one by one by selectively energizing the solenoid 29. The IC 10 discharged from the cassette 2 is sent to the carrier portion 1b, placed on the belt 3 and delivered to the treating portion 1c.

A rate of percentage of proper insertion in case of assembling electronic parts such as ICs, semiconductor elements, resistors, capacitors and the like in a printed circuit board depends mainly on the quality of the position and shape of the pins of the parts. Therefore, in order to improve the proper insertion rate, it is preferable to correct or shape the pins before insertion, and in order to attain a proper insertion percentage of more than 99%, such as in the invention, correction of the pins before insertion is inevitable. Pins may be poorly shaped in several ways; the pins 10a may be bent in the longitudinal direction and in the widthwise direction as shown in FIGS. 5A and 5B, and such bends may occur simultaneously. These bends must be corrected before insertion. Further, the tips of the pins must be cut into V-shaped configurations as shown in FIG. 5C in order to maximize the allowable error between the position of the pin and the position of the hole.

In the present embodiment, if the pin is bent more than the standard value before such correction and cut is carried out, the inferior goods reject mechanism 6b is provided for excluding ICs having such inferior pins from the treating portion 1c. Thus, by previously removing the inferior ICs, the succeeding treatment can positively be carried out and thus, the treating mechanism can be comparatively simple.

Figure 6C:
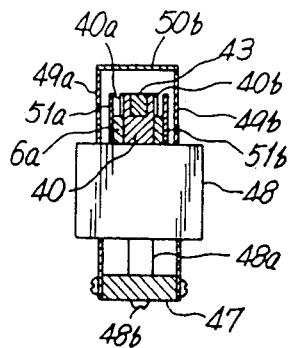
Figure 6D:
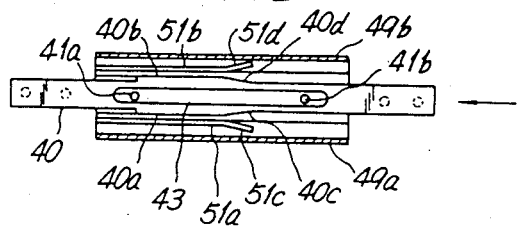
Figure 6E:
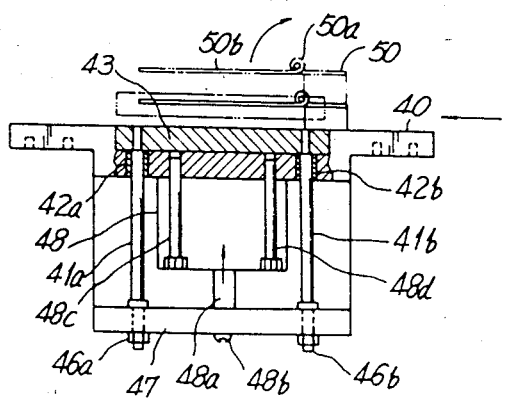

FIGS. 6A and 6B are a plan view and a side view showing one embodiment of the inferior goods reject mechanism, and FIGS. 6C, 6D and 6E are cross-sectional views showing the construction of the essential part thereof. the essential part of the reject mechanism is assembled in the rail 6a of the treating portion 1c. the essential part comprises a fixed rail portion 40 fixed in the hole bored in the rail 6a to form the same plane with the rail 6a, a movable rail portion 43 engaged with the elongated hole formed in the fixed rail portion and movably fixed to the fixed rail portion 40 by a pair of shafts 41a, 41b and bearings 42a, 42b, and a casing 45 for receiving inferior ICs excluded outside the rail by arranging a baffle plate 44 inclined at an angle of about 45° as shown in FIG. 6A with respect to the IC traveling direction shown by an arrow at the upper portion of the rail 6a. A block 47 is fixed to the lower end of the shafts 41a and 41b screwed into the movable rail portion 43 by means of nuts 46a and 46b, and to the block is secured a plunger 48a of an air cylinder 48 by means of a screw 48b. The air cylinder 48 is secured to the lower surface of the fixed railed portion 40 by means of screws 48c and 48d. The plunger 48a of the air cylinder 48 moves upward as shown by an arrow, thereby moving the movable rail portion 43 upward as shown by a chain line in FIG. 6E. On both side surfaces of the block 47 are fixed U-shaped side plates 49a and 49b which extend above the upper portion of the rail. To the upper ends of these side plates 49a, 49b is secured a fixed plate 50, and to the fixed plate is rotatably secured a lid 50b by means of a hinge 50a. When the lid 50b is rotated in the direction shown by an arrow in FIGS. 6B and 6E, it is possible to access the movable rail portion 43 by hand, and ICs which might be stacked in the inferior goods reject portion can be removed easily. The movable rail portion 43 and the lid 50b are coupled with each other through the side plates 49a, 49b, the block 47 and the shafts 41a, 41b, so that when the movable rail portion moves upward, the lid 50b also moves upward as shown by a chain line in FIG. 6E.

The distance between two rows of holes formed in the IC printed circuit board 9 at respective IC inserting positions is about 7.62 mm (0.3 inch), corresponding to the distance between the two pin rows of an IC. In the inferior goods reject mechanism of this embodiment, an IC with pins 10a closer than a minimum pin row distance $W_{min}$ of 7.24 mm or further than a maximum pin row distance $W_{max}$ of 10.80 mm, shown in FIG. 5B, is judged to be inferior and is discharged outside the rail. In order to define the maximum pin row distance, control plates 51a and 51b are fixed to the side surface of the rail 6a, and the distance between the inner surfaces of the mutually opposing control plates is defined as the maximum pin row distance of 10.80 mm as described above. Side surfaces of the fixed rail portion 40 opposed to the control plates 51a and 51b are formed as control surfaces 40a and 40b, and the distance between these control surfaces are made equal to the minimum pin row distance of 7.24 mm. IC introducing side end portions 51c and 51d of the control plates 51a and 51b are bent outward and IC introducing side end portions 40c and 40b of the control surfaces 40a and 40b are tapered inward, so that IC pin introducing openings are dilated.

When a good IC 10, whose maximum pin row distance $W_{max}$ and the minimum pin row distance $W_{min}$ are within the above range of limit values (10.80 mm and 7.24 mm), is conveyed into the inferior goods reject mechanism from the right to the left as shown by an arrow, these pins 10a can pass through the predetermined gaps defined by the control plates 51a, 51b and the control surfaces 40a, 40b, so that the good IC is passed through the reject mechanism and is sent to the next gate portion 6g (FIG. 2). On the other hand, if an inferior IC 10, whose maximum or minimum pin row distance is outside the above limit values, is introduced, one or more pins 10a is brought into contact with at least one of the end portions 51c, 51d or the control plates 51a, 51b or the end portions 40c, 40d of the control surfaces 40a, 40b, so that the IC remains in the reject mechanism. The IC thus retained is detected by three photoelectric detectors aligned along the IC traveling direction, and if the IC is left in the reject mechanism for more than a predetermined time, a discharge signal is generated and the air cylinder 48 is driven. Whereby, the movable rail portion 43 is raised and the inferior IC 10 placed thereon is also raised. When the tips of pins 10a of this IC are separated from the control plates 51a, 51b or the control surfaces 40a, 40b, the IC slides on the movable rail 43 by gravity (the rail is inclined), strikes against the baffle plate 44 and enters a cage 45 arranged beside the rail. In such a manner, the inferior IC can be effectively removed from the rail. After that, when the air cylinder 48 is restored, the movable rail portion 43 is returned to the initial position on the fixed rail portion 40, and preparation for the next coming IC is made.

The inferior IC moved upward together with the movable rail portion 43 drops by gravity and enters the cage 45, but in order to quicken the dropping speed and to make the drop positive, an air flow is projected upon the IC in the direction of discharge. Further, in order to prevent the IC from popping upward above the movable rail portion 43, when the movable rail portion is moved upward, the lid 50b is provided, and the lid 50b is freely opened or closed so that the IC stacked in the reject mechanism can easily be taken out by hand. In addition, it is possible to re-use the rejected IC by correcting the lead wires 10a and re-inserting the IC into the cassette 2.

Gate Mechanism

Figure 7C:
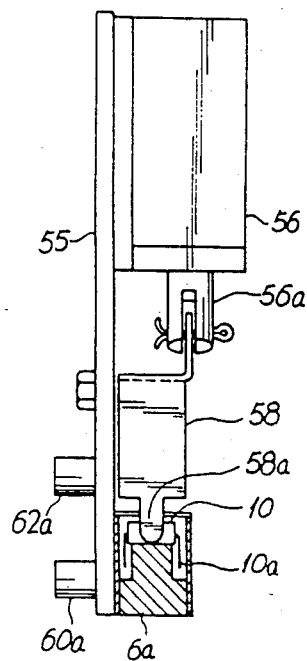
Figure 7D:
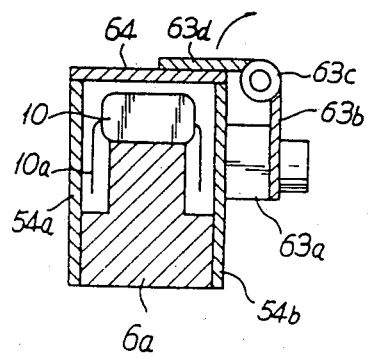
Figure 9A:
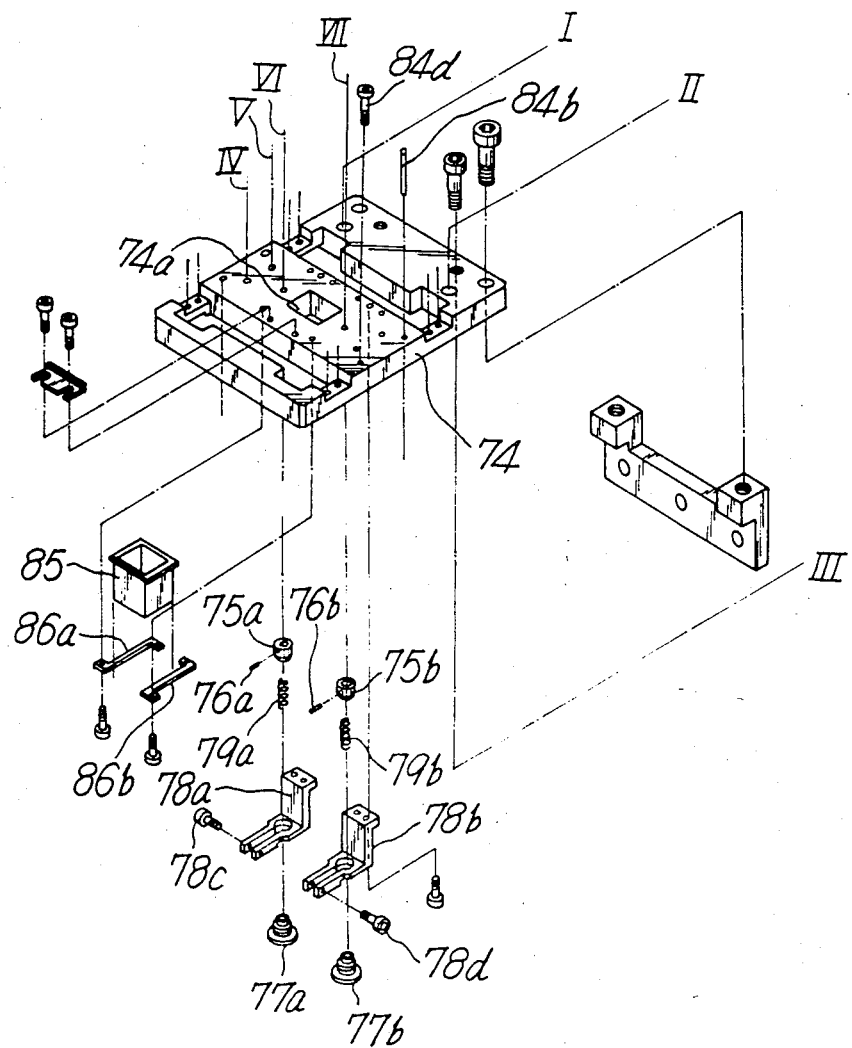
Figure 9B:
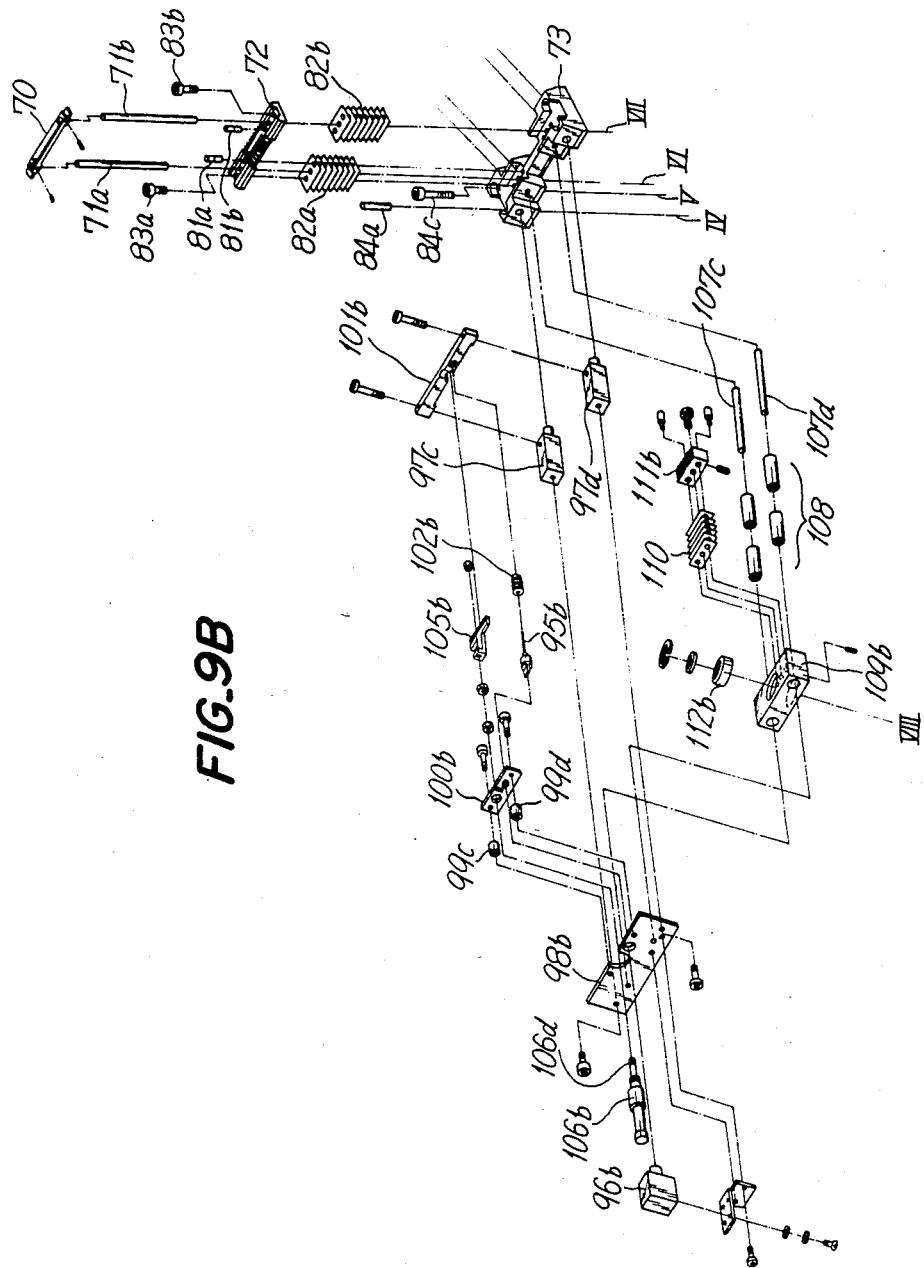
Figure 9C:
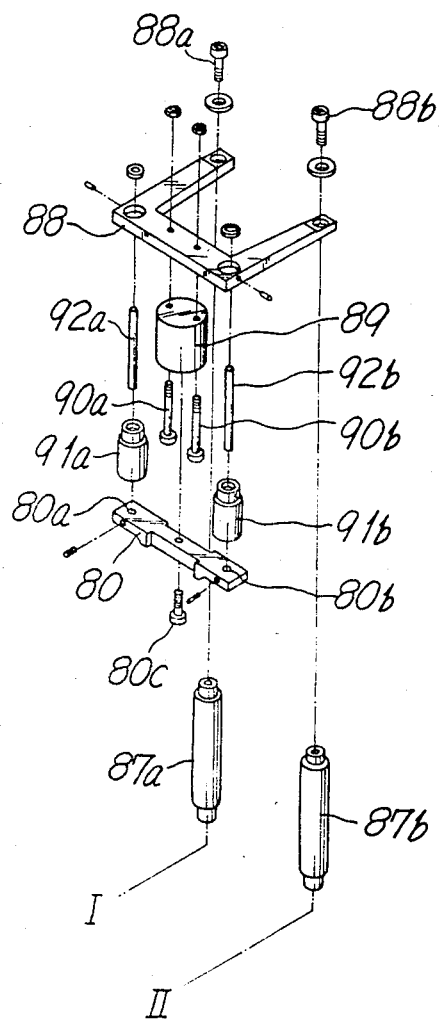

FIG. 7 shows an embodiment of the gate mechanism arranged between each operation mechanism of the treating portion 1c, in which FIG. 7A is a front view, FIGS. 7B and 7C are side views, and FIG. 7D is an enlarged cross-sectional view. A base plate 55 is secured to the rail 6a and a solenoid 56 is fixed to the base plate, a plunger 56a of the solenoid being journaled to a substantially L-shaped stopper lever 58. The stopper lever 58 is rotatably arranged around a shaft 57 and is rotated as shown by a chain line in FIG. 7A. To the stopper lever 58 is secured a pulling coiled spring 59 to bias the lever to rotate in the direction opposite to the direction of an arrow shown around the shaft 57. This rotation is limited by a stopper pin 59a. At the free end of the stopper lever 58 is provided an engaging piece 58a having a narrow width as clearly shown in FIGS. 7B and 7C and positioned at the portion above the rail 6a. In the rail 6a is formed an air suction port 60 which communicates with a vacuum source (not shown) through a pipe 60a so as to intermittently suck the air as described hereinafter. In FIG. 7A, the IC 10, sent from the right, is decelerated by the intermittent air suction when passing through the air suction port 60 and thereafter impinges against the engaging piece 58a of the stopper lever 58 and stops. There is provided a photoelectric detector comprising a light source 61a and a light receiver 61b for detecting whether an IC 10 is present in the gate mechanism or not. When the solenoid 56 is energized at a predetermined timing, the stopper lever 58 is rotated against a force of the spring 59, and the engaging piece 58a is released from the IC 10. As the rail 6a is arranged slantwise, the IC 10 slides down on the rail by the action of gravity, but in order to accelerate the speed of the IC movement, an air injection port 62 is provided at the portion above the IC and connected to an air pressure source through a duct 62a formed in a block provided above the rail 6a. As shown in an enlarged view of FIG. 7D, in order not to release the IC from the rail 6a when the IC 10 strikes against the engaging piece 58a of the stopper lever 58, side plates 54a, 54b are secured on both sides of the rail 6a, a fixed plate 63b is secured to the side plate 54b through a block 63a, a movable plate 63d is connected through a hinge 63c to the upper periphery of the plate 63b, and a lid 64 is fixed to the movable plate. It is thus possible to prevent the IC 10 from slipping off from the rail 6a and to easily take out the stacked IC by rotating and opening the lid 64 if the IC 10 is stuck in the gate mechanism by any cause.

According to the gate mechanism described above, the IC can be conveyed to the next stage at a high speed at any desired timing, while the IC can be decelerated immediately before striking against the engaging piece 58a of the stopper lever, so that even if the traveling speed is made high as described above, the shock caused when the IC strikes against the engaging piece 58a is small, and as a result, there is no possibility of the IC slipping from the rail or of breaking the IC.

Correction and Cut Mechanism

The superior IC passed through the above-described inferior goods reject mechanism is sent to the correction and cut mechanisms 6c, 6d to correct the position and posture of pins and to cut the tips of pins into V-shape. Hitherto, the bending of pins and the cutting into V-shape have been carried out by separate devices, but in the present embodiment, correction and cut or correction only can selectively be carried out by a single device. therefore, the whole device can be minimized, both the correction and cut and the correction can be carried out according to the demand of a user, and expensive cutter blades can be prevented from unnecessary abrasion. It is impossible to cut without correction. This is due to the fact that undesired stress might be applied to an IC at the roots of the pins, if the lead wires are cut without correction.

FIGS. 8A and 8B show the whole construction of an embodiment of the correction and cut mechanism viewed from the IC traveling direction and the direction perpendicular thereto, respectively, and FIGS. 9A to 9E are perspective views showing the same in an exploded manner. In addition, details of each portion are shown in FIGS. 10 to 15.

In the first place, the construction for movably supporting a movable rail 70 in the vertical direction will be explained with reference to FIG. 10. To the lower end of the movable rail portion are fixed long rods 71a, 71b extending vertically, and these rods are passed through holes bored in a fixed blade 72, a stand 73 for securing a fixed blade and a base plate 74. To the portions of the rods 71a, 71b projecting from the base plate 74 are fixed collars 75a, 75b by means of screws 76a, 76b, while the lower ends of the rods are passed through adjusting screws 77a, 77b for adjusting the vertical stroke of the movable rail 70. These adjusting screws are threaded into bifurcated brackets 78a, 78b, respectively, and fixed by means of lock screws 78c, 78d. Between the collars 75a, 75b and the adjusting screws 77a, 77b are provided compressing coiled springs 79a, 79b, respectively, so as to bias the rods 71a, 71b and thus the movable rail portin 70 to move upward. The upward movement (maximum 6 mm) is limited by the fact that the movable rail 70 is brought into contact with the fixed rails arranged on both sides of the movable rail. In FIG. 10, when a pressure head 80 shown at the upper portion of the movable rail portion 70 is driven downward by a mechanism to be described later on, the movable rail portion 70 is displaced downward together with the IC placed thereon. The stroke of the downward displacement is controlled by the distance between the lower surfaces 75c, 75d of the collars 75a, 75b and the upper surfaces 77c, 77d of the adjusting screws 77a, 77b. Therefore, after the lock screws 78c, 78d have been loosened and the brackets 78a, 78b have been widened, the adjusting screws 77a, 77b are adjusted to adjust height of the upper surfaces 77c, 77d, thereby adjusting the vertical stroke of the movable rail portion 70.

As shown in FIG. 10, pins 81a, 81b provided in the stand 73 are passed through holes bored in the fixed blade 72 so as to position the fixed blade 72 in a horizontal plane, gap adjusting spacers 82a, 82b are further inserted between the fixed blade 72 and the stand 73 as shown in FIG. 9, and then the stand 73 is fixed by means of clamp screws 83a, 83b. After pins 84a, 84b provided in the base plate 74 have been inserted into the holes formed in the stand 73, the stand is fixed to the base plate by means of screws 84c, 84d.

FIG. 11 is a bottom view clearly showing the construction of the above-described stroke adjusting mechanism. As further shown at the center of FIG. 11, a rectangular opening 74a is formed in the base plate 74, and at the lower portion of the hole is detachably provided a box-like case 85 for receiving chips produced when cutting the pins. The case 85 is detachably secured to the base plate 74 by inserting flanges 85a, 85b into spaces between frames 86a and 86b and the lower surface of the base plate 74.

A mechanism for driving the pressure head 80 arranged at the portion above the movable rail portion 70 will be explained with reference to FIGS. 9 and 12 in principle. A pair of posts 87a, 87b are vertically secured to the base plate 74, to the upper ends of these posts is fixed a U-shaped frame plate 88, and to the frame plate is secured an air cylinder 89 by means of screws 90a, 90b. To the frame plate 88 are further fixed shafts 92a, 92b through a pair of bearings 91a, 91b, these bearings are passed through holes 80a, 80b bored in the pressure head 80, and the pressure head 80 is vertically movably guided. The pressure head 80 is further fixed to a plunger of the air cylinder 89 by means of a screw 80c. Therefore, the pressure head 80 can be moved vertically along the shafts 92a, 92b by driving the air cylinder 89. According to the above construction, even if the IC is stacked between the movable rail portion 70 and the pressure head 80 by any chance, if the screws 88a, 88b for fixing the frame plate 88 to the posts 87a, 87b are removed, the frame plate 88, the air cylinder 89 secured thereto and the pressure head 80 can be removed as an assembly, thereby opening the upper portion so that the stacked IC can easily be taken out and carrying out a maintenance inspection is extremely simple.

Figure 13:
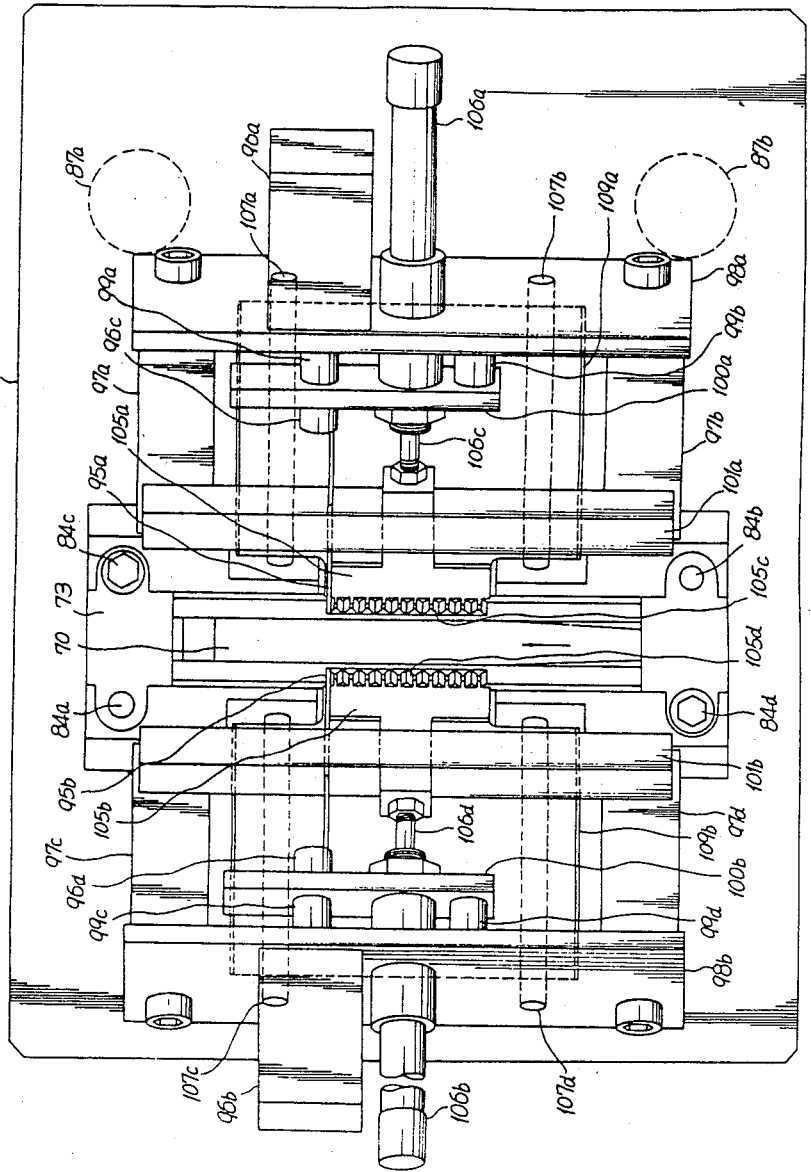
FIG. 13 is a plan view showing the movable correction head and the movable blade mechanism.

A stopper mechanism for stopping the IC from sliding down onto the rail 6a at the movable rail portion 70 will next be explained. FIG. 13 is a plan view in which the pressure head 80 and driving mechanism corresponding thereto are omitted. As shown by an arrow on the movable rail portion 70, the right and left top pins of an IC carried from the lower portion in FIG. 13 come into contact with needle-like stopper pins 95a and 95b, respectively, to make the stop. In order to protrude or extract these stopper pins into or out of the traveling path of the IC pins, one end of each stopper pin is connected to a plunger 96c, 96d of solenoids 96a, 96b, respectively. As shown in FIG. 13 the stopper pins 95a, 95b are eccentric with respect to the plungers 96c, 96d, but this is a matter of arrangement with no particular meaning.

As most clearly shown in FIG. 13, to each side of the stand 73 for holding the fixed blade 72 are secured arms 97a, 97b and 97c, 97d, to these arms are fixed plates 98a, 98b, and to these plates are secured solenoids 96a, 96b. Further, to these plates 98a and 98b are further secured second plates 100a, 100b through spacers 99a, 99b and 99c, 99d. Plungers of the solenoids 96a, 96b project through holes bored in the spacers 99a, 99b and holes bored in the plates 100a, 100b, and to the ends thereof are eccentrically secured stopper pins 95a, 95b. Further, between the ends of the plungers 96c, 96d and plates 101a, 101b are provided pulling coiled springs 102a, 102b to bias the stopper pins to move toward the IC traveling path. Therefore, FIGS. 12 and 13 show the condition of projecting the stopper pins 95a, 95b into the IC path due to the force of springs 102a, 102b by deenergizing the solenoids 96a, 96b. When the stopper pins 95a, 95b are thus projected into the IC path, the pins of an IC slid onto the rail come into contact with the stopper pins, and the IC stops on the movable rail portion 70. In case of this stopping, in order to prevent the IC from bouncing, there is provided a deceleration device by air suction similar to that provided in the gate mechanism, but it is not shown in the drawings.

A mechanism for correcting IC pin posture and shape will be explained next. As described with reference to FIG. 5, an IC pin may be bent in the lengthwise direction with respect to the direction that the pins are arranged as shown in FIG. 5A and in the widthwise direction perpendicular thereto as shown in FIG. 5B. As shown in FIG. 10, a number of V-shaped grooves 72a are formed in the fixed blade 72, and the bending of pins in the lengthwise direction is mainly corrected by inserting the IC pins along these grooves. In order to press the IC pins against the fixed blade, correction heads 105a, 105b are movably provided. That is, to the plates 100a, 100b are secured air cylinders 106a, 106b, and plungers 106c, 106d are connected to the correction heads 105a, 105b. The correction heads slidably extend through holes bored in the plates 101a, 101b, and the ends 105c, 105d of these correction heads cooperate with the V-shaped groove 72a of the fixed blade 72 as shown in FIG. 13.

A mechanism for cutting the tips of IC pins into V-shape will be explained next. Between each side surface of the stand 73 and the plates 98a, 98b, are provided shafts 107a, 107b and 107c, 107d, and to these shafts are slidably provided blocks 109a, 109b via bearings 108. To these blocks are fixed movable blades 111a, 111b by means of gap adjusting spacers 110. Therefore, the movable blades 111a, 111b are slidably secured onto the shafts 107a to 107d together with the blocks 109a, 109b.

In order to slide the blocks 109a, 109b, the blocks 109a, 109b are connected to arms 113a, 113b through rotatable and slidable bearings 112a, 112b, and the arms are fixed to U-shaped links 114a, 114b. These links are rotatably supported by arms 115a, 115b and 115c, 115d secured to the base plate 74 by means of pins 116a, 116b and 116c, 116d. The lower ends of the links 114a, 114b are pivoted on one end of arms 117a, 117b and 117c, 117d by shafts 118a, 118b and 118c, 118d, while the other end of these arms is pivoted on holes bored in projections 119a, 119b integrally formed with a block 119 by shafts 120a, 120b. The projections 119a, 119b of the block 119 are slidably guided by U-shaped frames 121a, 121b fixed to the base plate 74. Further, a bracket 122 is fixed to the base plate 74, and to the bracket is fixed an air cylinder 123. A vertically moving plunger 123a of the air cylinder 123 is fixed to the block 119 by means of a screw 124. Therefore, when the air cylinder 123 is driven and the plunger 123a is displaced downward, the block 119 connected thereto is also displaced downward. As a result, the shafts 120a, 120b are also lowered to the position shown by $P_1$ in FIG. 12, and the bearings 113a, 113b are also displaced to the position shown by points $P_2$ through the links 117a-117d, 115a-115d. Whereby, the blocks 109a, 109b and integrally movable blades 111a, 111b are slid along the shafts 107a-107d, and the movable blades 111a, 111b are moved away from the fixed blade 72. As will be explained later on, this condition is a stand-by position in actual operation. After the IC is moved downward together with the movable rail portion 70, the air cylinder 123 is driven to displace the movable blades 111a, 111b into the fixed blade 72 and the tips of pins are cut into V-shape. Therefore, V-shaped grooves are formed in the upper surfaces of the movable blades 111a, 111b.

The action of the above correction and cut mechanism will now be explained with reference to FIG. 15 showing timing charts of various portions. Several detectors are provided for confirming the action at each portion and initiating the next action, but these detectors are now shown. As shown in FIGS. 15A and 15B, at a predetermined timing $t_0$ denoted by the central control unit, the solenoid 56 (FIG. 7) of the gate mechanism 6g (FIG. 2) provided at the preceding stage of the correction and cut mechanism is turned ON, the engaging piece 58a of the stopper lever is retreated from the rail 6a, accelerating air is injected from the nozzle 62, and the IC held in the gate mechanism is sent to the correction and cut mechanism at high speed. The rail 6a immediately before the movable rail portion 70 of the correction and cut mechanism is provided with a suction port for decelerating the IC, from which the air is intermittently sucked as shown in FIG. 15C, and the IC is decelerated. As shown in FIG. 15H, the solenoids 96a, 96b of the stopper pins 95a, 95b are deenergized, and the stopper pins are extended in the IC path. The pins of the IC fed from the preceding gate impinge upon the stopper pins 95a, 95b, and the IC stops on the movable rail portion 70. When the above air suction for deceleration is completed, the air is injected as indicated in FIG. 15E from the nozzle 80d provided in the pressure head 80 as shown in FIG. 10, so as to press the IC to the stopper pins 95a, 95b. At a time $t_1$ after detection of the IC by the IC detection sensor under the above condition as shown in FIG. 15D, the pressure head 80 is lowered by driving the air cylinder 89 for the pressure head as shown in FIG. 15F. When the pressure head 80 is lowered, it first makes contact with the IC so as to further lower the IC together with the movable rail portion 70. The detection sensor of the pressure head 80 generates an output at a time $t_2$ when the pressure head comes into contact with the IC as shown in FIG. 15G, and the stopper pin solenoids 96a, 96b are energized by this output, and the stopper pins 95a, 95b are removed from the IC path against the force of the springs 102a, 102b as illustrated in FIG. 15H. It is possible to correct the bending of the IC pins in the lengthwise direction by thrusting the IC pins into the V-shaped grooves 72a of the fixed blade 72 with the aid of the pressure head 80. At a time $t_3$ then, as shown in FIG. 15I, the air cylinders 106a, 106b for the correction head are driven and the correction heads 105a, 105b are pushed toward the fixed blade 72, thereby correcting the bending of the IC pins in the widthwise direction. At a time $t_4$, the air cylinder 123 for the movable blade is driven and the movable blades 111a, 111b are moved toward the fixed blade 72, thereby cutting the tips of the pins into V-shape. At this time $t_4$, as shown in FIG. 15M, a count pulse is generated and a number of actions is counted.

After carrying out the correction and cutting as described above, the air cylinder 123 for the movable blade is driven at first for withdrawing the movable blades 111a, 111b, the air cylinders 106a, 106b for the correction head are then driven for withdrawing the correction heads 105a, 105b, and the air cylinder 89 for the pressure head is then driven for raising the pressure head 80. On the way of this ascent, the pressure head detection sensor detects the pressure head 80 separating from the IC. Upon receipt of the detection signal, air is injected from the nozzle 80d to accelerate the IC. When the IC detection sensor detects the IC escaping from the movable rail portion 70, the air suction for deceleration at the next gate mechanism is started as shown in FIG. 15L. On the way, the next gate mechanism detects the arrival of the IC as shown in FIG. 15K. Such action is repeated to carry out the correction and cutting of pins of successive ICs.

In the correction and cut mechanism in the present embodiment, the correction is carried out by moving the correction head by means of the air cylinders 106a, 106b and the cut is carried out by the movable blade by means of the air cylinder 123, so that it is possible to independently effect the correction and the cut. As a result, it is possible to carry out the correction only, the correction and cut, and no correction nor cut. Thus, several kinds of treatments can be employed at will according to the user's demand. In addition, the correction and cut mechanism can easily be adjusted and taken apart. For instance, by using movable rail portions 70 having different thicknesses, it is possible to change the length from the lower surface of the IC main body to the front end of V-cut pin within a range of 3.2-4.0 mm. In addition, the assemblies of the correction heads 105a, 105b and the movable blades 111a, 111b can simply be removed from the main body, so that it is easy to exchange and inspect these parts for maintenance.

Polarity Detection and Inversion Mechanism

This mechanism is provided for detecting the polarity of an IC and for inserting the IC into a printed circuit board in the specified direction. When ICs are loaded in an IC cassette 2, if all ICs are charged in the previously determined polarity (direction), the direction of inserting into the printed circuit board can be specified by providing only a mechanism for selectively inverting the direction of ICs. In the actual IC charging (or loading) operation, however, it is troublesome to align all ICs in the predetermined direction. In general, each IC bears a polarity mark for showing its direction, but this mark is too small to be reliably observed while loading the ICs, and as a result, the probability of erroneous charging becomes high. It is therefore necessary to provide a mechanism for automatically detecting the polarity of an IC at first and then inverting its direction if necessary. This polarity detection and inversion mechanism is provided at the latter stage of the gate mechanism 6h as shown in FIG. 2 and comprises an IC stopper mechanism, a contact terminal for detecting polarity and a rotary rail portion for rotating the IC by 180°.

Figure 16A:
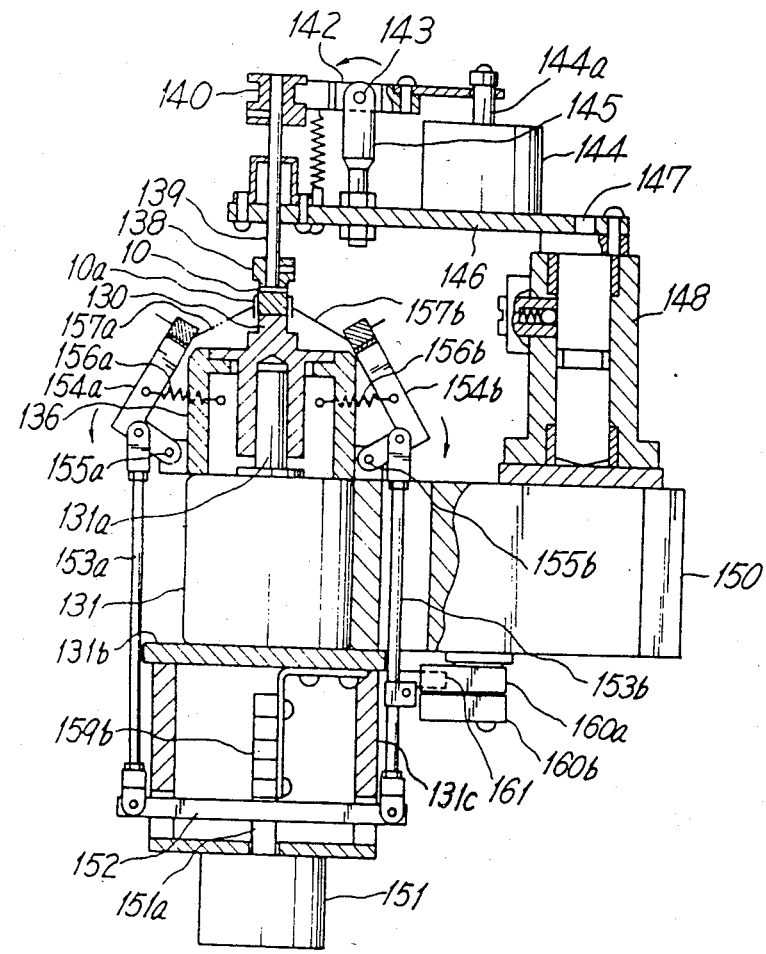
FIGS. 16A to 16C are a side view, a front view and a top view of a polarity detection and inversion mechanism.
Figure 16C:
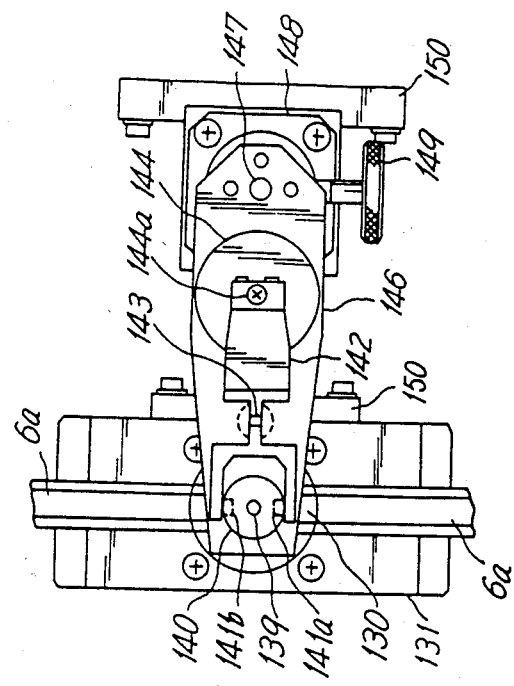
Figure 16B:
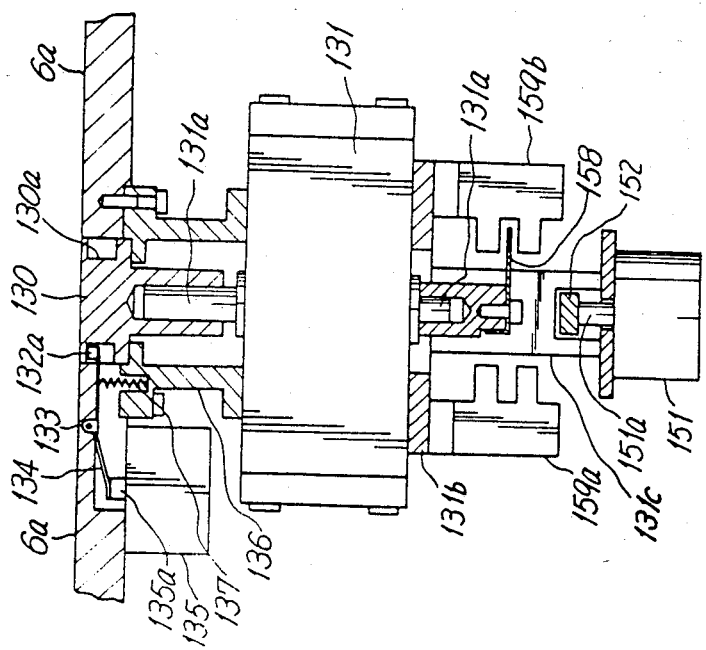
Figure 17:
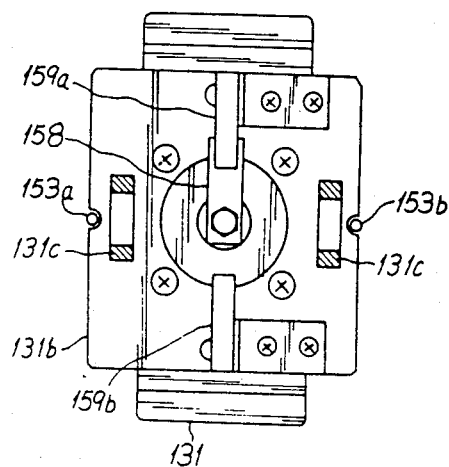
FIG. 17 is a bottom view of FIG. 16, a part being removed therefrom.
Figure 18A:
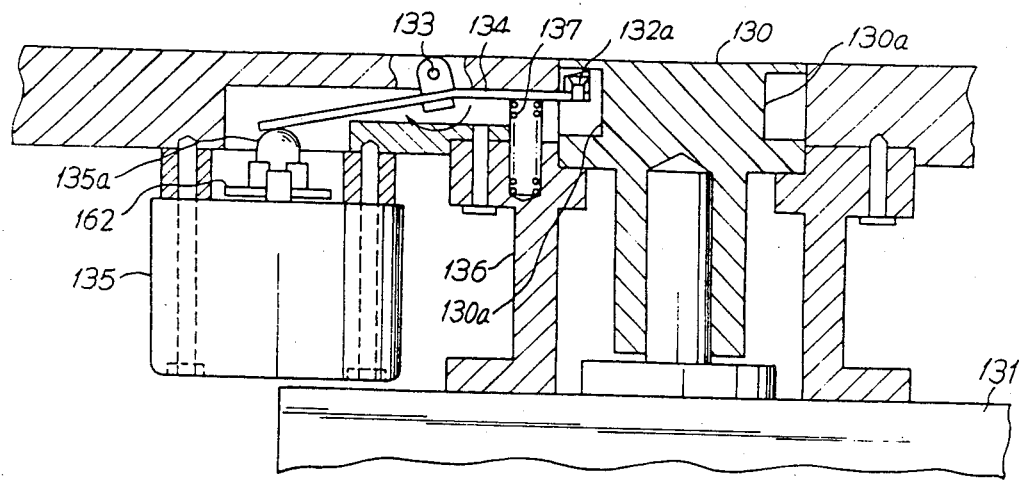
Figure 18B:
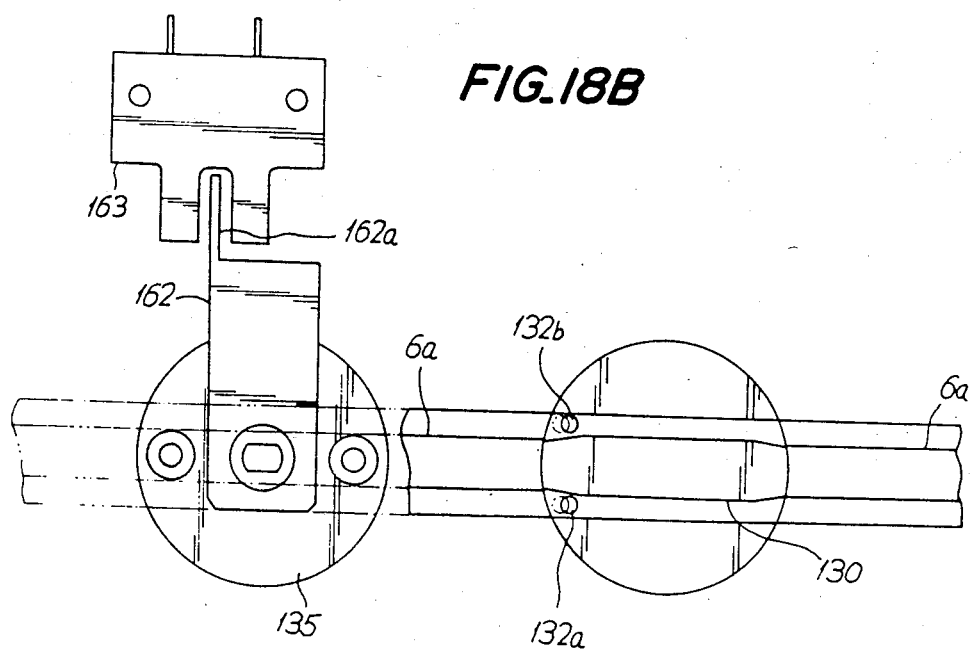

FIGS. 16A to 16C are a partially cross-sectional view of an embodiment of the polarity detection and inversion mechanism viewed from the IC traveling direction, a partially cross-sectional view thereof viewed from the direction perpendicular to the IC traveling direction, and a plan view, respectively. FIG. 17 is a bottom view without the lower side portion of FIG. 16A. FIGS. 18A–18C are a front view, a plan view and a side view, respectively, showing the stopper mechanism in an enlarged scale, and partly in section. In the first place, the stopper mechanism for stopping the IC at the polarity detection and inversion mechanism will be explained. As best shown in FIG. 16B, there is provided a rotary rail portion 130 being aligned with the fixed rail 6a of the treating portion, and the rotary rail portion is fixed to a rotary shaft 131a of a rotary actuator 131. The rotary rail portion 130 is made of insulating material. As shown in FIG. 18B, the rotary rail portion 130 is aligned with the rail 6a in the stand-by condition for receiving the IC. The IC 10 slides down on the rail 6a, and its pins 10a project downward from the rail top surface as shown in FIG. 16A. The IC pins come into contact with stopper pins 132a, 132b so as to stop the IC 10 on the rotary rail portion 130. These stopper pins 132a, 132b are fixed to one end of a lever 134 rotatably supported by a shaft 133, and the other end of the lever 134 comes into contact with a vertically movable plunger 135a of an air cylinder 135. In addition, a compressed coil spring 137 is provided between the lever 134 and a fixed member 136, and the lever 134 is biased to rotate in the direction opposite to the direction of an arrow shown around the shaft 133 in FIG. 18A. Therefore, if the air cylilnder 135 is driven, the lever 134 is rotated in the direction of the arrow gainst the force of the spring 137 to withdraw the stopper pins 132a, 132b below the running path of the IC pins 10a.

There is further provided a pressure head 138 for pressing the IC onto the rotary rail portion 130 after the IC 10 has been stopped on the rotary rail portion by the stopper pins 132a, 132b. The pressure head 138 is fixed to the lower end of a shaft 139 which is slidably held in the vertical direction. To the upper end of the shaft 139 is secured a bearing 140 in such manner that the shaft 139 and the bearing 140 are integrally moved in the vertical direction, but they are relatively rotated. The bearing 140 is pivoted at one end of an arm 142 through pins 141a, 141b so as to rotatably support the arm by a pin 143, while, the other end of the arm 142 is connected to a vertically movable plunger 144a of an air cylinder 144. The above pin 143 is secured to a post 145, and the post is fixed on a rotary plate 146 together with the air cylinder 144. One end of the rotary plate 146 is fixed to a shaft 147, and the shaft is rotatably held by a bearing 148. The bearing 148 is provided with a lock screw 149 as shown in FIG. 16C. When the lock screw 149 is loosened, the plate 146 and the whole pressure mechanism secured thereto can be rotated in the horizontal plane, so that the pressure mechanism can be retired then from the upper portion of the rotary rail portion 130. In this manner, the rotary rail portion 130 can be easily accessed, and any stacked IC can easily be removed.

When the air cylinder 144 is driven and its plunger 144a is raised, the lever 142 is rotated in the direction of an arrow around the pin 143 in FIG. 16A, and the pressure head 138 can be lowered. Then, the IC 10 is positively urged against the rotary rail portion 130 as shown in FIG. 16A.

The above-described rotary actuator 131 and the bearing 148 are secured to a base plate 150 having a rather complicated configuration, and an air cylinder 151 is further secured to the base plate 150 via a support plate 131b secured to the rotary actuator 131 and a support frame 131c. A plunger 151a of the air cylinder 151 is fixed to a lever 152, and to both ends of the lever are journaled the lower ends of rods 153a, 153b. The upper ends of these rods are pivoted to rods 153c, 153d secured to L-shaped levers 154a, 154b in FIG. 16A, and these levers are secured to a fixed member by shafts 155a, 155b. Therefore, if the plunger 151a of the air cylinder 151 is moved downard, the L-shaped levers 154a, 154b are rotated in the directions of arrows shown around the shafts 155a, 155b, respectively. Between the L-shaped levers 154a, 154b and the fixed member are provided pulling coil springs 156a, 156b to bias the levers to rotate in the direction opposite to the directions shown by the arrows.

Figure 19:
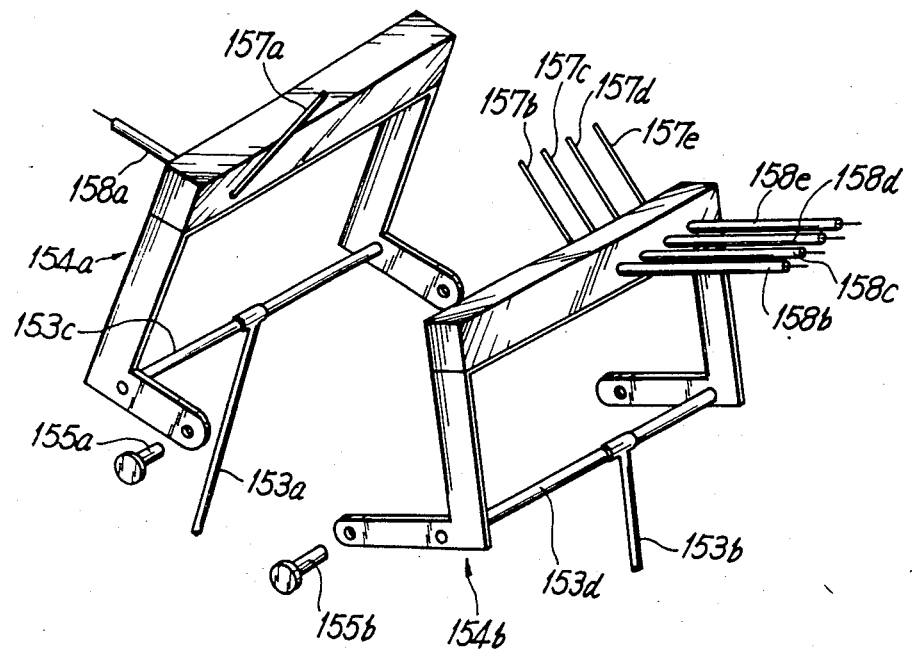
FIG. 19 is a perspective view showing a contact pin member.

As shown in FIG. 19, to the L-shaped levers 154a, 154b are secured one and four contact pins 157a and 157b-157e, respectively, and these contact pins are connected to a measurement circuit, which will be explained later on, through coaxial cables 158a-158e, respectively. These contact pins 157a-157e are positioned to contact with desired pins of an IC. ICs have different numbers of pins, but in the polarity detection mechanism of the present embodiment, it is possible to inspect the ICs having 14 pins to 20 pins. That is, the one L-shaped lever 154a has one contact pin 157a to be connected to one of power supply source pins, while the other L-shaped lever 154b has four contact pins 157b-157e, and in case of an IC having 14 pins, the innermost contact pin 157b comes into contact with the other power supply source pin, and the case of IC having 20 pins, the outermost contact pin 157e comes into contact with the power supply source pin. Polarity is thus inspected by contacting the contact pins 157a and 157b-157e with the pins 10a of the IC 10 pressed on the rotary rail portion 130. When the IC is detected to be in the opposite direction, the air cylinder 151 is driven, its plunger 151a is lowered, the L-shaped levers 154a, 154b are rotated in the direction of the arrows against force of springs 156a, 156b, and the contact pins are separated from IC, and the rotary actuator 131 is thereafter driven to rotate the rotary rail portion 130 by an angle of 180°. During this rotation, the IC 10 is secured on the rotary rail portion 130 by the pressure head 138, so that the IC never escapes from the rail portion. When the IC 10 is rotated by 180° in this manner, the IC can be directed to any desired direction viewed in the direction of the rail 6a. The rotary rail portion 130 is formed with a recess 130a in order not to impinge the stopper pins 132a, 132b against the rail portion 130 upon the rotation of the rotary rail portion 130.

In order to detect in the angle position in which the rotary rail portion 130 is situated, the plunger 131a of the rotary actuator 131 projects downward to support a light shielding plate 158 in the horizontal direction as clearly shown in FIGS. 16B and 17. At positions opposed diagonally in a rotary locus of the light shielding plate 158 are provided photoelectric sensors 159a, 159b each having a light source and a light receiver for receiving light from the light source. Under the condition shown in FIG. 16B, the light shielding plate 158 is positioned within the photoelectric sensor 159b, while at the other photoelectric sensor 159a, the light detector receives light from the light source. When the rotary rail portion 130 is rotated by 180°, the light shielding plate 158 enters into the photoelectric sensor 159a, and at the photoelectric sensor 159b the light from the light source is directly incident upon the light receiver. As a result, the direction of the rotary rail portion 130 can be detected.

In order to further detect whether the contact pins 157a-157e are in the operative position to come into contact with the IC pins or in the stand-by position, a photoelectric detecting device is provided as shown in FIG. 16A. A pair of photoelectric sensors 160a, 160b are provided one on the other along the rod 153b, and a light shielding plate 161 is secured to the rod 153b in such a manner that it can engage these photoelectric sensors. In the condition shown in FIG. 16A, the light shielding plate 161 is within the upper photoelectric sensor 160a, and at the other photoelectric sensor 160b, light from a light source is directly incident upon a light receiver. In such condition, it is confirmed that the contact pins 157a-157e are in the position for contact with IC pins. When the rods 153a, 153b are lowered, the light shielding plate 161 enters into the lower photoelectric sensor 160b, and in this condition, the contact pins 157a-157e are confirmed to be in the position apart from IC pins.

Moreover, in order to detect whether the stopper pins 132a, 132b are in the position for contact with IC pins or in the withdrawn position, to the plunger 135a of the air cylinder 135 is fixed a lever 162 extending in the direction perpendicular to the rail 6a, as illustrated in FIGS. 18B and 18C. At the free end of the lever 162 is integrally formed a light shielding plate 162a, and the plate 162a is detachably provided in a detection region 163a of a photosensor 163. As shown in FIG. 18, when the stopper pins 132a, 132b are at the position for contact with IC pins, the light shielding plate 162a enters into the photoelectric sensor 163, but if the plunger 135a is raised by driving the air cylinder 135, the plate 162a is removed from the photoelectric sensor 163, and light from a light source is directly incident on a light receiver. The position of the stopper pins 132a, 132b can be positively detected in this manner.

Figure 20:
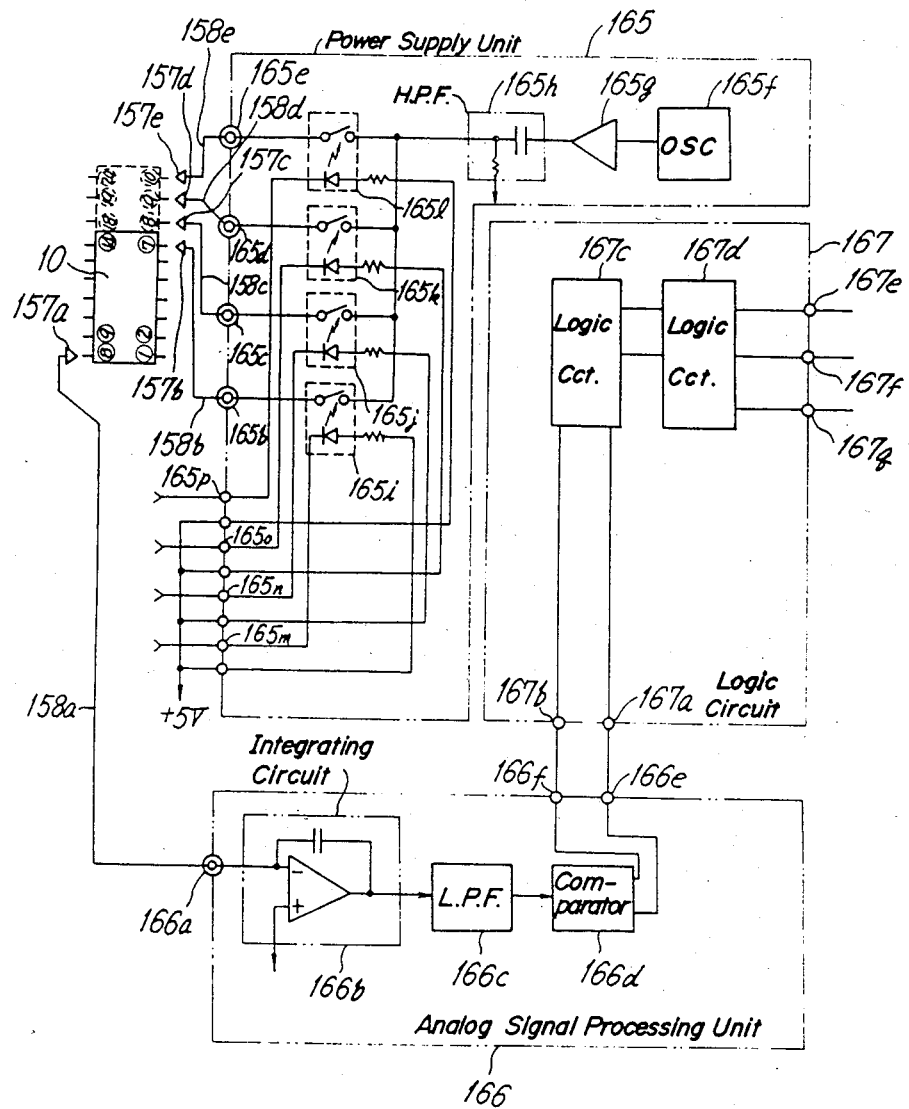
FIG. 20 is a block diagram showing the construction of a polarity detecting circuit.
Figure 21:
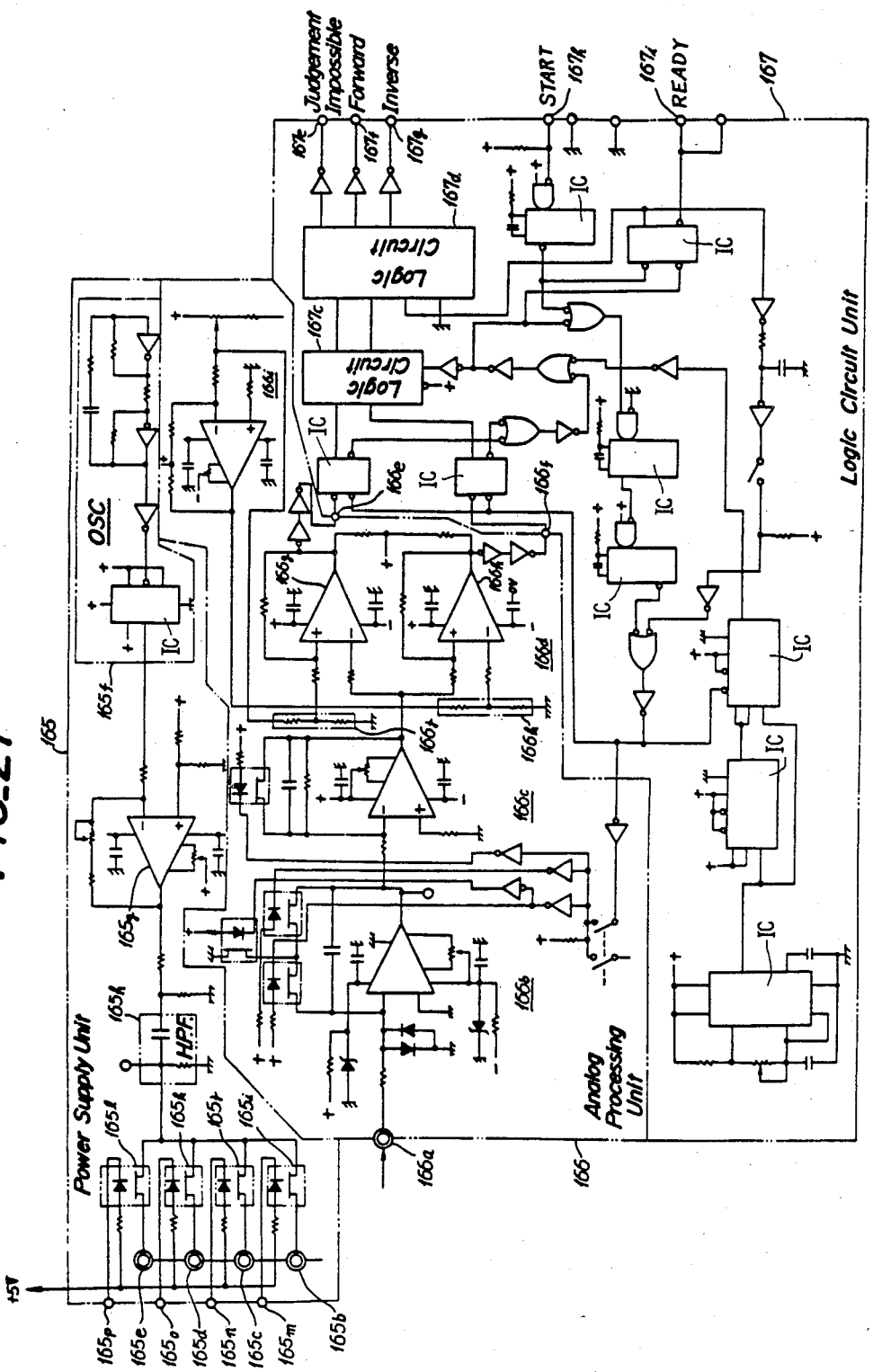
FIG. 21 is a circuit diagram showing the detailed construction of the polarity detecting circuit.

FIG. 20 shows one outlined construction of a measurement circuit connected to the contact pins 157a-157e, and FIG. 21 is a circuit diagram showing the detailed construction thereof. The measurement circuit consists of three circuit portions as a whole. That is, the circuit comprises a power supply source unit 165, an analog signal processing unit 166 and a logic circuit unit 167. The contact pin 157a is connected to an input terminal 166a of the analog signal processor portion 166 through a coaxial cable 158a, and the other contact pins 157b-157e are connected to output terminals 165b-165e of the power supply source unit 165 through the coaxial cables 158b-158e. The power supply source unit 165 is provided with an oscillator 165f, for generating a signal of, for instance, 50 KHz and the signal passes through an amplifier 165g and a high bandpass filter 165h to generate a rectangular signal having a duty cycle of 50% and a P-P value of ±100 mV. This signal is parallelly applied to the output terminals 165b-165e through photoelectric switches 165i, 165j, 165k, 165l in a period of about 300 ms. These photoelectric switches are made selectively conductive by a signal supplied to input terminals 165m, 165n, 165o, 165p. That is, in a copy mode, the number of pins of each IC is stored in a computer beforehand, and in the actual inserting operation the data is read out and any desired photoelectric switch is made conductive in accordance with the stored number of pins of relevant IC. For instance, in case of an IC with 14 pins, a signal is given to the input terminal 165m, thereby making the photoelectric switch 165i only conductive, and the above-described power supply source voltage is applied to the contact pin 157b through the output terminal 165b and the coaxial cable 158b. In case of an IC with 20 pins, the photoelectric switch 165l is made conductive by a signal supplied to the input terminal 165p, and the power supply voltage is selectively applied to the contact pin 157e.

When the power supply voltage is thus applied to the IC power supply source pin, a current flows through circuits in the IC, but the current also flows into the contact pin 157a. This current is taken into the analog signal processing unit 166 through the coaxial cable 158a and the input terminal 166a. The anlog signal processing unit is provided with an integrating circuit 166b, a low pass filter 166c and a comparison circuit 166d. The current flowing through the IC 10 is deviated (or truncated) in the negative or positive direction as shown in FIGS. 22B and 22C in accordance with the polarity of the IC. Therefore, when the thus deviated current is integrated by the integrating circuit 166b, positive and negative voltages +Vs and −Vs are obtained, respectively, as shown by a solid line and a dotted line in FIG. 22D. When these voltages are compared with positive and negative reference voltages $+V_R$ and $-V_R$ in the comparison circuit 166d, it is possible to observe whether a larger amount of current flows from the contact pin 157b to the contact pin 157a through the IC 10 or vice versa, so that the polarity of the IC is thereby detected. This judgement is based on a signal supplied from the output terminals 166e, 166f of the analog signal processing unit 166 to the input terminal 167a, 167b of the logic circuit unit 167. That is, the logic circuit portion 167 is provided with logic circuits 167c, 167d, and when an integral value is between reference voltages $+V_R$ and $-V_R$, a signal denoting that the judgement is impossible is transmitted to the output terminal 167e, and when an integral value is larger than the reference voltage $+V_R$, a signal representing that the IC is in the forward direction is transmitted to the output terminal 167f, and when an integral value is smaller than the reference voltage $-V_R$, a signal denoting that the IC is in the inverse direction is transmitted to the output terminal 167g. If the inverse direction signal is transmitted, the rotary rail portion 130 is rotated by 180° by driving the rotary actuator 131 shown in FIG. 16 and the polarity of the IC 10 is inversed.

FIG. 21 is a circuit diagram showing the detailed construction of the measurement circuit. The portions corresponding to those shown in FIG. 20 are denoted with corresponding numerals and explanation thereof is omitted, but the comparison circuit 166d and the circuit relating thereto will be explained in brief hereinafter. The comparison circuit is provided with two comparators 166g, 166h. The integral voltage value from the preceding low pass filter 166c is applied to the negative and positive input terminals of comparators 166g and 166h, respectively. In addition, voltages at the input and output sides of an inverter 166i are divided by potentiometers 166j and 166k, and these divided voltages are applied respectively to positive and negative input terminals of the comparators 166g and 166h as reference voltages $+V_R$ and $-V_R$. Besides, the logic circuit unit 167 is provided with a start input terminal 167h and a ready input terminal 167i.

The operation of the above polarity detection and inversion mechanism will be explained with reference to FIG. 23. In the first place, as shown in FIGS. 23A and 23B, at a time $t_0$, the engagement of the IC in the preceding gate mechanism 6h is released by driving the solenoid 56 (FIG. 7) and at the same time air is injected from the nozzle 62 toward IC for acceleration. As shown in FIG. 23C, the air from a nozzle (not shown) provided in the rail 6a at a position immediately before the polarity detection and inversion mechanism is intermittently sucked to decelerate the IC traveled at a high speed along the rail 6a, and after the IC strikes against the stopper pins 132a, 132b, the accelerating air is injected as shown in FIG. 23D, and the IC is urged against the stopper pins 132a, 132b. In this manner, the IC can be stopped precisely at a given position without causing a serious shock. As shown in FIG. 23E, after an IC sensor (not shown) detects the IC, the air cylinder 144 is driven at a predetermined time $t_1$ shown in FIG. 23F, and the pressure head 138 is lowered. When a pressure head sensor (not shown) detects the descending head, the stopper pin air cylinder 135 is actuated at a time $t_2$ as shown in FIG. 23H to remove the stopper pins 132a, 132b from the IC. After the stopper pin sensor 163 has confirmed the withdrawal of the stopper pins from the IC path as shown in FIG. 23I, the air cylinder 151 is driven at a time $t_3$ as shown in FIG. 23J, the L-shaped levers 154a, 154b are rotated, and the contact pins 157a-157e are brought into contact with predetermined pins of the IC. In response thereto, the outputs of the photoelectric switches 160a, 160b are varied as illustrated in FIGS. 23K and 23L. In the period when the contact pins are in contact with the IC pins, the power supply source pulses of 50 KHz are applied for 300 ms as described above, and the polarity of the IC is detected. At a time $t_4$ after the detection, the air cylinder 151 is driven, and the contact pins 157a-157e are separated from the IC pins. If a polarity inversion is necessary, the rotary actuator 131 is energized at a time $t_5$ as shown in FIG. 23M after confirming withdrawal of the contact pins. Then the rotary rail portion 130 is rotated by 180°, and the direction of the IC is changed. At a time $t_6$ thereafter, the air cylinder 144 is driven to raise the pressure head 138 and the IC 10 is freed on the rotary rail portion 130. Accelerating air is injected as shown in FIG. 23D, and the IC is sent to the following gate mechanism 6i at a high speed. As shown in FIG. 23N, the air is intermittently sucked and the IC is decelerated in the gate mechanism 6i. In addition, as shown in FIG. 23H, after the IC has been discharged from the polarity detection and inversion mechanism, the air cylinder 135 is driven to place the stopper pins 132a, 132b again into the IC path to prepare for the next IC.

After the polarity has been detected as described above and the IC has been inverted as required, the IC 10 falls down along the rail 6a and is once caught by the gate mechanism 6i, and thereafter is fuirther fed into the insertion portion 1d at a predetermined timing. The detailed construction of the insertion portion will be explained hereinafter.

Insertion Portion

As shown in FIG. 2, the insertion portion 1d is provided with various mechanisms, but the insertion head vertical movement mechanism 7b and the insertion head rotation mechanism 7c will be explained in the first place.

Insertion Head

FIGS. 24A to 24D are a partial cross-sectional side view, a front view and transverse cross-sectional views, respectively of the construction of an embodiment of the insertion head. A base plate 180 is provided and an air cylinder 181 is secured thereto. An end of a vertically movable plunger 181a of the air cylinder 181 is connected to a substantially L-shaped slide plate 183 through a floating joint 182. As shown in a cross-section of FIG. 25, the floating joint 182 comprises a fixed portion 182a threaded into the plunger 181a, a flange 182b threaded into the fixed portion, a screw 182c for locking the fixed portion with the flange, a bearing 182d sandwiched between the fixed portion and the flange, a ball portion 182e rotatably supported in the bearing, and a shaft portion 182f connected to the ball portion. The plunger 181a of the air cylinder 181 and the shaft portion 182f are relatively rotated around the center P of the ball portion 182e, thereby absorbing any mechanical play.

Figure 26:
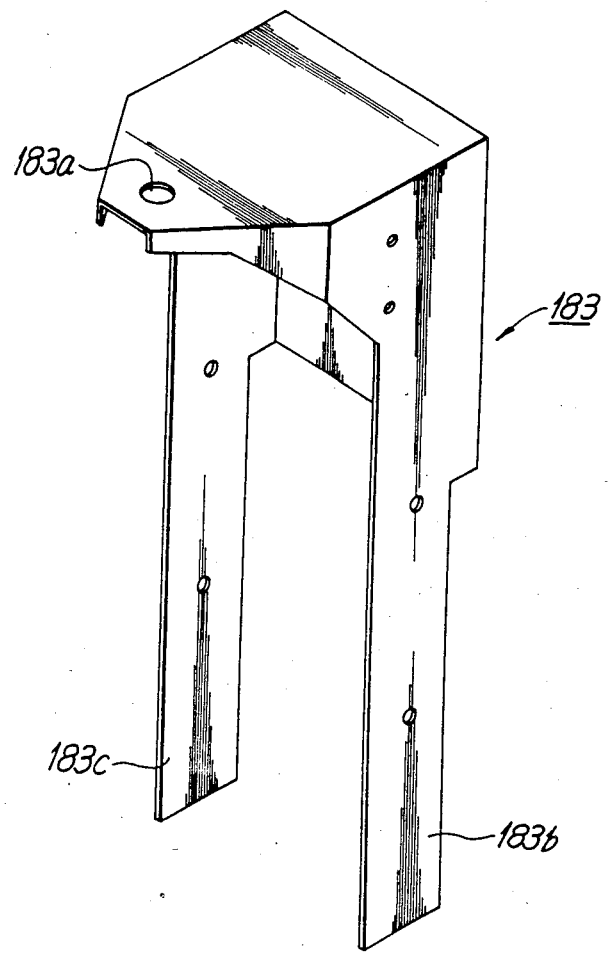
FIG. 26 is a perspective view showing the construction of a slide board shown in FIG. 25.

The slide plate 183 connected to the shaft portion 182f of the floating joint 182 has the shape shown in FIG. 26. An upper plate of the plate 183 is provided with a hole 183a for passing the shaft portion 182f therethrough, and both side plates 183b, 183c are provided with a pair of holes for passing screws for securing movable blocks of a slide rail which will be explained later on. A fixed block 185 of the slide rail is mounted on the base plate 180, and the fixed block holds a pair of fixed rails 184a, 184b. The fixed block 185 consists of two integrally connected blocks. The movable block 187 of the slide rail is fixed to side plates 183b, 183c of the slide circuit board 183 as described above, and the movable block 187 holds a pair of movable rails 188a, 188b cooperating with the fixed rails 184a, 184b. In this manner, the movable block 187 can be slid vertically with respect to the fixed block 185. In addition, a tension coil spring 190 is provided between a projection 188 fixed to the upper portion of the base plate 180 and a pin 189 provided in the slide plate 183, so as to bias the slide plate to move upward.

Figure 24A:
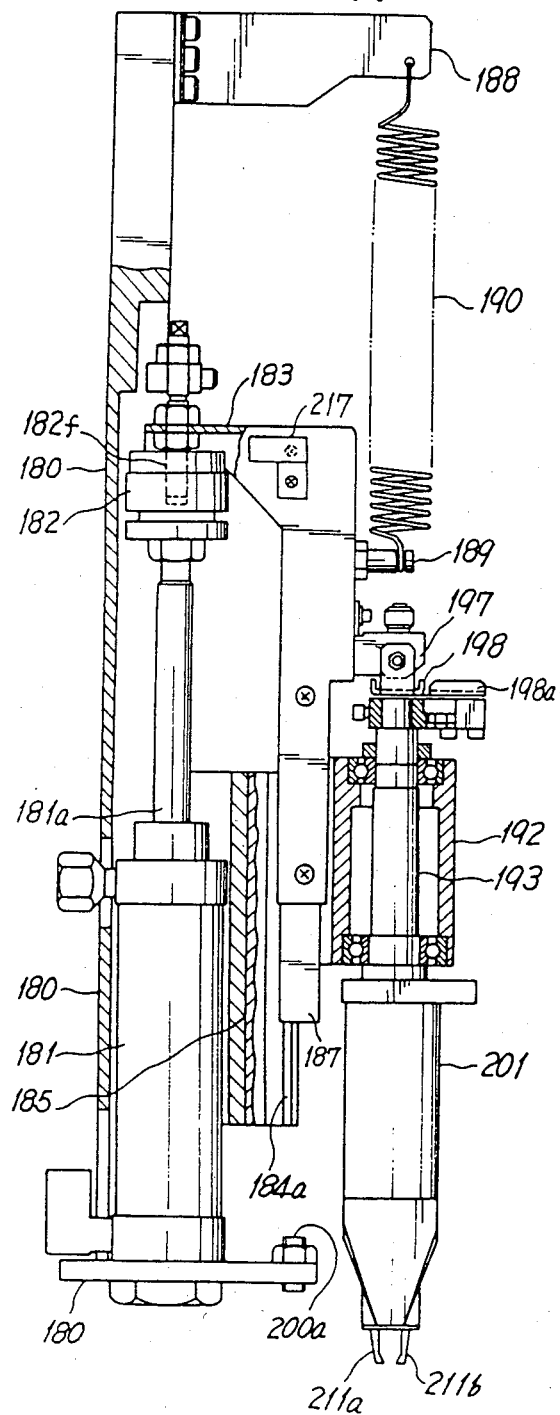
FIGS. 24A to 24D show constructions of a vertical motion mechanism and rotation mechanism of an insertion head.
Figure 24B:
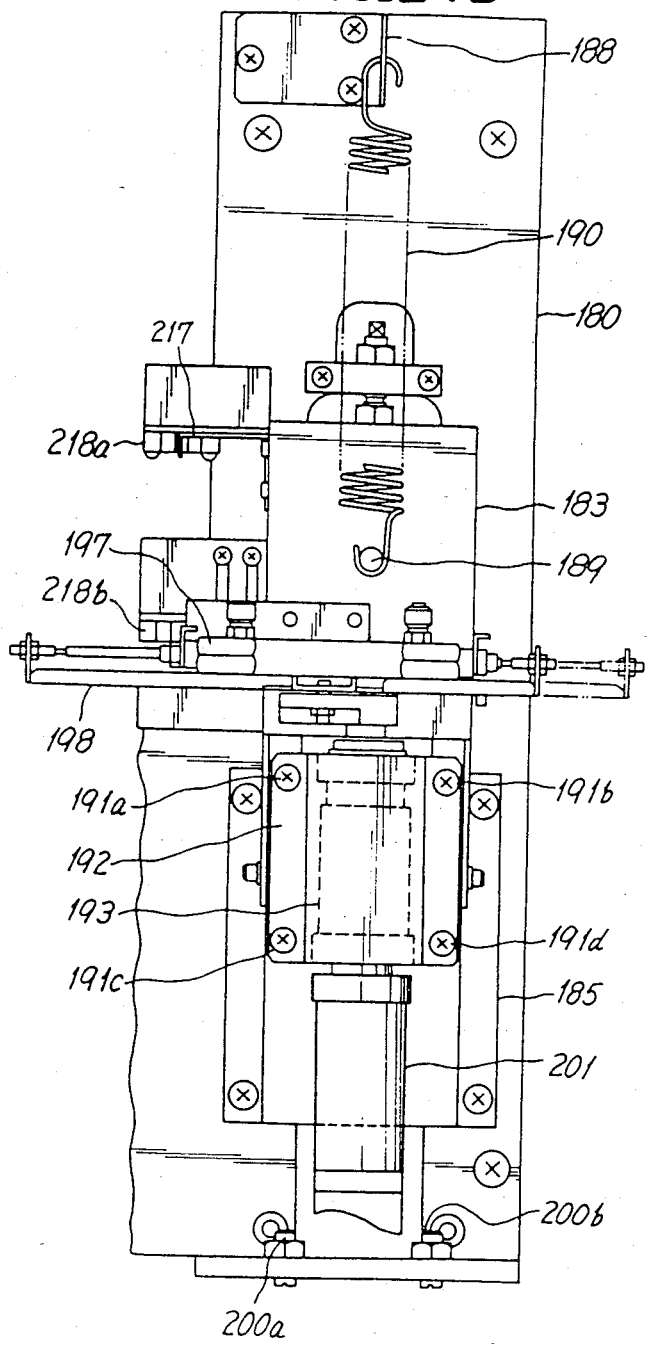
Figure 24C:
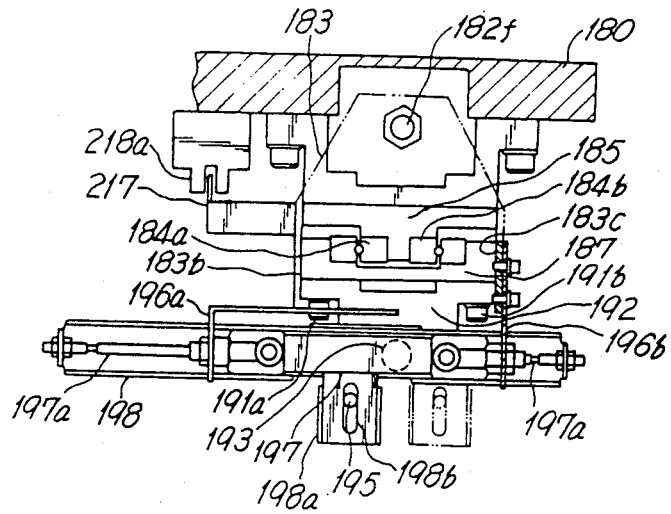
Figure 24D:
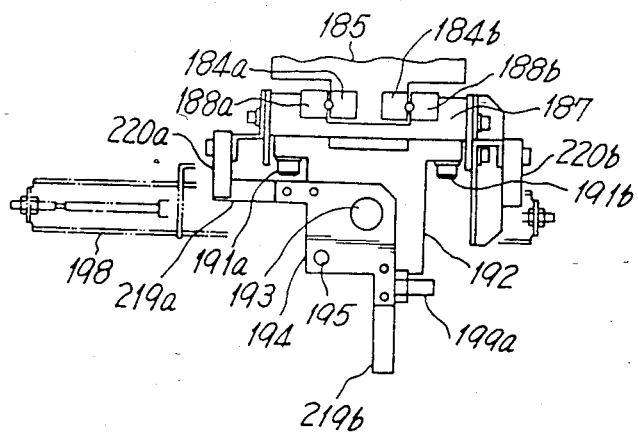
Figure 25:
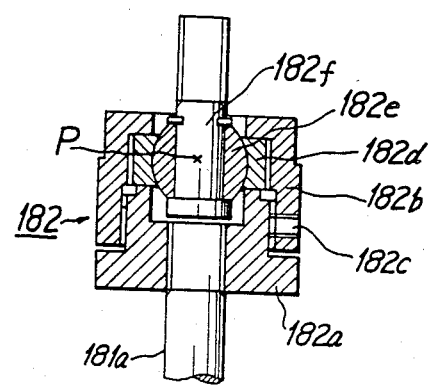
FIG. 25 is a cross-sectional view showing the construction of a floating joint shown in FIG. 24.
Figure 27A:
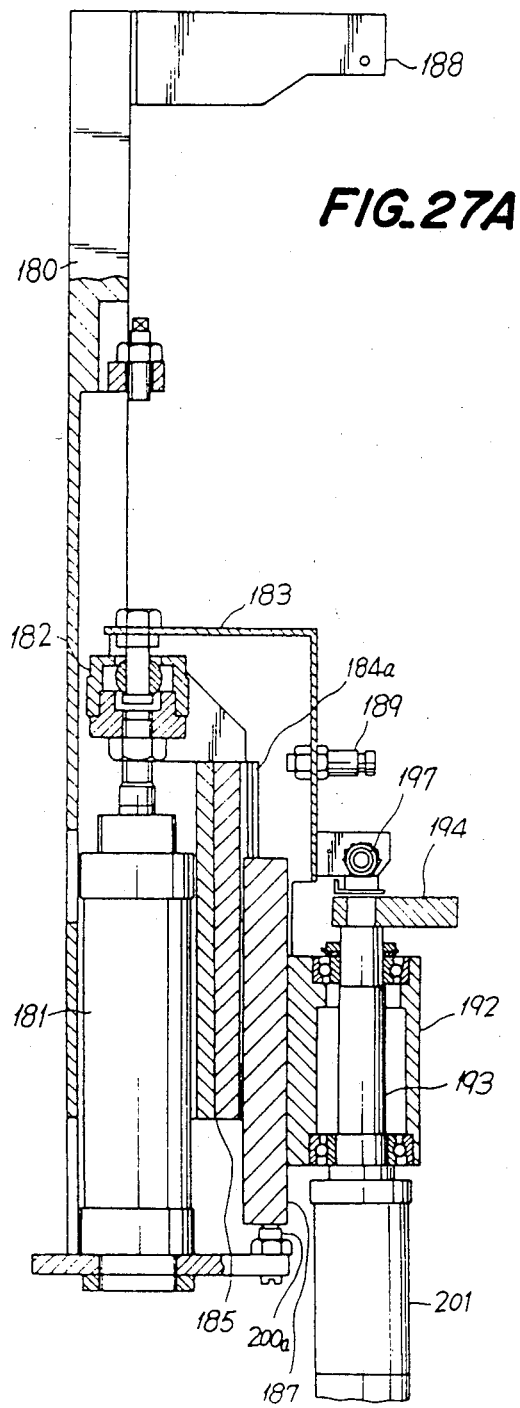
FIGS. 27A to 27F show the vertical motion mechanism and rotation mechanism of the insertion head shown in FIG. 24.
Figure 27B:
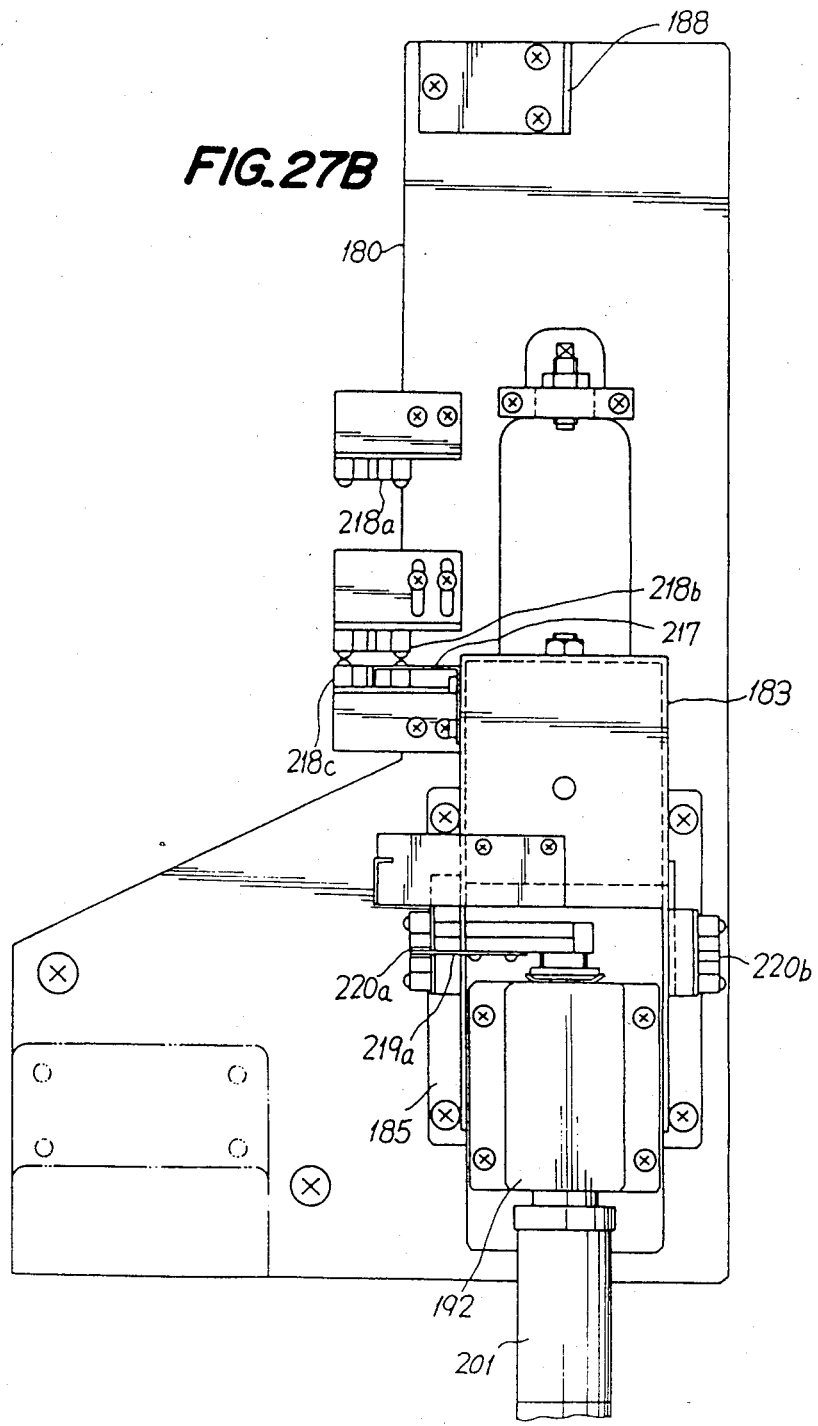
Figure 27C:
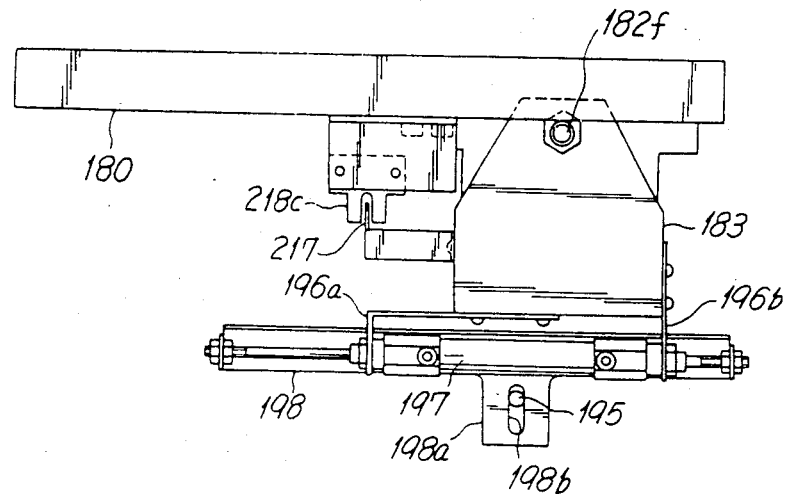
Figure 27D:
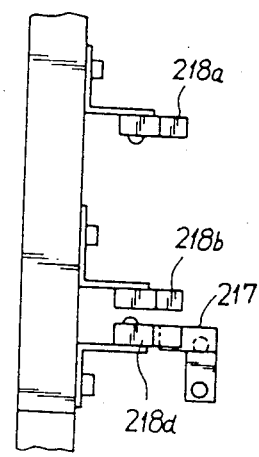
Figure 27E:
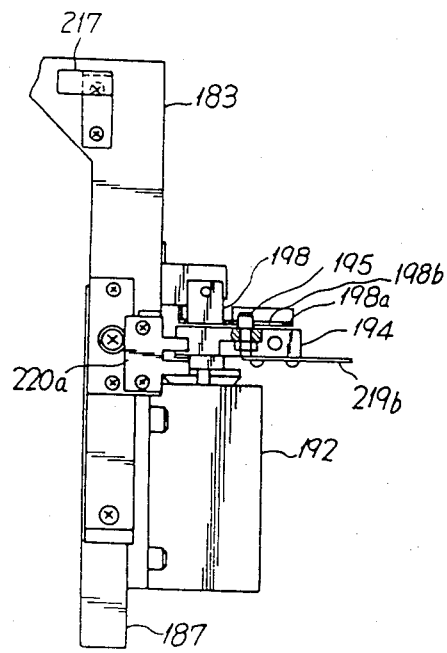
Figure 27F:
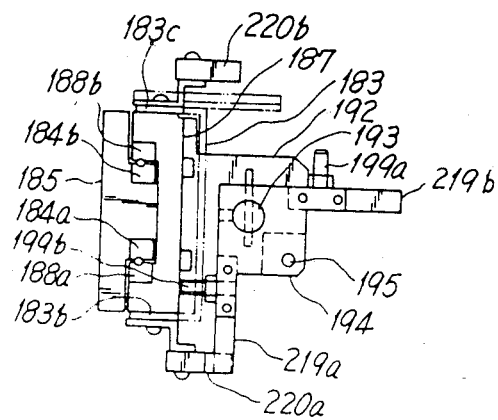

A bearing housing 192 is fixed to the movable block 187 by screws 191a–191d, and a shaft 193 is rotatably arranged in the bearing housing. As shown in FIG. 24D, a link 194 is fixed to the bearing 193, and on this link is provided a pin 195. In addition, to the movable block 187 of the slide rail is secured an elongated air cylinder 197 through arms 196a, 196b as best shown in FIG. 24C. Both ends of a plunger 197a of the air cylinder 197 project from the cylinder and are fixed to both ends of a slider 198. At about the center of the slider 198 is integrally formed a projection 198a, and in the projection is formed an elongated hole 198b into which is passed a pin 195 fixed to the link 194. Therefore, if the air cylinder 197 is driven to slide the slider 198 right and left, the link 194 is rotated around the shaft 193. In the present embodiment, this rotary angle is limited to 90°. For this purpose, there are provided stoppers 199a, 199b. FIG. 24D shows only one stopper 199a for the sake of clarity, while FIG. 27F shows both stoppers 199a, 199b. These stoppers serve to stop the link 194 in postion by contacting the movable block 187. FIGS. 27A–27F correspond to FIGS. 24A–24D and mainly show the arrangement of the photoelectric sensors, while deleting several portions for the sake of clarity. In addition, FIG. 27 shows the condition wherein the movable block 187 of the slide rails is lowered into the lowermost position defined by stoppers 200a, 200b.

Figure 28A:
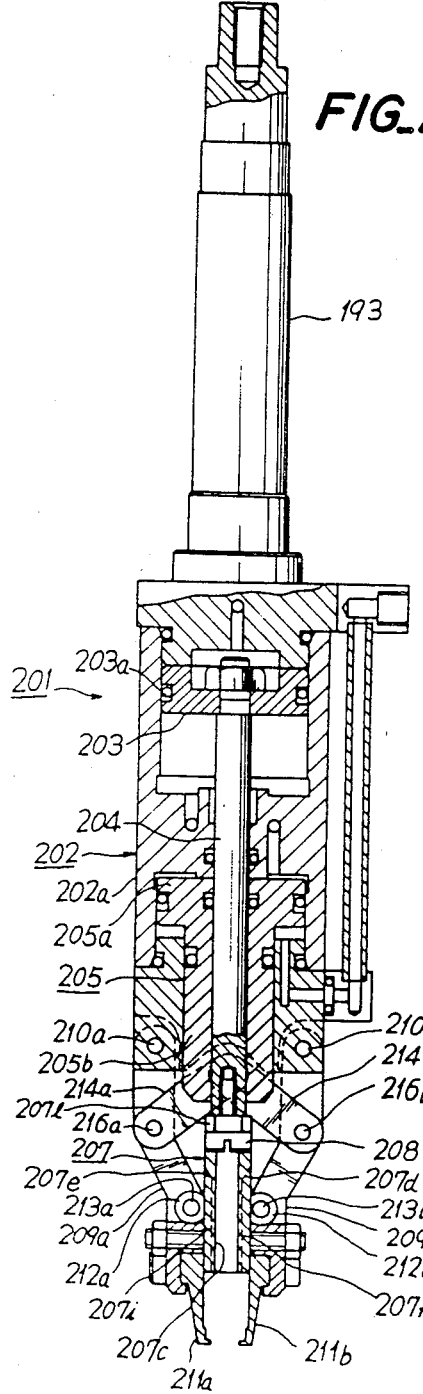
FIGS. 28A to 28F show the detailed construction of the insertion head.
Figure 28B:
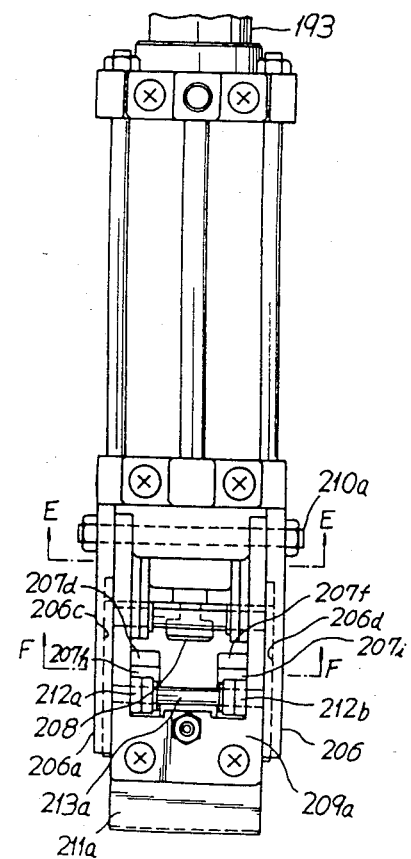
Figure 28C:
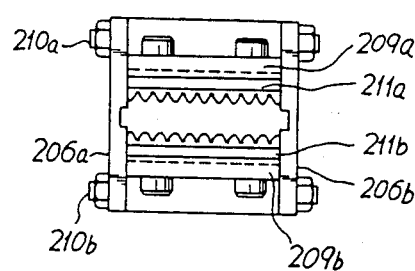
Figure 28E:
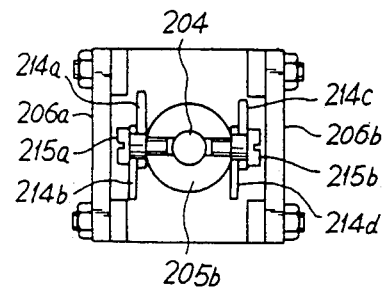
Figure 28D:
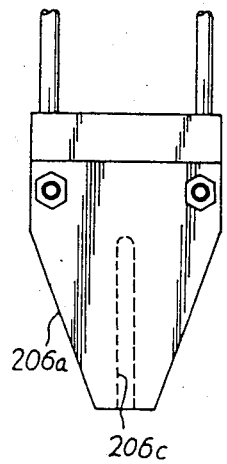
Figure 28F:
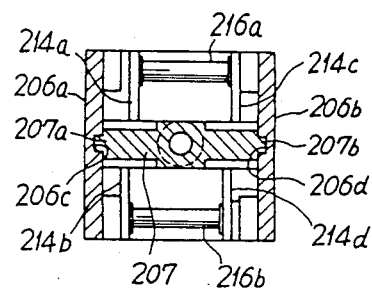
Figure 29:
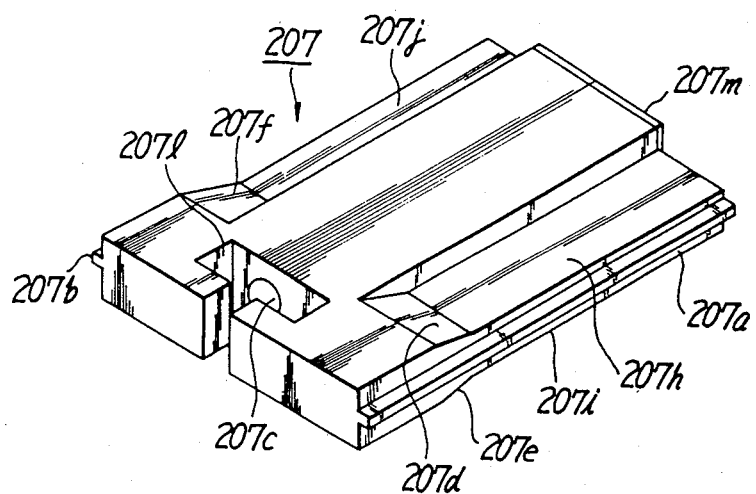
FIG. 29 is a perspective view showing a pusher shown in FIG. 28.

An insertion head 201 provided with a double air cylinder is connected to the lower end of the shaft 193 rotatably supported in the bearing housing 192 which moves vertically together with the slide plate 183. The construction of the insertion head is shown in FIG. 28. The insertion head 201 functions to grip the IC processed in the treating portion 1c by means of claws and to push the IC pins into holes bored in the printed circuit board. The insertion head 201 is provided with a double air cylinder 202, and in its cylindrical cylinder housing 202a is slidably arranged a first piston 203 through an O-ring 203a. The first piston 203 is fixed to the upper end of a piston rod 204. In addition, a second piston 205 is provided relatively slidably with respect to the piston rod 204. The second piston 205 comprises a piston portion 205a and a piston rod portion 205b. At the lower portion of the cylinder housing 202a are secured a pair of guide plates 206a, 206b in parallel with each other, and inner surfaces of these guide plates are formed with perpendicularly extended guide grooves 206c, 206d, respectively. These guide grooves 206c, 206d are slidably engaged with projections 207a, 207b formed on both side surfaces of a pusher 207 for pushing the IC to the printed circuit board as shown in FIG. 29. The pusher 207 has formed therein the above-described projections 207a, 207b on both side surfaces, a hole 207c extending in the axis direction, taper portions 207d to 207g formed along the side edges of both surfaces, descended portions 107h to 107k connected to the taper portions and a recess portion 207l for inserting from the side a lock screw 208 which secures the pusher 207 to the lower end of the piston rod 204. In order to connect pusher 207 to the lower end of the piston rod 204 with the lock screw 208, the screw 208 is inserted into the recess portion 207l from the side, a screwdriver is inserted into the hole 207c from the lower surface of the pusher, and the screw 208 is threaded into a screw hole formed in the lower surface of the piston rod 204. In this case, it is possible to shift the screw 208 with respect to the pusher axis for absorbing an axial displacement of the piston rod 204 from the pusher 207.

Figure 30:
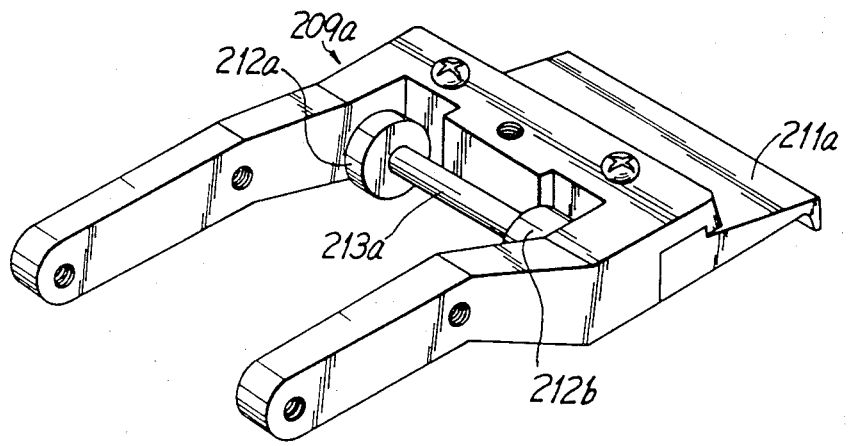
FIG. 30 is a perspective view showing a chuck shown in FIG. 28.
Figure 32A:
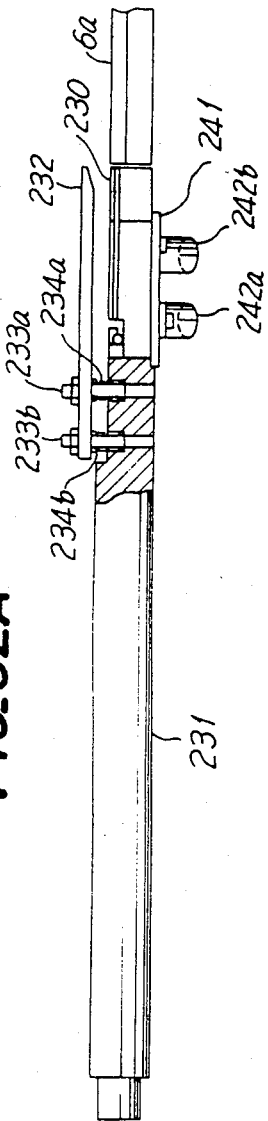
FIGS. 32A to 32D show the construction of a retract stand.
Figure 32B:
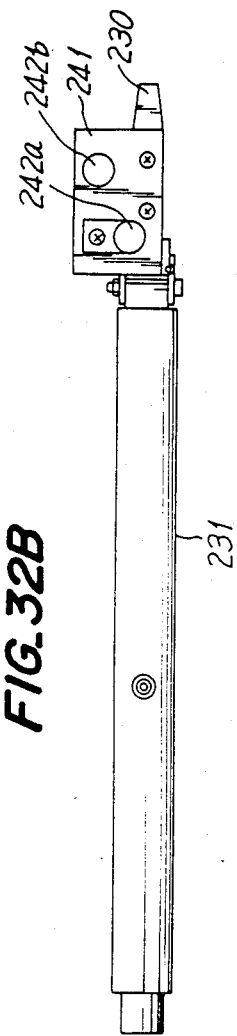
Figure 32C:
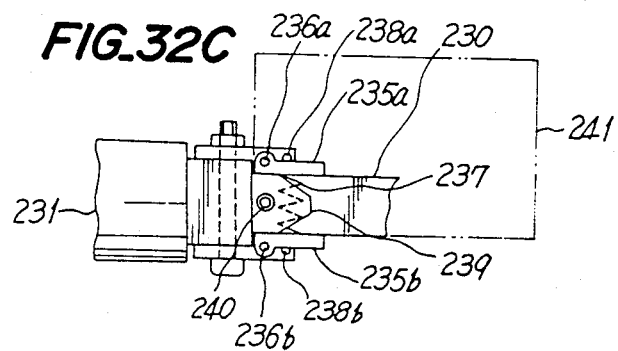
Figure 32D:
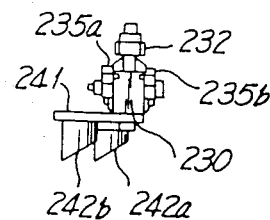

At the lower end of the cylinder housing 202a are further rotatably secured a pair of chucks 209a, 209b by means of shafts 210a, 210b, respectively. The construction of the chuck 209a is shown in FIG. 30. to the end of the chuck are further fixed claws 211a, 211b for gripping the IC pins. As shown in FIG. 28C, the inner edges of these claws 211a, 211b are formed with V-shaped grooves, so as to positively grip the IC pins. The chucks 209a, 209b rotatably support a pair of rollers 212a, 212b and 212c, 212d by shafts 213a and 213b, and these rollers come into contact with the taper portions 207d to 207g and the descended portions 207h to 207k formed on both surfaces of the pusher 207.

The lower end of the piston rod portion 205b of the second piston 205 rotatably supports one end of links 214a–214d, and the other ends of these links are pivoted on chucks 209a, 209b by means of shafts 216a, 216b. As a result, when the second piston 205 is displaced from the position shown in FIG. 28A to the lower portion while the piston rod 204 is immobilized, the chucks 209a, 209b are rotated outward to open claws 211a, 211b widely. On the other hand, when the first piston 203 is displaced to the lower portion while the second piston 205 is retained in the position shown in FIG. 28A, that is, with the claws 211a, 211b being closed, the pusher 207 is lowered to push the IC through a cushion 207m fixed to the tip of the pusher 207. During the pushing procedure, the rollers 212a to 212d of the chucks 209a, 209b move over the taper portions 207d–207g of the pusher 207, and as a result, the claws 211a, 211b are slightly opened. In this manner, the IC pins can be inserted into the holes of the printed circuit board as soon as the IC is released.

FIG. 31 shows the positional relationships between pusher 207, chucks 209a, 209b, and piston rod portion 205b of the second piston in various conditions, but their detailed explanation will be made when the action of the shole insertion portion is explained later on. In addition, there are provided various photoelectric sensors for controlling the action of each portion, and these sensors will be explained first with reference to FIG. 27. In the first place, for detecting the vertical position of the slide plate 183, as clearly shown in FIG. 27B, a light shielding plate 217 is fixed to the slide plate 183, and photoelectric switches 218a to 218c are provided in the base plate 180 along the running path of the light shielding plate. The photoelectric switch 218a detects the uppermost position and the photoelectric switch 218c detects the lowermost position, respectively, and the photoelectric switch 218b detects a position slightly higher than the lowermost position. As shown in FIG. 27F, the link 194 rotatably disposed around the shaft 193 is fixed to light shielding plates 219a, 219b at positions shifted from each other by 90°, and to the movable block 187 are secured photoelectric switches 220a, 220b cooperating with these plates. In the condition shown in FIG. 27F, the light shielding plate 219a enters between a light source and a light receiver of the photoelectric sensor 220a, but the other light shielding plate 219b is removed from the photoelectric sensor 220b. This condition is the reference condition, i.e., the condition of 0°. On the other hand, if the link 194 is rotated by 90° by driving the air cylinder 197, the light shielding plate 219b enters into the photoelectric sensor 220b, and the light shielding plate 219a is removed from the photoelectric sensor 220a. This condition is the 90° rotated condition.

Retract Mechanism

Here is explained a retract mechanism which retracts from the descending path of the insertion head after stopping the IC sent from the treating portion 1c to the position of the insertion head, the IC pins being gripped with the claws 211a, 211b of the chucks 209a, 209b of the insertion head.

FIGS. 32A to 32D are a front view showing one embodiment of the retraction stand, a bottom view thereof, a partially enlarged bottom view and a side view. The retraction stand comprises a rail portion 230 communicating with the rail 6a. The rail portion 230 is coupled with a shaft 231. At the upper portion of the rail portion 230, a vertically movable press plate 232 is mounted by means of a pair of pins 233a, 233b and compressed coil springs 234a, 234b. The press plate 232 prevents the IC from slipping off the rail portion 230, and the pusher of the insertion head presses the IC to the rail portion 230 through the press plate. On both sides of the end of the rail portion 230, stoppers 235a, 235b are rotatably mounted by means of shafts 236a, 236b, respectively for stopping the IC in position, and a compressed coil spring 237 is provided between these stoppers to bias the stoppers to rotate outward. This rotation is limited by stopper pins 238a, 238b. In addition, in order to prevent the spring 237 (provided in a groove which is formed in the lower surface of the rail portion 230) from slipping off, a cover 239 is fixed to the lower surface of the rail portion 230 by a screw 240. In addition, a plate 241 is fixed to the lower surface of the rail portion 230, and to the plate are secured first and second mirrors 242a, 242b for constructing a part of the optical system for positioning.

Figure 33A:
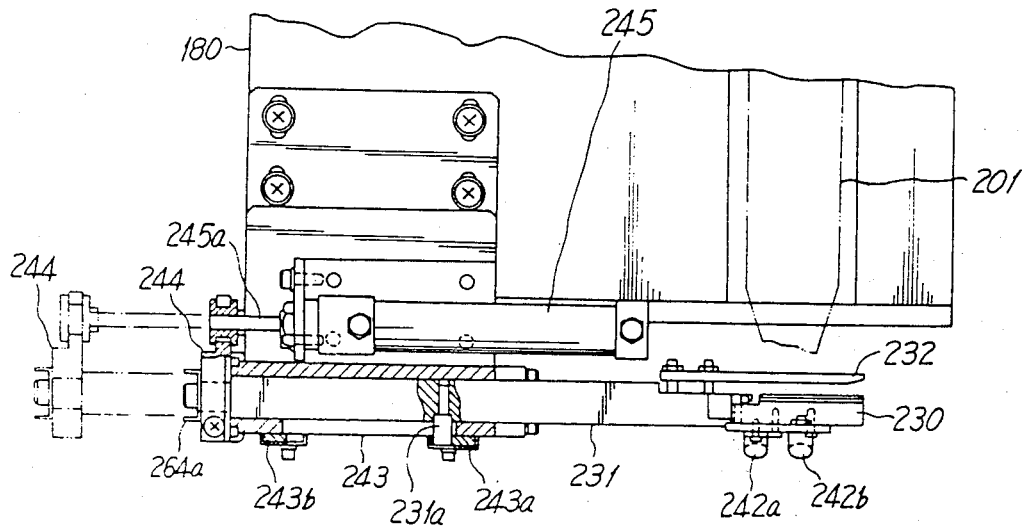
Figure 33B:
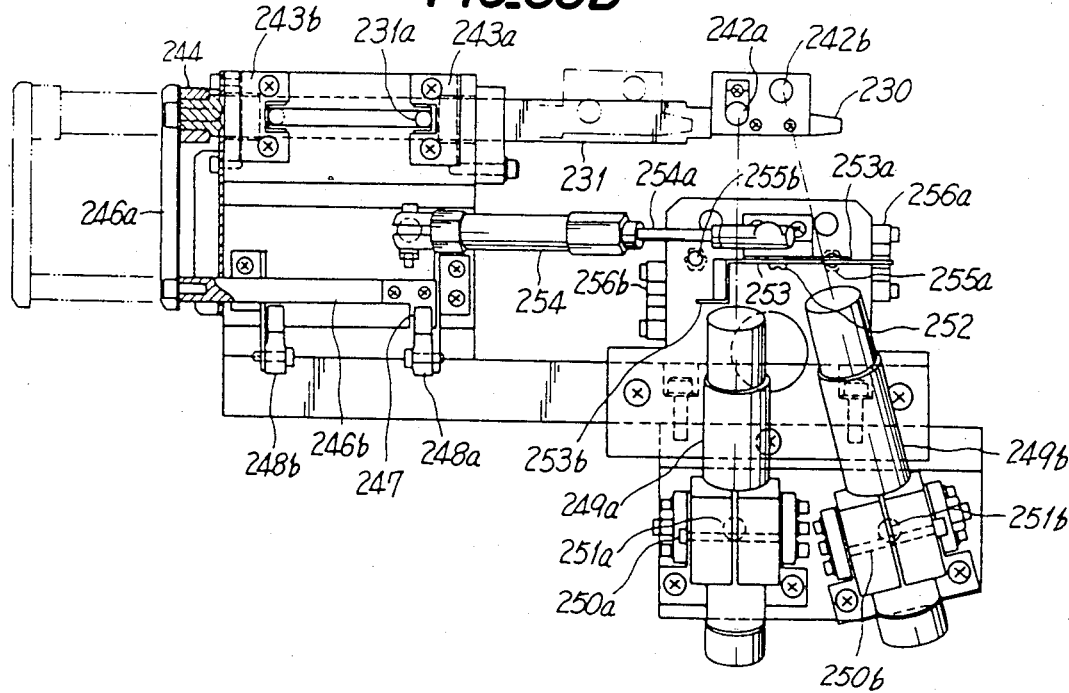
Figure 34:
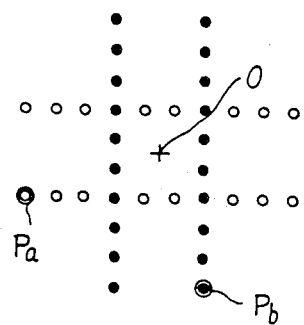
FIG. 34 shows the position of a reference hole of a circuit board in case of 0° insertion and 90° insertion.

FIG. 33 shows a mechanism for driving the above-described retraction stand. The shaft 231 connected to the rail portion 230 is slidably held by a bearing 243, and the other end of the shaft projects from the bearing and is connected to a connecting metal element 244 which is connected to a plunger 245a of an air cylinder 245. To the shaft 231 is fixed a stopper pin 231a, and in the bearing 243 are provided stoppers 243a, 243b for defining the stroke of the shaft 231. These bearing 243 and air cylinder 245 are secured to the base plate 180 common to the insertion head as clearly shown in FIG. 33C. A light shielding plate 247 is fixed to the left end of the shaft 231, which is slid from side to side by the air cylinder 245, through a lever 246a and an arm 246b, and in the moving path of the light shielding plate are arranged photoelectric sensors 248a, 248b. Further, as clearly shown in FIGS. 33B and 33D, first and second light projectors 249a, 249b are provided to rotate two-dimensionally about shafts 250a, 250b and 251a, 251b perpendicular to each other. The positions of the projectors are properly adjusted to make respective light fluxes incident upon the first and second mirrors 242a, 242b. The mirrors are arranged to reflect the light fluxes vertically downward. In front of these projectors 249a, 249b is provided a shutter 253 rotatable about a shaft 252, and to the shutter is pivoted a plunger 254a of an air cylinder 254 by a pin 255. In the shutter 253 are integrally formed light shielding portions 253a, 253b which are detected by photoelectric sensors 256a, 256b, while these light shielding portions are positioned by contacting with stopper pins 255a, 255b. The reason why these two optical systems are provided is because the position of a positioning pin insertion hole is changed by rotation of the insertion head 201. That is, as shown in FIG. 34, in the case of inserting at the angle of 0° shown in the horizontal direction and in the case of inserting at an angle of 90° shown by the perpendicular direction, the positioning hole positions Pa, Pb for inserting the first front pin of an IC, situating on the left side of the IC viewed in the IC traveling direction, are rotated about the rotary center 0 of the insertion head, so that the first and second mirrors 242a and 242b are displaced so as to correspond to these positions Pa, Pb. In case of inserting at the angle of 0°, therefore, a light beam emitted from the projector 249a is made incident upon the first mirror 242a, and a light beam emitted from the other projector 249b is shielded by the shutter 253.

Clinch Stand Mechanism

Figure 35A:
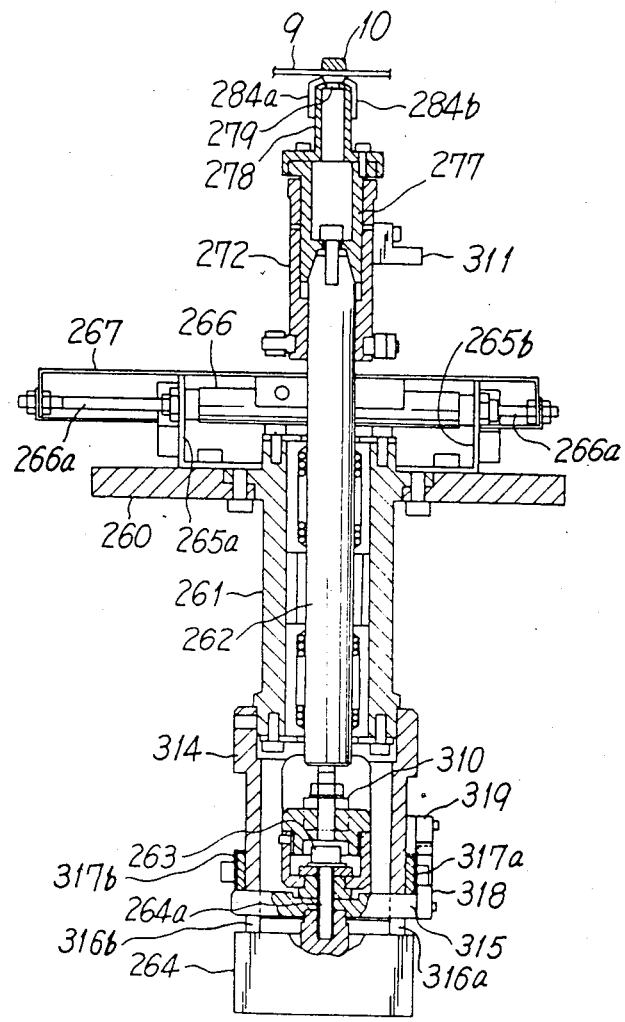
Figure 35B:
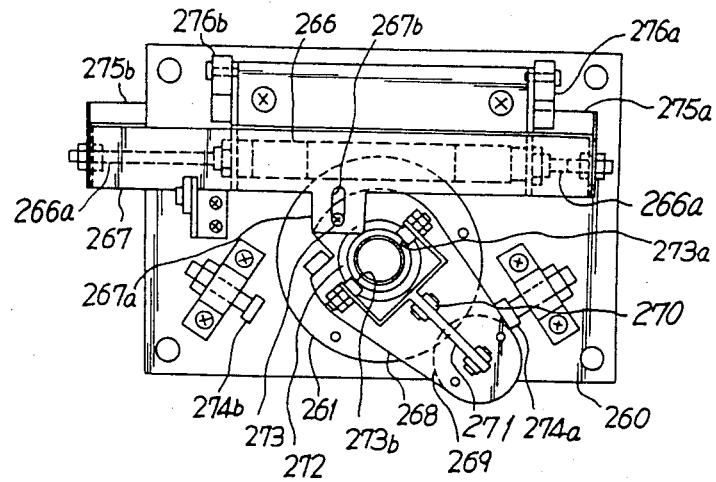
Figure 35C:
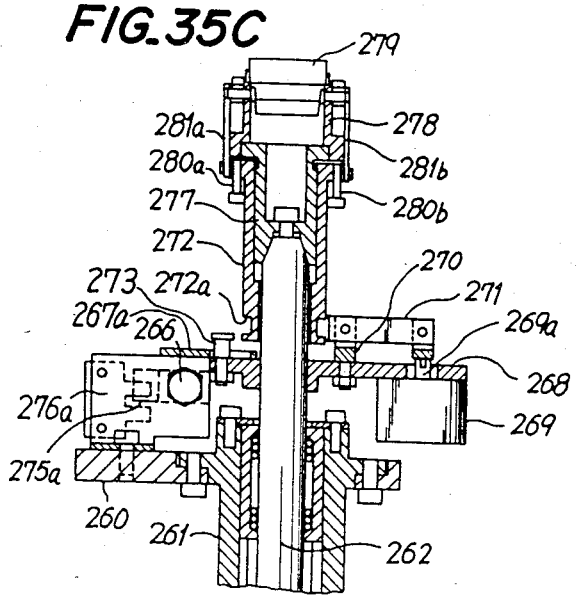
Figure 35D:
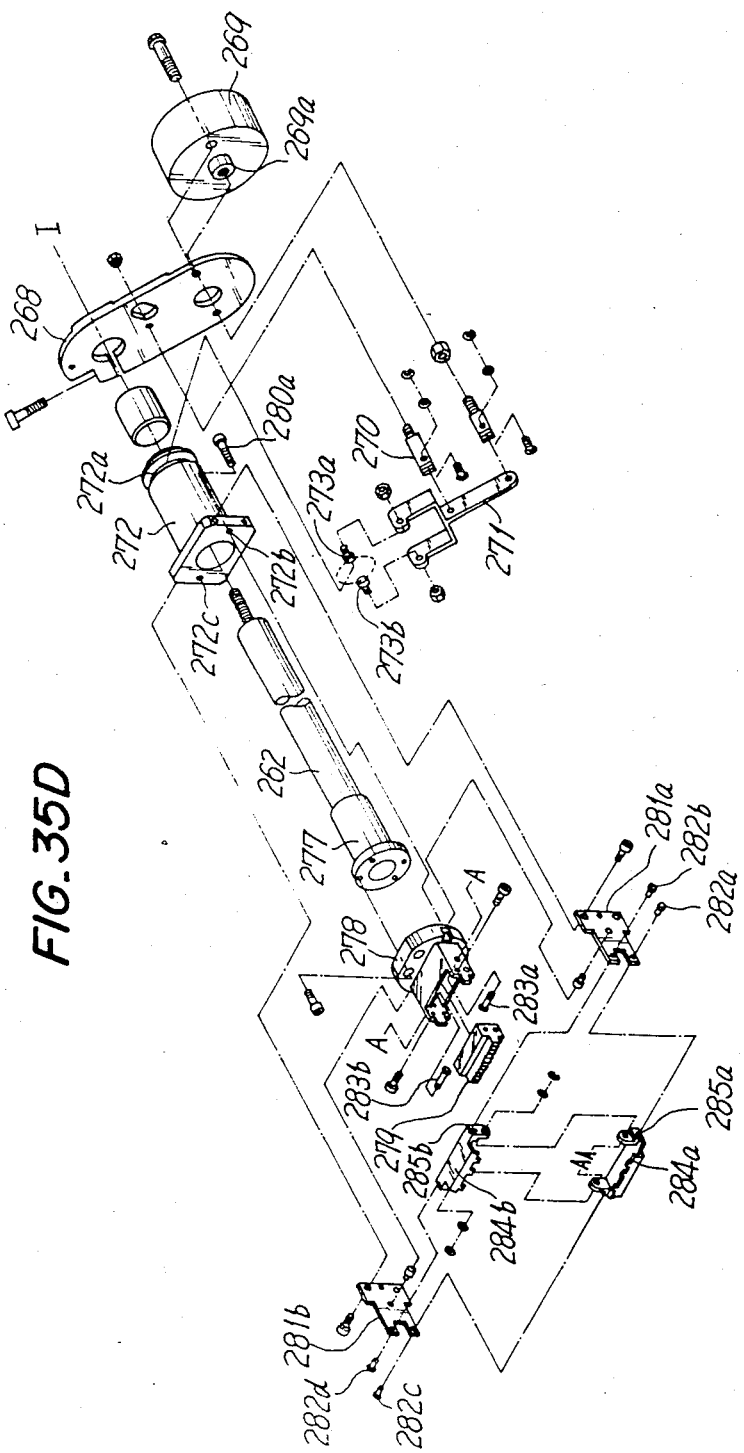

A clinch stand mechanism for inserting the IC 10 into the printed circuit board 9 by cooperating with the above-described insertion head 201 will be explained hereinafter. the mechanism has the functions of contacting a clinch stand to the lower surface of the printed circuit board 9, of supporting a detector head comprising four fibers for receiving the light beam emitted from one of the above-described projectors, of detecting whether the IC pins are correctly inserted into the printed circuit board, and of slightly bending several pins of IC inward. As shown in FIGS. 35A to 35F, a bearing 261 is fixed to a base plate 260, and a shaft 262 is vertically and rotatably supported by the bearing 261. It should be noted that FIGS. 35D to 35F are exploded perspective views showing the clinch stand. As clearly shown in FIGS. 35D to 35F, to the lower end of the bearing 261 is connected a substantially cylindrical body 314 to which is secured an air cylinder 264. A plunger 264a of the cylinder 264 and the lower end of the shaft 262 are coupled with each other by means of a floating joint 263 within the cylindrical body 314. Then the shaft 262 is moved vertically by actuating the air cylinder 264. To the input side of the floating joint 263 is secured a rod 315 which serves to inhibit the rotation. To this end, the rod 315 is inserted into guide recesses 316a, 316b formed in the cylindrical body 314. Further, in order to limit the vertical displacement of the shaft 262, a pair of stoppers 317a, 317b are secured to the cylindrical body 314 in such a manner that they are made in contact with the rod 315. A light shielding plate 318 is secured to the rod 315 and a photoelectric sensor 319 is provided on the cylindrical body 314 at such a position that the light shielding plate 138 may be inserted into the sensor 319 when the shaft 262 is moved upward.

To the base plate 260 is further fixed an air cylinder 266 through arms 265a, 265b and both ends of a plunger 266a of the air cylinder project from the ends of the cylinder and are fixed to the ends of a lever 267. As shown in FIGS. 35B and 35E, in the lever 267 there is formed a projection 267a in which an elongated hole 267b is formed. To the shaft 262 is further fixed a plate 268 as shown in FIGS. 35B, 35C and 35D, where an air cylinder 269 is fixed. A lever 271 is rotatably supported by a post 270 which is secured to the plate 268, and the end of the lever is connected to a plunger 269a of the air cylinder 269, and the other end thereof is inserted in a ring-like groove 272a formed in a sleeve 272 concentrically fixed to the shaft 262 by means of pins 273a, 273b. The sleeve 272 is vertically moved together with the shaft 262 by the air cylinder 264 and can be also slid in the axial direction with respect to the shaft 262. As shown in FIGS. 35B and 35E, the plate 268 is provided with a pin 273, and the pin is inserted into the elongated hole 267b formed in the projection 267a of the lever 267. Hence, the plate 268 and the shaft 262 can be rotated by driving the air cylinder 266. In order to limit the rotation to 90°, to the base plate 260 are fixed stoppers 274a, 274b which are positioned to come into contact with the plate 268. In addition, in order to detect the rotation, on both ends of the lever 267 are secured light shielding plates 275a, 275b, and photoelectric sensors 276a, 276b are arranged in running path of these plates.

Figure 36C:
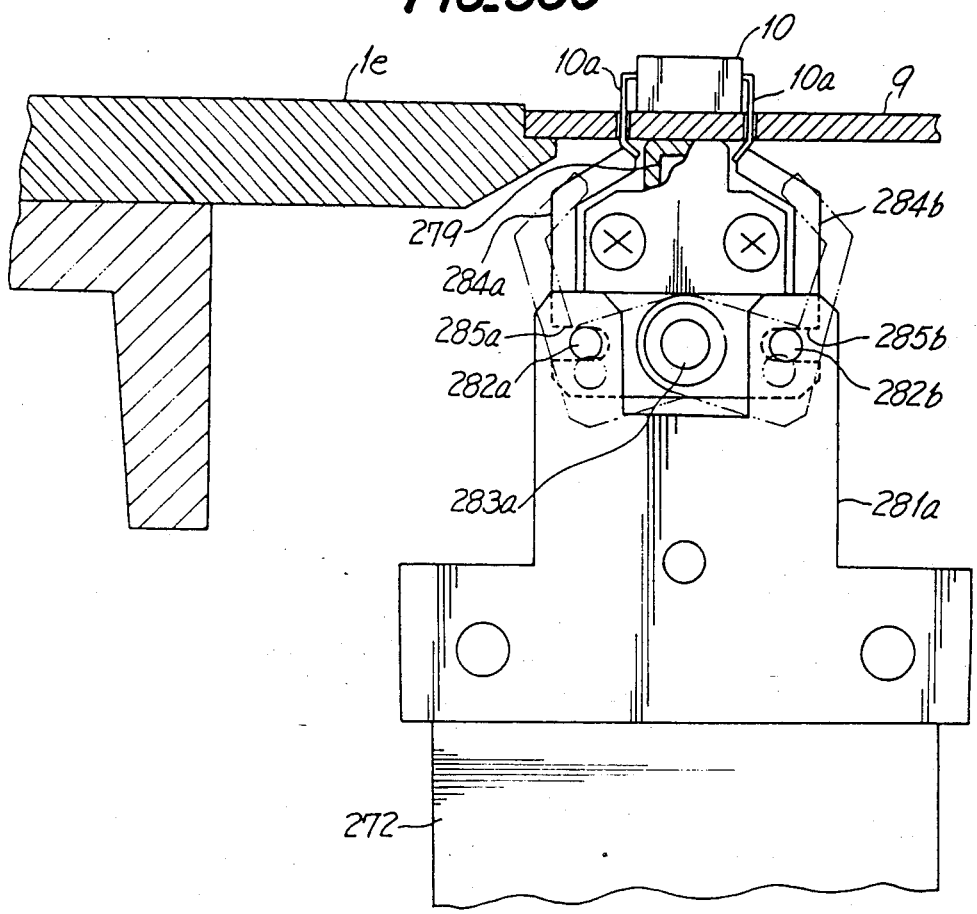

At the upper end of the shaft 262 is fixed a sleeve 277 having a flange at the upper end by means of screws, a block 278 is fixed to the flange of the sleeve, and a clinch stand 279 is fixed to the block. The construction of this portion is shown in FIGS. 36A to 36C in enlarged scale. At the lower end of the block 278 are provided guide pins 280a, 280b, and these pins are passed through holes 272b, 272c bored in the sleeve 272. At the upper end of the sleeve 272 are fixed plates 281a, 281b on both sides, and to the plates are fixed a pair of pins 282a, 282b, 282c, 282d, respectively, as shown in FIGS. 35D, 36B and 37A. On the block 278 are further rotatably pivoted claws 284a, 284b by means of shafts 283a, 283b. As shown in FIG. 37B, at the ends of the claws 284a, 284b are provided three projections, respectively, whereby six pins 210a of the IC 10 are selectively bent inward. Therefore, on both side walls of the claws 284a, 284b are formed groove-like recesses (two recesses 285a, 285b in FIG. 36C and one recess 285 in FIG. 37A) to which are fixed pins 282a to 282d, respectively. That is, when the air cylinder 269 shown in FIG. 35C is driven, the lever 271 is rotated and the sleeve 272 is lowered. Then the pins 282a to 282d are also lowered and the claws 284a, 284b are rotated as shown by arrows in FIG. 37A. In this condition, the pins 10a of the IC 10 are inserted into the holes of the printed circuit board 9. Then the air cylinder 269 is driven to raise the sleeve 272 and the claws 284a, 284b are further rotated so as to bend the six IC pins and to prevent the IC from slipping off the printed circuit board. It should be noted that all the pins may be bent, but if so, the IC might be easily slippable from the printed circuit board, so that it is preferable to bend several pins only.

Lead Wire Insertion Detection Mechanism

In the present embodiment, there is provided a mechanism for detecting whether the IC pins are correctly inserted into the holes of the printed circuit board. That is, as shown in FIG. 36A, on each side surface of the clinch stand 279 are embedded entrance ends 286a to 286j and exiting ends 287a to 287j of optical fibers. All the exiting ends are optically coupled with a light source 290 through an optical fiber bundle 289 as shown in FIG. 38A, and the entrance ends are optically coupled with respective light receiving elements of a light receiving device 292 through an optical fiber bundle 291. Light beams from the light source 290 are emitted from the exiting ends 286a to 286j through the optical fiber bundle 289 and are made incident upon the pins 10a of the IC 10. When the pins are correctly inserted, the light beams reflected by the pins impinge upon the entrance ends 287a to 287j and are received by twenty light receiving elements of the light receiving device 292 through the fiber bundle 291. Hence, it is possible to detect whether the pin is correctly inserted by detecting output signals of these light receiving elements. For example, if at least one pin is not correctly inserted, it is possible to put a mark on the IC with color paint for example. Even in this case, however, the claws 284a, 284b are driven to bend the IC pins. This is for preventing the IC from slipping off the printed circuit board, and after putting such mark, the IC is checked and the IC pin is correctly inserted, or a new IC is inserted.

Positioning Mechanism

It is necessary to correctly position the printed circuit board on the XY table with respect to the insertion head, but this positioning is carried out on the basis of the reference hole Pa or Pb corresponding to the first pin as described above with reference to FIG. 34. For example, in case of inserting at the angle of 0°, a light beam from the projector 294a is shined upon the first mirror 242 and the reflected light beam shines upon the reference hole Pa. the light beam transmitted through the hole Pa is received by the entrance ends 293a to 293d of four optical fibers embedded in the upper surface of the clinch stand 279. The center of the entrance ends is made coincident with the center of the reference hole Pa into which the first pin of the IC is to be inserted.

Figure 39:
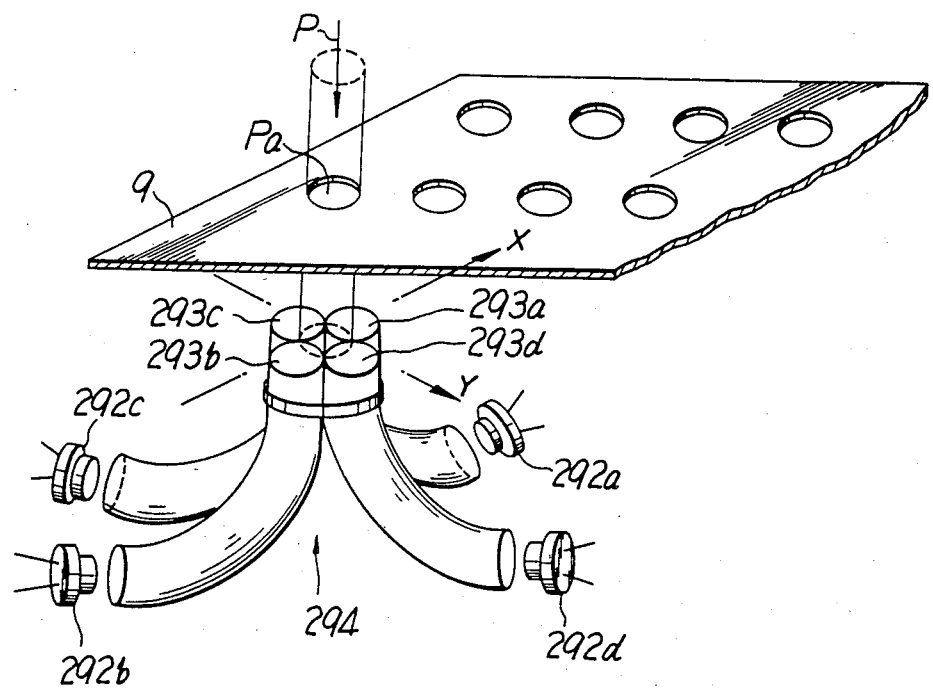
FIG. 39 shows an optical system of a positioning mechanism.

FIG. 39 is a perspective view showing the construction of the position detecting device, wherein a parallel ray is directed through the reference hole Pa bored in the printed circuit board 9 and is received by the four entrance ends 293a to 293d. These entrance ends 293a to 293d are aligned in the X and Y directions of the XY table. The light beams received by these entrance ends are guided to four light receiving elements 292a to 292d of the light receiving device 292 (twenty four light receiving elements as a whole are provided in the light receiving device 292). Therefore, these light receiving elements produce electric signals in proportion to the amounts of incident light impinging upon respective entrance ends 293a to 293d.

Figure 40:
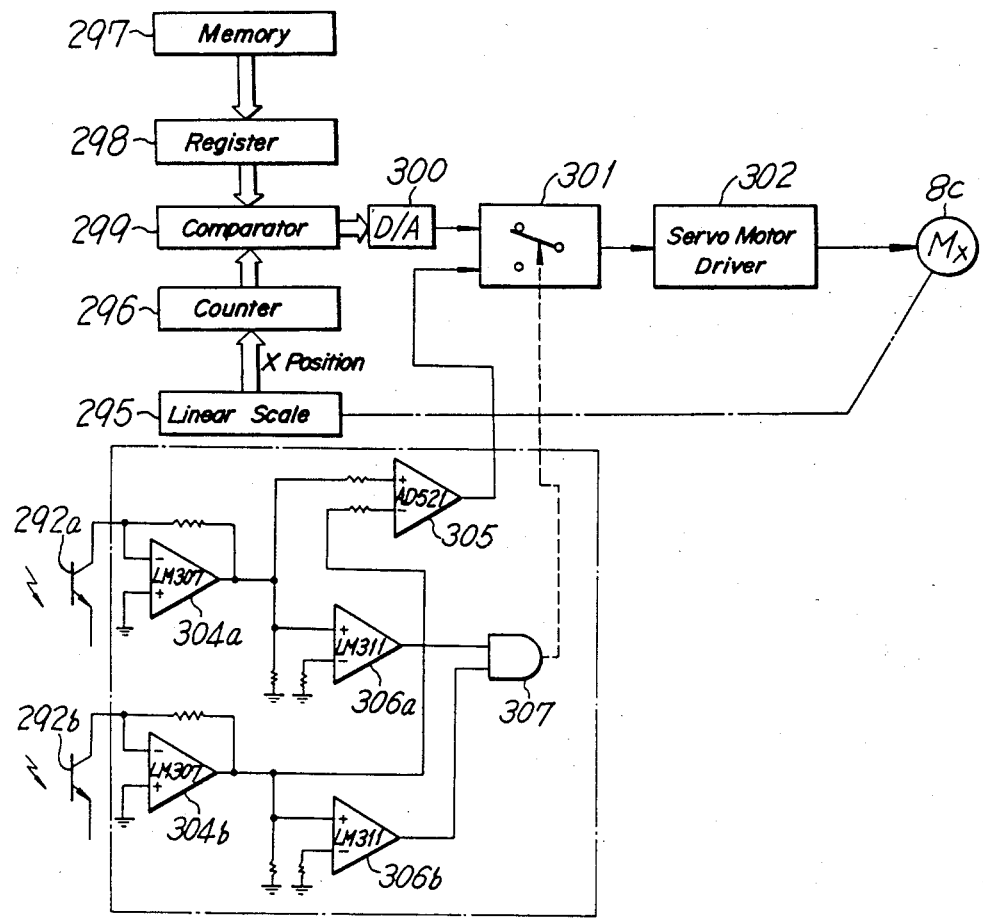
FIG. 40 is a circuit diagram of the positioning mechanism.

FIG. 40 shows one embodiment of a control circuit for aligning the reference hole Pa of the printed circuit board 9 with the insertion axial line by driving the XY table after processing the output signals of the above-described light receiving elements 292a to 292d. The position detecting circuit in the X direction and that in the Y direction are entirely the same in construction and action, so that the circuit in the X-direction is only shown. A moving amount of the XY table in the X-direction is detected by a linear scale 295 and positional information in the X direction is detected by a counter 296. On the other hand, in the copy mode operation, positional information regarding the holes Pa of the printed circuit board 9 has been previously stored and in the actual inserting operation the stored positional signals are read from a memory 297 and supplied to a comparator 299 through a register 298 as a standard value. To the comparator 299 is also supplied a present position signal in the X direction from the counter 296. These signals are compared with each other to produce a difference which is converted into an analog signal by a D/A converter 300. The converted signal is supplied to a servo motor driving circuit 302 in the X direction through an analog switch 301 to drive a servo motor 8c to driving the table in the X direction. In this manner, the table is automatically moved toward the standard value stored in the memory 297. When the information regarding the present position matches the information regarding the standard position, the output of the comparator 299 becomes zero, and no output signal is supplied from the D/A converter 300 to the servo-motor driver 302. If the printed circuit board 9 is ideal and is correctly positioned on the XY table, the reference hole Pa of the printed circuit board 9 will be completely aligned with the insertion axis P of the insertion head. But in practice, the printed circuit board 9 may have a manufacturing error or the position of the printed circuit board on the table may be slightly varied, so that the center of the hole Pa is never completely aligned with the insertion axis P and thus, a comparatively large deviation is generated in general, and the proper insertion ratio is actually lowered.

The position detecting device of the present embodiment is provided to eliminate a gap which might be still produced when the positional information previously stored by copying coincides with the present positional information. To this end, outputs of light receiving elements 292a and 292b arranged in the X direction are amplified by operational amplifiers 304a and 304b and amplified signals are supplied to a differential amplifier 305 and also supplied to comparators 306a and 306b. The outputs of these comparators are supplied to an AND gate 307 and the analog switch 301 is driven by the output of the AND gate 307. When the output from the AND gate 307 is at a logical high level, the output of the differential amplifier 305 is supplied to the servo motor driving circuit 302 through the analog switch 301. Now, if the center of the beam of parallel light projected along the insertion axis P deviates from the center of the hole Pa of the printed circuit board 9 in the X direction, but a part of the light flux is transmitted through the hole Pa, both the light receiving elements 292a and 292b receive the light, so that the output of the AND gate 307 becomes logically high, and the analog switch 301 is switched to the position opposite to the position shown in FIG. 40. In this case, the outputs of both the light-receiving elements 292a and 292b are different from each other, so that a signal having a polarity in response to the direction of the gap between the light flux and the hole Pa and an amplitude in proportion to the gap amount is supplied to the servo motor driving circuit 301 from the differential amplifier 305 through the analog switch 301. Then the table is driven to move the center of the hole Pa into the insertion axis P. When the center of the hole Pa coincides with the insertion axis P of the center of the parallel flux, the outputs of the light-receiving elements 292a and 292b become equal, so that the output of the differential amplifier 305 disappears. Then the X direction driving motor 8c stops and the table also stops. According to such a position detecting device, when the centers of the insertion axis P and of the hole Pa deviate from each other by more than 50 $\mu$m for instance, it is possible to adjust the gap between the centers of the insertion axis P and the hole Pa to less than 20 $\mu$m by slightly moving the table.

Figure 41:
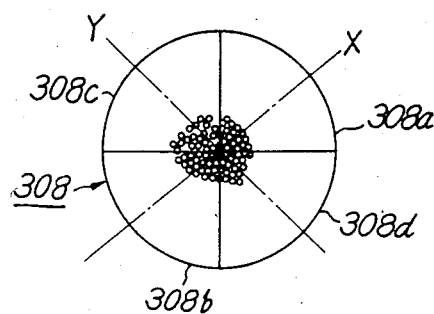
FIG. 41 shows another embodiment of the detection head of the positioning mechanism.

FIG. 41 shows a modification of the light receiving head of the position detecting device. In the present embodiment, one end of a fiber bundle 308 is arranged in circle and divided into four sector-shaped portions 308a to 308d along the line inclined by 45° with respect to the X and Y directions. The other ends of the fiber bundle portions are opposed to the four light receiving elements.

As described above, in the present invention, before inserting the IC pins into the holes formed in the printed circuit board, the pins are corrected and cut, while the holes of the printed circuit board are positioned with high precision, so that there is no trouble in mounting the printed circuit board on the XY table (that is, the prior device has encountered such trouble in that a pair of positioning holes are bored in the printed circuit board and pins provided in the XY table are inserted into the holes for positioning). According to the invention, the printed circuit board can be simply arranged on the XY table merely by aligning one side of the printed circuit board to one side of the XY table, so that the mounting operation can be made remarkably simple and furthermore the printed circuit board may be automatically detachable with respect to the XY table, if any.

Figure 38B:
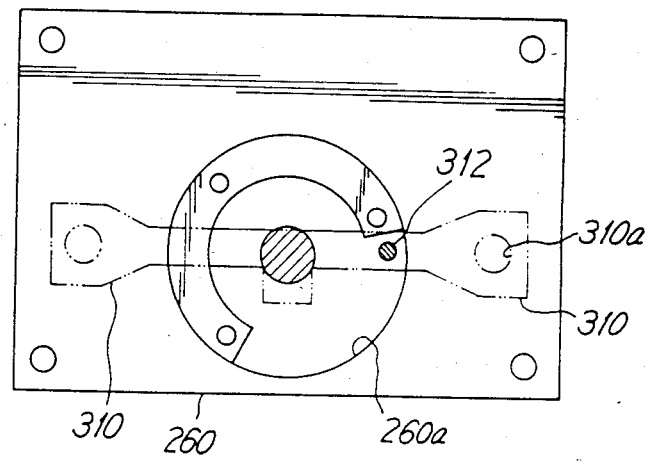

FIGS. 38A and 38B show the mounting of the above-described optical fiber bundles 289, 291 and 294. The upper ends of these fiber bundles are secured to the vertically rotatable block 278 and their lower ends are secured also to a vertically movable and rotatable member, so as to prevent the fiber bundles from being damaged by application of excessive stress. A circular hole 260a is bored in the base plate 260 at a portion for mounting the bearing 261. To the output shaft of the floating joint 263 is fixed a plate 310 which both ends are enlarged, and this plate and a block 311 fixed to the sleeve 272 are connected to each other by a rod 312 which is passed through the above-described circular hole 260. The optical fiber bundles 289, 291, 294 extend along the rod 312. These fiber bundles are further passed through a hole 310a bored in the plate 310. The plate 310 is vertically movable and rotatable. To the plate 310 is fixed a substantially V-shaped frame 313, and to the frame are fixed both an entrance end 289a of the fiber bundle 289 and the light receiving device 292. As a result, both ends of the optical fiber bundles 289, 291, 294 are vertically moved and rotated, and no excessive force is applied to the fiber bundles.

Now the inserting operation of the insertion portion will be explained with reference to FIG. 31 and time charts shown in FIGS. 42A to 42T. As shown in FIGS. 42A and 42B, a solenoid of the preceding gate mechanism 6i (see FIG. 2) is energized to release the retained IC, and the IC is sent to the insertion portion by injecting the accelerating air flow. The IC is thus placed on the movable rail portion 230 of the insertion retract portion. As soon as the IC is detected as shown in FIG. 42C, the accelerating air is injected as shown in FIG. 42D and the front pins of the IC are urged against pressure to the stoppers 235a, 235b. The IC having been received in this manner, the second piston 205 is pressed down and the chucks 209a, 209b are opened widely on both sides. This condition is shown in FIG. 31A.

Next, at the time $t_1$, the second piston 205 is raised to close the chucks 209a, 209b. Then, the pins of the IC are gripped by the claws 211a, 211b. FIG. 31B shows this condition. In this condition, the first piston 203 is driven for a short time as shown in FIG. 42F and the pusher 207 is slightly lowered. Whereby, the IC is correctly gripped by the claws 211a, 211b. FIGS. 42G and 42H show the XY table coarse adjusting and fine adjusting periods. The XY table is driven as described above, and the center of the hole Pa in case of inserting at 0° or the hole Pb in case of inserting at 90° is aligned with the insertion axis P. This operation is completed before the time $t_1$. The 0° insertion or the 90° insertion has been previously stored in the memory during the copy mode. At the time of the actual insertion mode, the information is read out, thereby driving the air cylinder 254 (FIG. 33) to move the shutter 253 to open a desired light path in the primary condition of the insertion cycle as shown in FIG. 42I. The 90° insertion is now assumed.

As shown in FIG. 42J next, the air cylinder 245 is driven at the time $t_2$, and the rail 230 on the retract stand is retracted. At the same time, as shown in FIG. 42K, the air cylinder 264 of the clinch mechanism is driven to raise the shaft 262, and the clinch head 279 is raised into contact with the lower surface of the printed circuit board 9. The above is detected as shown in FIG. 42L. Then, as shown in FIG. 42M, the air cylinder 197 (FIG. 24) is driven at the time $t_3$, and the insertion head 201 is rotated by 90°. Since, the entrance ends 293a to 293d are secured to the clinch head 279, it is necessary to rotate the insertion head by 90° before the fine adjusting period shown in FIG. 42H. That is, as shown in FIG. 42N, the clinch head has been rotated by driving the air cylinder 266 (FIG. 35). At the time $t_4$ during rotation of the insertion head 201, the air cylinder 181 (FIG. 24) is driven and the insertion head 201 is lowered as shown in FIG. 42O. The lowering of the insertion head is successively detected by the photoelectric sensors 218a, 218b, 218c as shown in FIGS. 42P, 42Q, 42R. During the lowering of the insertion head 201, the pins of the IC are inserted into the holes of the printed circuit board 9. At the time of detecting the lowering of the insertion head 201 to the lowest position by the photoelectric sensor 218c, the IC pins have been inserted and the inserted pins are detected as shown in FIG. 42S. When this detection confirms that all the IC pins are correctly inserted, the air cylinder 269 is driven at the time $t_5$ as shown in FIG. 42T to rotate the claws 284a, 284b, and several pins are bent. At the same time, the first piston 203 is again lowered as shown in FIG. 42F, and the pusher 207 is lowered. While the pusher 207 is lowered, the chucks 209a, 209b are stretched outward by the taper portions 207d to 207g of the pusher 207 as shown in FIGS. 31C and 31D at first to remove the claws 211a, 211b from the IC pins, and then the IC is further pushed by the pusher 207. Thus, the IC pins are deeply inserted into the holes of the printed circuit board and several pins can be bent inward. As understood from FIGS. 42O and 42R, the insertion head air cylinder 181 is driven at the time $t_5$ and the insertion head 201 starts to rise, so that the condition is as shown in FIG. 31D. The air cylinder 269 for rotating the claws 284a, 284b of the clinch stand is again driven to rotate the claws outward, while the air cylinder 264 for vertically moving the clinch head is driven to lower the clinch head.

The above action is successively repeated and to insert ICs successively sent to the insertion portion into predetermined positions of the printed circuit board.

XY Table

FIG. 43 shows an embodiment of the XY table 1e on which the printed circuit board 9 is placed. FIGS. 43A, 43B and 43C show a plan view, a front view and a side view, respectively, and FIGS. 43D and 43E show cross-sectional views taken along the lines I—I' and II—II' of FIG. 43A, respectively. The XY table 1e comprises a frame-like X table 401 and a Y table 402. The Y Table 402 is mounted on a pair of Y-axis guide rails 407, 408 provided on a fixed table 403 movably in the X-axis direction. The Y table 402 is coupled with a ball screw 8b rotatably supported by bearings 404, 405 through a female screw portion 406. The X table 401 is mounted on a pair of X-axis guide rails 412, 423 provided on the Y table 402 and is movable in the X-axis direction perpendicular to the Y-axis direction. The X table 401 is coupled with a ball screw 8a rotatably supported by bearings 409, 410 through a female screw portion 411.

An X-axis motor 8c is provided for driving the X table 401 in the X direction with respect to the Y table 402, and a pulley 414 is fixed to the output shaft of the X-axis motor 8c. Further, a pulley 415 is fixed to one end portion of the ball screw 8a and between the pulley 415 and the pulley 414 fixed to the output shaft of the X-axis motor 8c is wound an endless belt 416. When the ball screw 8a is rotated via the pulley 414, the endless belt 416 and the pulley 415 by driving the X-axis motor 8c, the X table 401 is moved in the X-axis direction. On the other hand, the Y-axis motor 8d for driving the Y table 402 in Y direction is secured to the fixed table 403, and by driving the Y-axis motor 8d the ball screw 8b is rotated via an endless belt 419 wound between a pulley 417 fixed to the output shaft of the Y-axis motor 8d and a pulley 418 fixed to one end portion of the ball screw 8b in the same manner as in the case of the above X-axis motor 8c, thereby moving the X table 401 in the Y-axis direction together with the Y table 402.

The X scale 8e and Y scale 8f for detecting the amount of movement of the XY table 1e in the X and Y directions are provided on the fixed table 403 and extend in the X and Y axis directions, and these X and Y scales 8e and 8f are optically detected by detection heads 421 and 422 respectively provided on the X table 401 and the Y table 402, thereby detecting X and Y moving amounts.

In the present embodiment, a clamp device is provided on the X table 401, and the printed circuit board 9 is detachably mounted on the XY table 1e by the clamp device.

Clamp Device

Figure 44C:
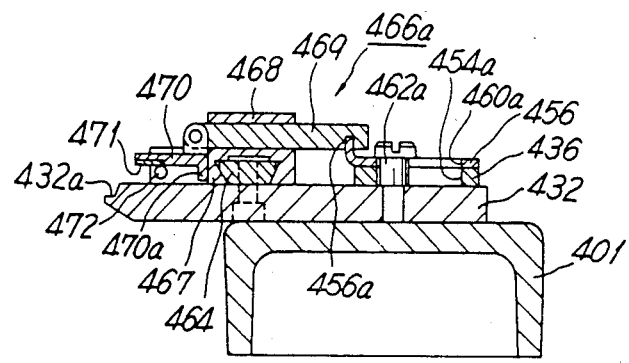
Figure 44D:
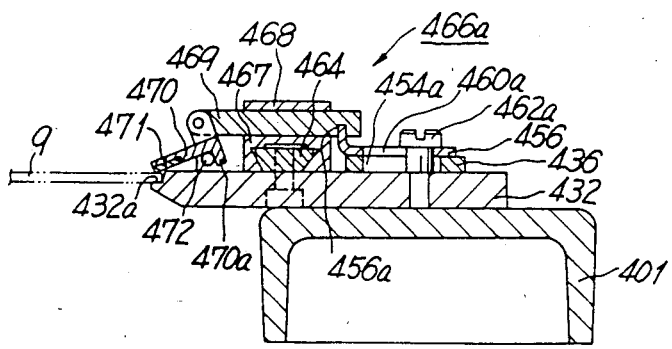

FIG. 44 shows an embodiment of the clamp device for detachably mounting the printed circuit board 9 on the XY table 1e, in which FIG. 44A is a plan view, FIG. 44B is a front view showing a cross section in part, and FIGS. 44C and 44D are enlarged cross-sectional views along the line I-I' of FIG. 44A. The clamp device 430 is provided on the frame-like X table 401 as described above and comprises clamp mounting plates 431, 432 fixed to a frame of the X table 401 opposing to the Y-axis direction and extending in the X-axis direction and beam guides 433, 434 fixed to a frame of the X table 401 opposing to the X-axis direction and extending in the Y-axis direction. At opposed end portions of the clamp mounting plates 431, 432 and opposed end portions of the beam guides 433, 434 are formed steps 431a, 432a and 433a, 434a for clamping the corresponding end portions of the printed circuit board 9.

The clamp mounting plates 431, 432 are provided with rods 435, 436 extended in the X-axis direction, respectively. The left end portions (in FIG. 44A) of these rods 435, 436 are pivoted on rotary end portions of links 439, 440, which in turn are pivotably mounted on the X table 401 via pins 437, 438, respectively, while the other end portions are pivoted on end portions of links 443, 444, which in turn are rotatably pivoted on the X table 401 via link pins 441, 442, respectively. The other end portions of the links 443, 444 are pivoted on plungers 449a, 450a of air cylinders 449, 450 rotatably pivoted on fittings 445, 446 fixed to the X table 401 and the beam guide 434, respectively, through pins 447, 448. The rods 435, 436 are rotated around the link pins 437, 441, 438, 442 through the links 439, 443, 440, 444 by driving the air cylinders 449, 450, so that the rods are moved in parallel with each other in the direction to come closer to each other. In addition, these rods 435, 436 are provided with a pair of pins 451a, 451b; 452a, 452b, respectively, and are formed with a pair of relief holes 453a, 453b; 454a, 454b. The rods 435, 436 are provided with driving plates 455, 456 extending in the X-axis direction. At opposed end portions of these driving plates 455, 456 are formed upright portions 455a, 456a extending in the X-axis direction and engaged with a pusher which will be explained later on. The driving plates 455, 456 are further formed with guide holes 457a, 457b, 458a, 458b, respectively, extending in the X-axis direction and being engaged with the pins 451a, 451b, 452a, 452b provided in the rods 435, 436, while the rods 435, 436 are formed with guide holes 459a, 459b, 460a, 460b extending in the Y-axis direction at the positions corresponding to the relief holes 453a, 453b; 454a, 454b formed in the rods 435, 436, respectively, and guide pins 461a, 461b; 462a, 462b are provided in the clamp mounting plates 431, 432 which are engaged with these guide holes 459a, 459b; 460a, 460b and relief holes 453a, 453b; 454a, 454b. As a result, the driving plates 455, 456 moves in the Y-axis direction drawing nearer to each other by the parallel movement of the rods 435, 436 upon driving the air cylinders 449, 450.

The clamp mounting plates 431, 432 are further provided with rails 463, 464 extending in the X-axis direction, respectively, and on these rails 463, 464 are slidably mounted two clamp members 465a, 465b; 466a, 466b, respectively. The clamp member 466a comprises a clamp body 467 sliding onto the rail 464 as shown in FIGS. 44C and 44D, and the pusher 469 is slidably provided on the clamp body 467 by guiding with a push plate 468. One end portion of the pusher 469 is engaged with the upright portion 456a of the driving plate 465 slidably in the X-axis direction, and the other end portion thereof is rotatably pivoted on a clamper 470 for holding the printed circuit board 9. The portion of the clamper 470 for holding the printed circuit board 9 is provided with an elastic member 471 such as polyurethane rubber or the like. The clamp body 467 is further provided with a pin 472 engaged with the clamper 470. In the present embodiment, when the air cylinder 450 is deenergized, the clamper 470 retreats from the step 432a of the clamp mounting plate 432 as shown in FIG. 44C, and when the air cylinder 450 is energized, together with the movement of the pusher 469 in the Y-axis direction through the driving plate 456 as shown in FIG. 44D, the clamper 470 is moved in the Y-axis direction and its end portion is rotated downward by means of the pin 472, so that the pin 472 is engaged with a projection 470a provided at the rear end portion of the clamper 470, thereby holding the end portion of the printed circuit board 9 placed on the step 432a of the clamp mounting plate 432 with pressure through the elastic member 471. In addition, the clamp members 465a, 465b and 466b are constructed in the same manner as the clamp member 466a. The pushers 473, 474 of the clamp members 465a, 465b are engaged with the upright portion 455a of the driving plate 455, and the pusher 475 of the clamp member 466b is engaged with the upright portion 456a of the driving member 456.

As described above, in the clamp device of the present embodiment, the air cylinders 449, 450 are in the deenergized condition, the clampers of the clamp members 465a, 465b, 466a, 466b are retreated from the steps 431a, 432a of the clamp mounting plates 431, 432, respectively, so that in case of mounting the printed circuit board 9, the clampers are no hindrance, and the printed circuit board 9 can easily be mounted on each step 431a, 432a, 433a, 434a of the beam guides 433, 434 and the clamp mounting plates 431, 432. Accordingly, the printed circuit board can automatically be inserted into or released from the XY table 1e simply and positively by an autoloader or autounloader of the printed circuit board, and as a result, an insertion efficiency is further improved.

Operation Console

Figure 45:
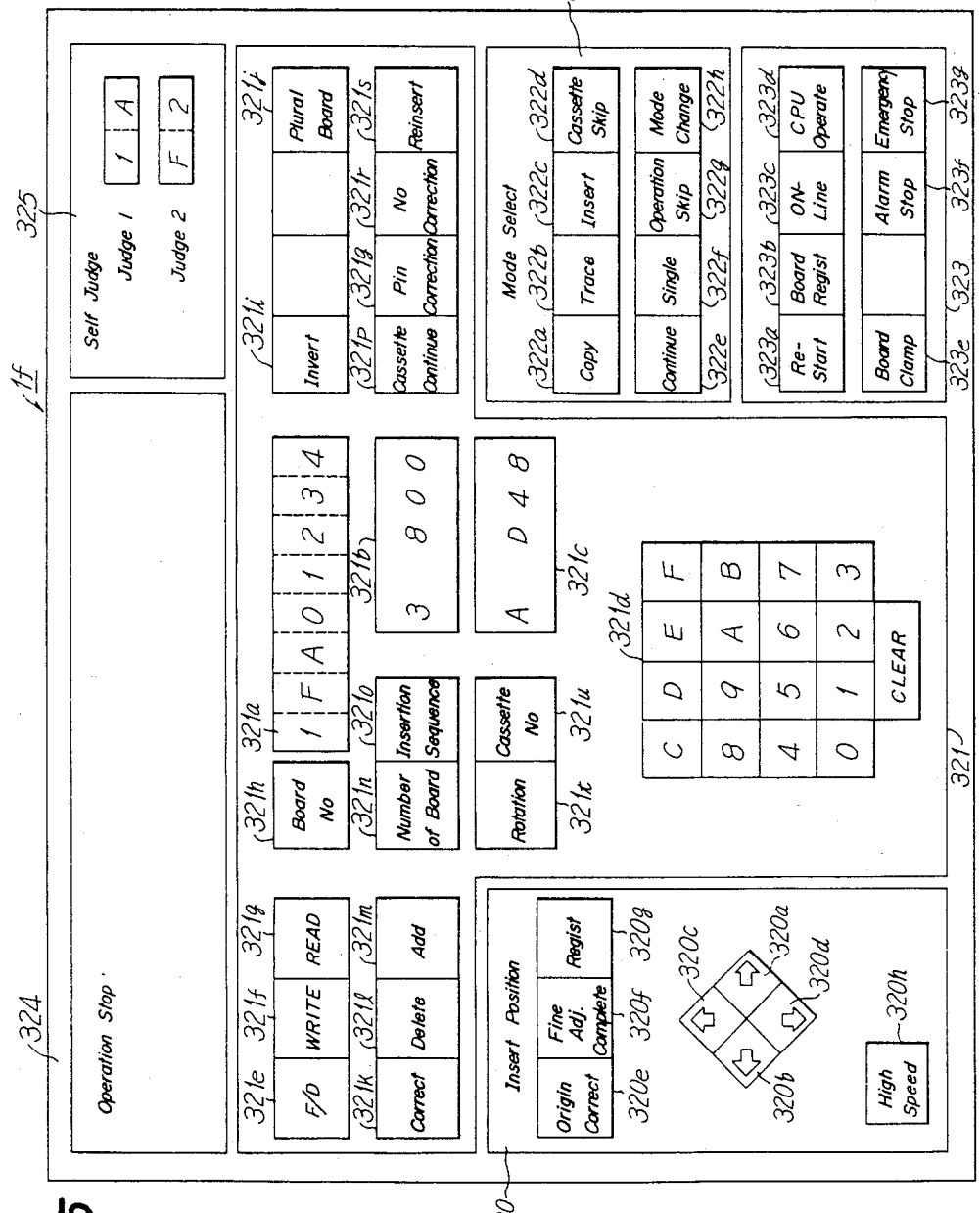
FIG. 45 is a plan view showing the construction of an operation console board.

FIG. 45 shows an embodiment of the operation console 1f (FIG. 2). The console comprises an XY table position setting portion 420, a data displaying and setting portion 321, a mode selecting portion 322, an operation control portion 323, an operation sequence display portion 324 and a self judging portion 325. Functions of these portions will be next explained.

In the data displaying and setting portion 321 there are provided the following operation members:
- printed circuit board number display unit 321a,
- the number of printed circuit boards display unit 321b,
- IC cassette number display unit 321c,
- data keys 321d,
- FD button 321e, which is actuated when writing-in or reading-out is effected for a floppy disc memory,
- write-in button 321f for actuation upon effecting data writing-in into floppy disc,
- read-out button 321g actuated upon effecting data reading-out flopping disc,
- circuit board number button 321h for registering the circuit board number,
- inversion button 321i for effecting a 180° rotation of an IC by the polarity inversion mechanism,
- multiple circuit board button 321j for effecting insertion data writing-in successively for a plurality of circuit boards,
- correction button 321k for correcting data in a trace mode,
- data cut button 321l for cutting data when the XY table is stopped due to positional error during continuous tracing operation in the trace mode,
- increment button 321m for increasing data at a position in which the XY table is moved by operating table moving keys during the trace mode,
- the number of circuit board button 321n for presetting the number of boards, up to 999, which are to be automatically supplied to the XY table by means of an autoloader,
- insertion sequence button 321o for moving the XY table into a given position denoted by data to be corrected, added and cut in the trace mode,
- cassette continuous button 321p for denoting a cassette array containing the same kind of IC in the copy mode,
- pin correction button 321q for effecting only the pin correction for a denoted cassette array,
- no correction and cut button 321r for inhibiting both correction and cut for a denoted cassette array,
- re-insertion button 321s for denoting re-start data follow afer an inserting operation for data which was processed as re-start data due to incorrect insertion or insertion impossible during the copy mode,
- rotation button 321t for denoting the insertion angle (in the case of 0° "A" is displaced on the display unit 321c and in the case of 90° "B" is displayed), and
- cassette number button 321u for denoting a cassette number containing ICs to be inserted. The operation and functions will be further explained later.

The table position setting portion 320 comprises the following members:
- table driving keys 320a to 320d for moving manually the XY table in the X and Y directions,
- origin correction button 320e for manually moving the XY table when the origin deviates out of a finely adjustable range due to circuit board dimension error and a board deviation with respect to the XY table,
- fine adjustment completion display lamp 320f for indication completion of fine adjustment,
- registration button 320g for registering various kinds of data into memory, and
- high speed key 320h for feeding the XY table at high speed.

The mode selection portion 322 comprises the following members:
- copy button 322a for selecting the copy mode,
- trace button 322b for confirming data registered during the copy mode,
- insertion button 322c for inserting ICs in accordance with registered data,
- cassette skip button 322d for skipping inserting operations for a given IC when the relevant ICs have been all used,
- continuation button 322d for inserting ICs continuously,
- single button 322f for inserting only one IC,
- operation skip button 322g for moving the XY table to the next position when IC insertion at the relevant position is impossible due to an operation stop caused by an incorrect inserting position during the trace mode or a feed stop due to lack of ICs during the insertion mode, and
- mode change button 322h for exchanging the copy trace and insert modes with each other.

The operation control portion 323 includes the following members:
- re-start button 323a for re-starting inserting operation after an error has been corrected,
- circuit board reverse button 323b for reversing a maximum of fifteen different kinds of circuit boards in case of using an autoloader,
- on-line button 323c for transmitting data with respect to higher grade computer,
- CPU on lamp 323d for displaying the operation of the CPU,
- clamp button 323e for clamping or removing a circuit board from the XY table,
- alarm stop button 323f for stopping an alarm which is produced when a cassette is absent, data is limited, etc., and
- emergency stop button 323g for cutting the electric power supply and main air in an emergency such as air absence, power supply fuse is blown, motor trouble, XY table excursion, CPU excursion, etc.

The operation step display portion 324 displays necessary steps and thus, the operator can easily handle various members without fail. The self-juding portion 325 displays a code (number and code) of a portion which is out of order. Therefore, the operator can easily know which portion is out of order.

Figure 46:
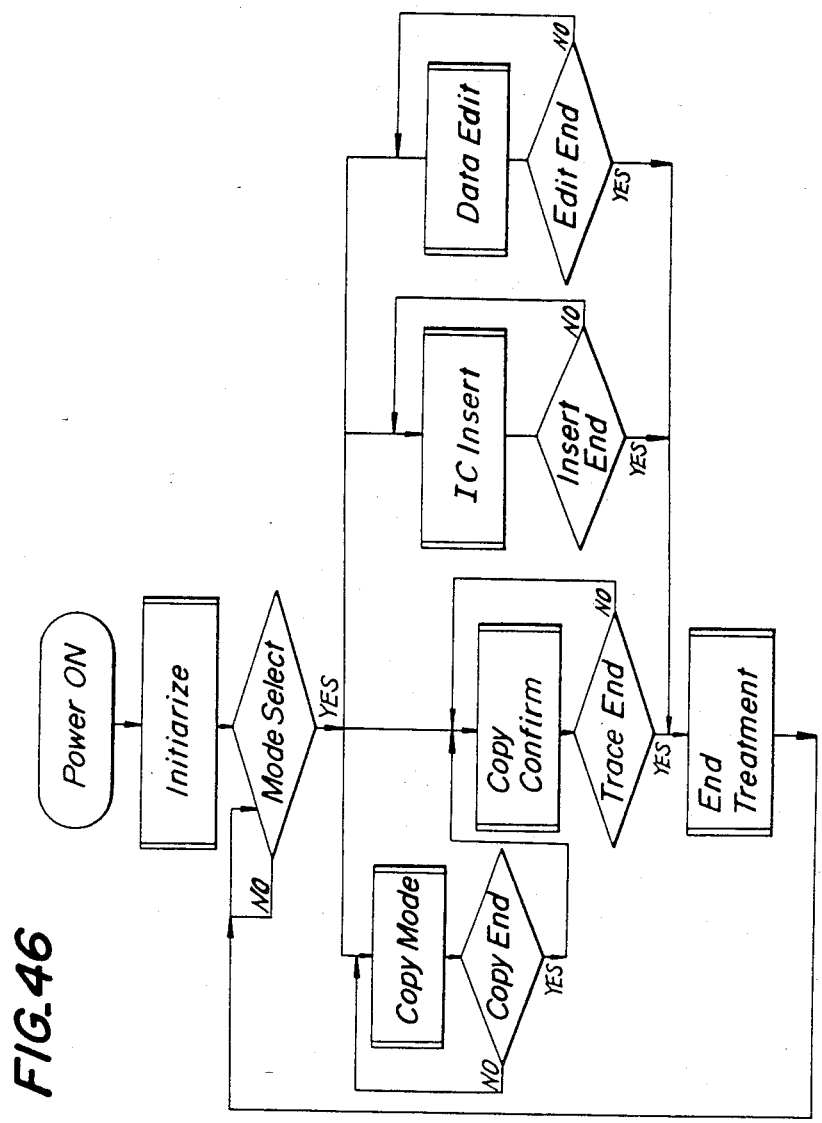
FIG. 46 is a flow chart explaining an inserting action.

FIG. 46 is a flow chart showing the general operation of the automatic insertor according to the invention. After switching on the power switch and effecting an initial treatment, the mode selecting portion 322 is operated. At first, the copy button 322a is actuated.

Figure 47:
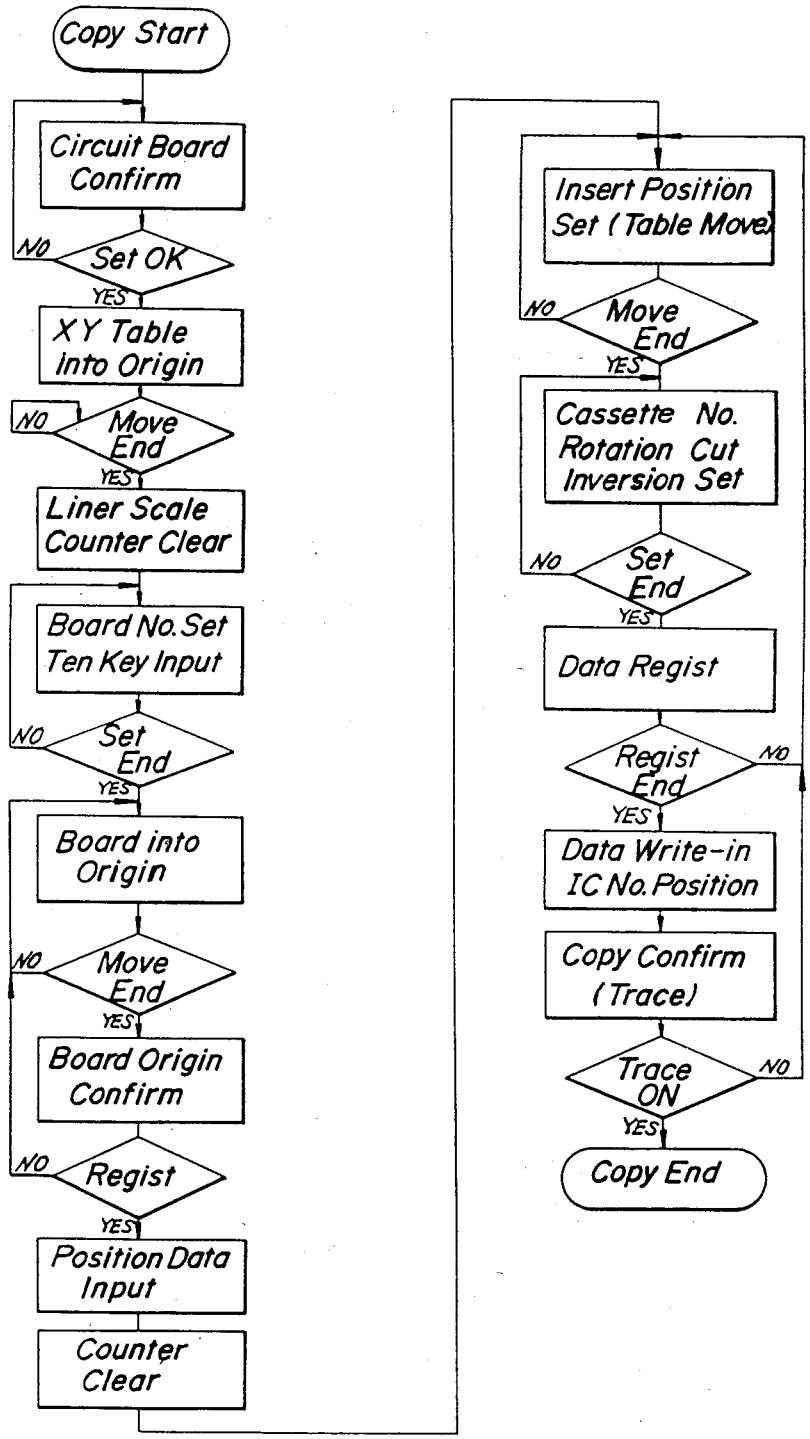
FIG. 47 is a flow chart of the copying mode action.

FIG. 47 illustrates a flow chart of the copy mode operation, which will be briefly explained. After confirming that the printed circuit board has been mounted on the XY table, the table is returned to the origin and counters for counting output pulses from the linear scales for detecting the movement of the XY table in the X and Y directions are cleared. Then the printed circuit board number is set by operating the circuit board number button 321h and data keys 321d in the data displaying and setting portion 321. The number thus set is displayed on the display unit 321a. After confirmation, the XY table is driven into such a position that an origin which is determined at an arbitrary point on the circuit board is made incident with the insertion axis P. This movement is at first conducted manually and then is effected automatically by means of the fine adjusting mechanism. Next the registration button 320g is pushed to store the circuit board origin in the memory. Then, an address on the XY table corresponding to the circuit board origin is detected by the linear scales and is stored in the memory. After that, the XY table is moved by operating the table feed keys 320a to 320d in such a manner that a first IC mounting position on the circuit board is aligned with the insertion axis P. In this case, the light beam is projected along the insertion axis P and therefore, the XY table can be easily moved in position, while looking at the circuit board. That is, the XY table may be driven in such a manner that the light beam is made incident upon the reference hole Pa or Pb as shown in FIG. 39. When the operator removes his finger from the table feed key, the fine adjustment is started automatically and the XY table is automatically driven to a given position as described above. When the fine adjustment is completed, the lamp 320f is lighted and a buzzer makes a sound for a short time. Then, the number of a cassette array which contains ICs to be inserted into a relevant position of the circuit board is set by operating the cassette number button 321u and data keys 321d in the data displaying and setting portion 321. This set number is then stored in the memory by pushing the registration button 320g, and at the same time the cassette number is displayed on the display unit 321c. When only the pin correction is to be effected for this IC, the pin correction button 321q is pushed and when neither the pin correction nor cut is to be effected, the no pin-correction and cut button 321r is actuated. The number of pins of the related IC is also stored in the memory automatically. Moreover, when the IC is to be rotated by 90°, the rotation button 321t is operated. Then the mark "B" is displayed on the display unit 321c. For polarity inversion, the invert button 321i is pushed. In this manner, the various kinds of information concerning the relevant IC are set and stored. After this operation has been finished for the relevant circuit board, the trace button 322b in the mode selecting portion 322 is actuated to read out the data from the memory. Then the XY table is automatically driven to move the circuit board into the IC mounting positions successively and at each IC mounting position the cassette number containing the IC to be inserted into the relevant position is displayed on the display unit 321c. In this manner, the operator can confirm the previously set data and if there is an error, the data can be corrected by operating the correction, deletion and addition buttons 321k, 321l and 321m. After confirming all the data for the printed circuit board, the registration button 320g of the table position setting portion 320 is actuated and then the floppy disc actuation button 321e and the data writing-in button 321f in the data displaying and setting portion 321 are operated to transfer the position data and cassette number data to the floppy disc so that the data are stored therein. During the confirmation of the copy, if the continuous button 322e in the mode selecting portion 322 is pushed, the inserting position data for successive positions in the circuit board is automatically read out. Contrary to this, when the single button 322f is actuated, only the data related to the instant inserting position is read out. The skip button 322g is pushed when the relevant inserting position should be skipped.

In the manner just explained above, the necessary data for various printed circuit boards is set and stored in the floppy disc.

Figure 48:
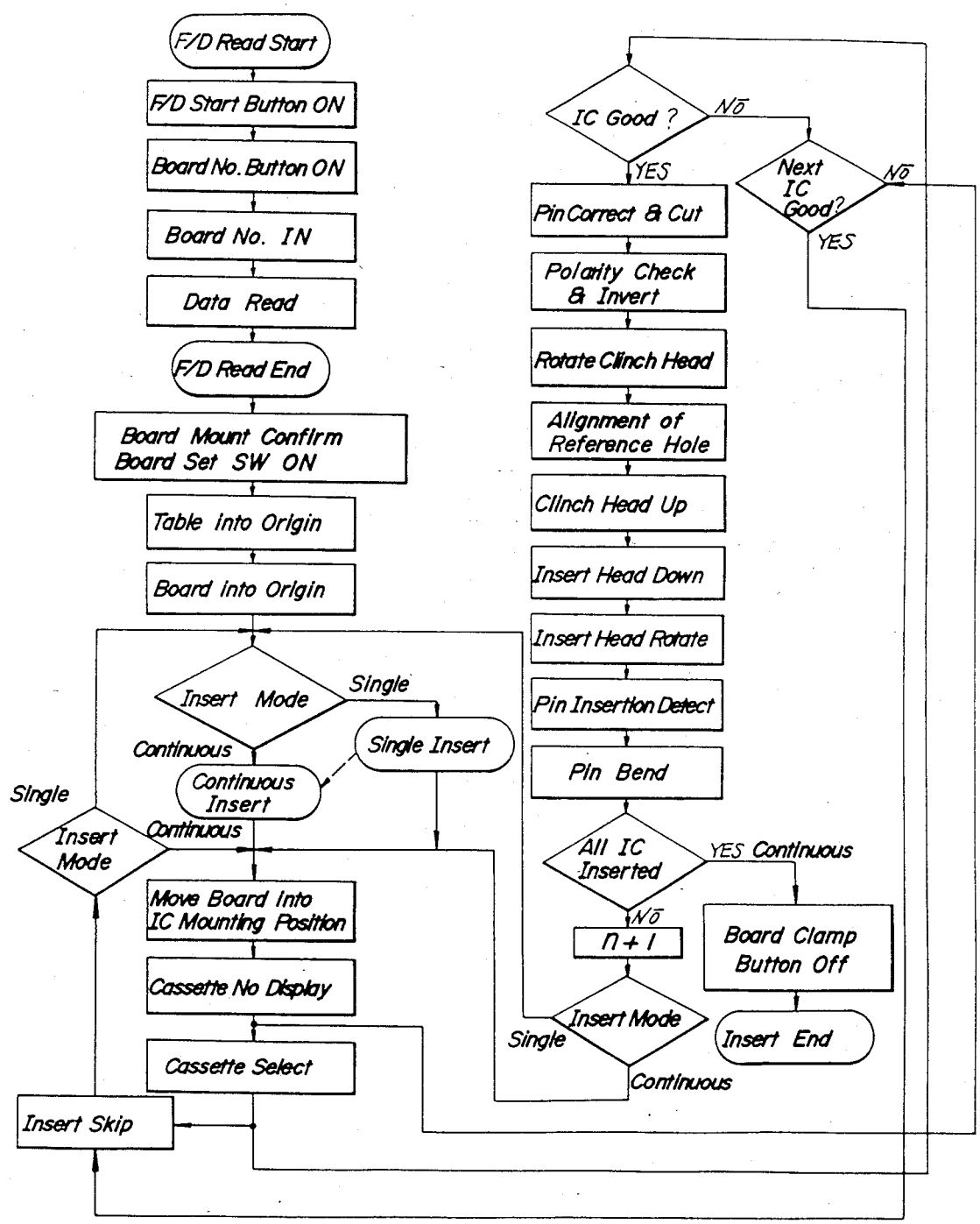
FIG. 48 shows a flow chart of the insertion mode action.

FIG. 48 shows a flow chart of the IC insertion mode. In this embodiment, the inserting action can be made either in the continuous mode or the single mode. In the first place, the floppy disc device is actuated. Secondly, the number of the printed circuit board mounted on the XY table 1e is input by operating the board number button 321h and the data keys 321d of the data displaying and setting portion 321. The data is displayed on the display unit 321a. Thirdly, the data read-out button 321g is pushed to read out the data which has been stored by copying with the aid of a printed circuit board having the same number as said printed circuit board and the read-out data is transferred to the memory of the control circuit and stored therein. Fourthly, the printed board is precisely mounted on the XY table, thereby turning a board set switch ON and confirming that the board is precisely mounted thereon. Whereby, the XY table 1e is moved to the origin and thereafter moved to the position where the origin of the printed circuit board corresponds to the insertion axis. Fifthly, the insertion button 322c is pushed. When the continuous button 322e is pushed, the continuous mode is selected and when the single button 322f is pushed, the single mode is selected. Finally, the X, Y driving motors are energized to move the table, so that the reference hole Pa at the first IC mounting position on the printed circuit board is made coincident with the insertion axis P.

When the single mode is selected, the cassette number charged with the ICs to be inserted into said mounting position is displayed on the display unit 321c. The solenoid 29 of the IC discharge mechanism relating to the relevant cassette 2 is further energized to remove the IC engaging piece 31a from the IC passage as explained with reference to FIG. 4 and to supply an IC 10. The IC 10 is sent to the conveyor portion 1b and further sent to the treating portion 1c by means of the rotating belt 3. It is firstly detected whether the IC is inferior or not by the inferior goods reject mechanism 6b. If the IC is rejected, the same kind of IC is again discharged by driving the IC discharge mechanism once again. If this IC is also rejected as an inferior goods, the operation of the insertor is stopped. On the other hand, the IC passed through the inferior goods reject mechanism is sent to the pin correction and cut portions 6c, 6d. If neither the pin correction button 321g nor the no-correction button 321r is operated during the copying mode, both the correction and cut are carried out, so as to correct the posture of the IC pins and to cut their tips into V-shape. The IC is then sent to the polarity detection and inverting portions 6e, 6f, and its polarity is detected in the first place. If this polarity is opposite to that specified in the copying mode, the IC is rotated by 180° by driving the inversion mechanism. The IC is then sent into the inserting portion 1d. At the inserting portion, the clinch head is rotated and raised in accordance with whether the insertion angle specified in the copying mode is 0° or 90°. Besides, after matching the reference hole of the printed circuit board with the insertion axis, the insertion head is lowered and rotated in accordance with whether the IC is inserted in the 0° or 90° state. After detecting insertion of the IC pins, several pins are bent inwardly and the insertion is completed.

In case of the single mode, after insertion at each position is finished, the single button 322f is pushed, thereby the insertion with respect to the next mounting position is started. When all the ICs are inserted and the board clamp button 323e is actuated to unclamp the board, the printed circuit board 9 may be removed from the XY table 1e.

Next will be explained the case of pushing the continuous button 322e and selecting the continuous insertion mode, but successive actions for each IC are entirely the same as the case of the above-described single mode. As shown in FIG. 2, in the treating portion 1c, gate mechanisms 6g, 6h and 6i are provided between inferior goods reject mechanism 6b, pin correction and cut mechanisms 6c, 6d, polarity detection and inversion mechanism 6e, 6f and insertion portion 1d. therefore, it is possible to carry out these operations, i.e. extraction of inferior goods, correction and cut, polarity detection, inversion and insertion, simultaneously. That is, when the first IC is inserted into the insertion portion 1d, the polarity of the second IC is detected and is inverted, if necessary, the pins of the third IC are corrected and cut, and the fourth IC is judged as to whether it is inferior or not. Thus, insertion efficiency can be remarkably increased, while the time during which the ICs remain in the treating portions can be prolonged, and as a result, a proper treatment can be carried out and erroneous insertion can remarkably be lowered.

Figure 49:
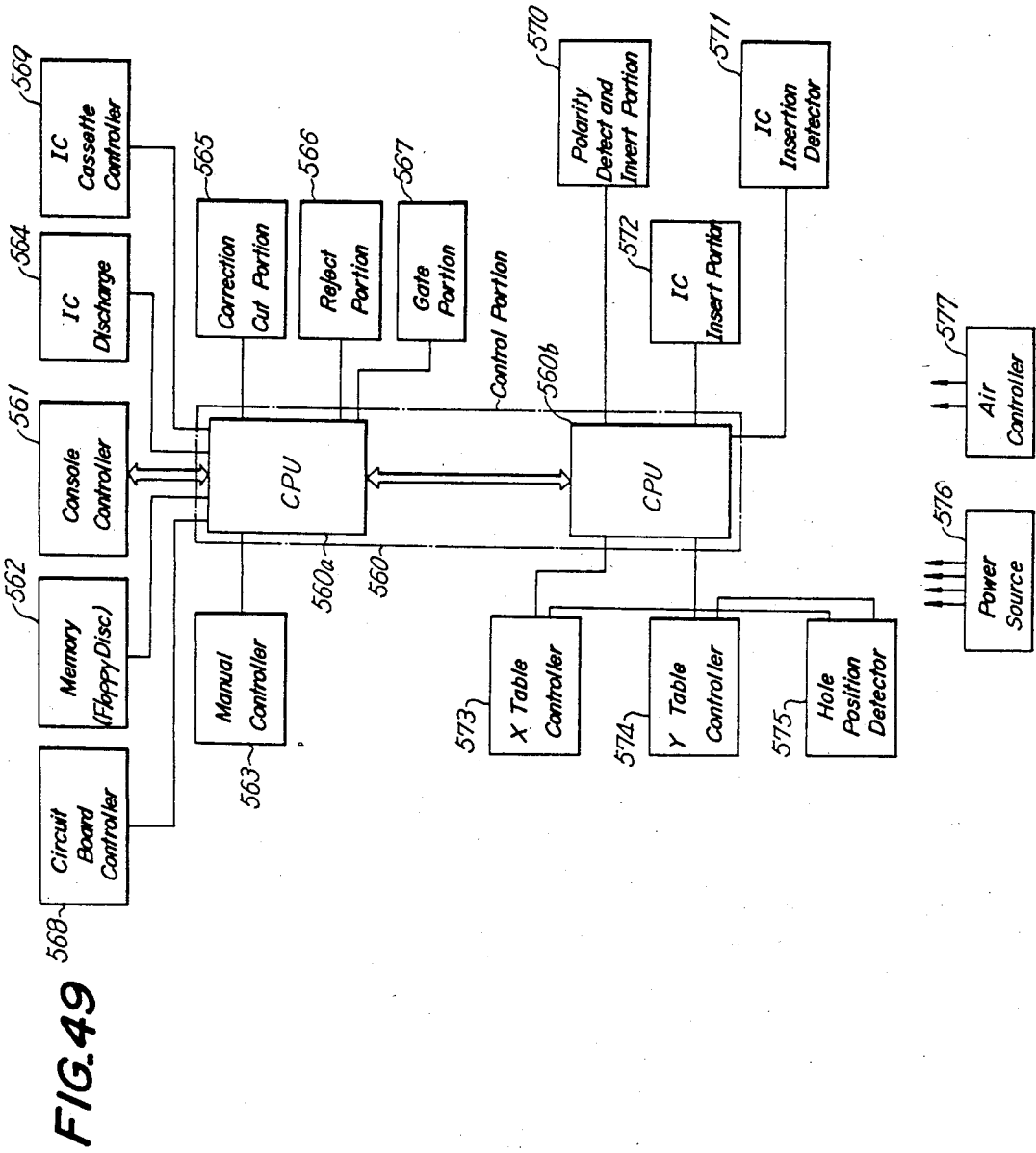
FIG. 49 is a block diagram showing the construction of the control system of the automatic insertion apparatus according to the invention.

FIG. 49 is a block diagram showing the construction of the control system of the above-described IC automatic insertion apparatus. Various portions are controlled by a control portion 560 having two sets of computers 560a, 560b connected to each other. The computer 560a is connected to an operation console controlling portion 561 for transmitting and receiving a signal between each kind of buttons, keys and lamps provided in the operation console 1f. Furthermore, to the computer 560a is connected a memory portion 562 comprising a floppy disc as a memory device for storing data. To the computer 560a are further connected a manual operation portion 563, an IC discharge portion 564 for controlling the IC cassette charging mechanism and the IC discharge mechanism, an IC pin correction and cut portion 565 for controlling the IC pin correction and cut mechanism, an inferior IC reject portion 566 for controlling the inferior goods reject mechanism, and a gate portion 567 for controlling three gate mechanisms. As an option, there may be provided a printed circuit board auto-loader and unloader for automatically charging and discharging a printed circuit board to and from the XY table. The control device further comprises a printed circuit board control portion 568 for controlling the autoloader and an IC cassette storing shelf control portion 569.

To the computer 560b are connected an IC polarity detection and inversion portion 570 for controlling the polarity detection and inversion mechanism, an IC insertion detection portion 571, an IC insertion portion 572 for controlling the inserting head retract stand, the clinch stand and the like, X and Y table controlling and driving portions 573, 574, and an inserting hole position detecting portion 575. there are further provided a power supply source 576 and an air control portion 577 for controlling the accelerating and decelerating air flows.

Figure 50A:
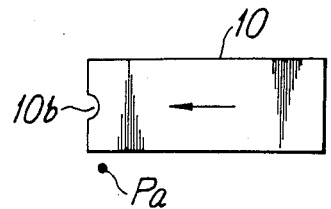
FIGS. 50A to 50D show various IC inserting postures.
Figure 50B:
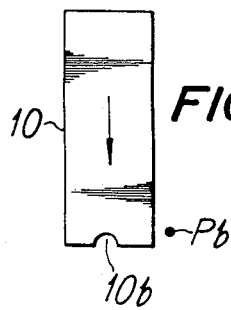
Figure 50C:
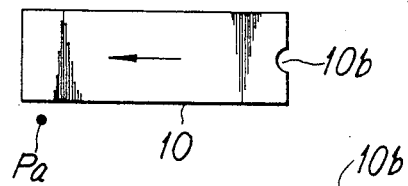
Figure 50D:
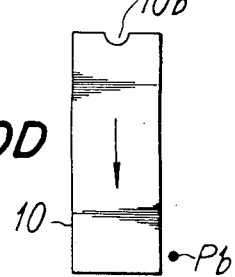

In the above-described IC automatic insertor the IC can be rotated by 180° at the polarity inversion portion and can be further rotated by 90° at the insertion head. As a result, the IC can be inserted at various postures as shown in FIG. 50 by combining these rotating mechanisms. FIG. 50A shows the case of no inversion by 180° nor rotation by 90° and then a mark 10b formed at the top of IC 10 faces the left. In this case, the IC is inserted at 0°, so that the hole Pa is positioned to meet with the insertion axis. FIG. 50B shows the case of inserting the IC without inverting by 180° but rotating by 90°, wherein the mark 10b faces downward, and the hole Pb plays the role of positioning. FIG. 50C shows the case of inserting the IC by inverting by 180°, and the mark 10b faces the right. FIG. 50D shows the case of both 180° inversion and 90° rotation, wherein the mark 10b faces upward. the IC can be inserted at any optional posture in such a manner. In either case, the positioning hole Pa or Pb is always a pin corresponding to the left hand head pin viewed from the conveying direction of the IC into the insertion head as shown by an arrow.

Advantages of the IC automatic insertion apparatus according to the invention are summarized as follows.

(1) A great number of cassettes having electronic parts of the same kind charged therein are placed in the cassette holder and empty cassettes are successively discharged. therefore, any trouble for exchanging cassettes is saved and working efficiency is remarkably improved. Moreover, a plurality of cassettes are aligned in the perpendicular direction and a number of cassette arrays are arranged in the horizontal direction, so that the whole dimension becomes small, workability is increased, and only a tiny space is required for setting up. Therefore, kinds of electronic parts to be inserted can be increased by a large margin.

(2) IC pins are corrected and the tips of pins are cut into V-shape before inserting them into the printed circuit board, so that a proper insertion rate of the pins into the holes of the printed circuit board becomes extremely high. In addition, since correction and cut can simultaneously be carried out, treating efficiency becomes high, the apparatus can be relatively small and its control is simple.

(3) The center of the reference hole of the printed circuit board can be precisely aligned with the insertion axis, so that the proper insertion rate is further improved. In addition, there is no need of positioning the circuit board with respect to the XY table by using a positioning reference hole and a pin as in the prior art, so that the mounting of the printed circuit board on the XY table becomes easy and thus, an automatic loader and unloader may be used.

(4) Mounting of the printed circuit board onto the XY table can positively be carried out by means of a simple mechanism.

(5) Employment of the copying system makes change and modification of information easy and usable.

(6) ICs which are frequently used can be charged over a plurality of cassette arrays and thus, the IC charging operation is further facilitated.

(7) Inferior ICs can be rejected prior to the insertion operation, precision of correction and cut is increased, and the proper insertion rate is improved.

(8) Since the polarity detection and inversion mechanism is provided, the operation of inserting ICs into a cassette is easy and ICs can be inserted with the correct polarity all the time.

(9) The insertion head can be rotated by 90° and therefor ICs can be inserted in various directions.

(10) Since the inserted IC pins are detected, even if an IC might be inserted incorrectly, such IC can easily be found.

(11) ICs can be inserted with various postures by combining the 180° inversion of the IC with the 90° rotation of the insertion head.

What is claimed is:

1. An apparatus for inserting automatically pins of electronic parts into holes formed in a printed circuit board at predetermined inserting positions comprising
    means comprising a table movable in mutually orthogonal X and Y directions, while the printed circuit board is mounted on the table;
    means for holding a number of cassettes, each of which contains a plurality of electronic parts of the same kind;
    means for discharging selectively electronic parts one by one form given cassettes onto an inlet of an electronic part feeding path;
    means provided in the electronic part feeding path for correcting the shape and posture of the pins of electronic parts and for cutting the tips of the pins into V-shape;
    means provided at an outlet of the electronic part feeding path for gripping the pins of an electronic part and inserting the pins into holes formed at a given inserting position in the printed circuit board mounted on the table; and
    means for controlling the table, parts discharging means, correcting and cutting means, and inserting means in such a manner that during a copy mode, position data of the respective inserting positions on the printed circuit board and electronic part data representing kinds of electronic parts to be inserted at respective inserting positions are stored in a memory, and during an insertion mode, the position data is successively read out of the memory to drive the table into such a position that the inserting position is aligned with an insertion axis of the inserting means and the electronic part data is read out of the memory to control the discharging means in such a manner that given electronic parts are successively discharged from given cassettes mounted on the cassette holding means.

2. An apparatus according to claim 1, further comprising
    means provided in the electronic part feeding path at an upstream position with respect to the pin correcting and cutting means for rejecting inferior electronic parts out of the electronic part feeding path.

3. An apparatus according to claim 2, wherein said rejecting means comprises
    means for detecting whether the pins of a relevant electronic part have shape, position and posture within a predetermined range or not; and
    means for removing the electronic parts when the pins are detected to be out of said range.

4. An apparatus according to claim 3, wherein said detecting means comprises
    plate like members arranged to constitute a pair of spaces which are equal to said range;
    means for detecting photoelectrically the existence of the electronic part within said spaces to produce a detection signal; and
    means for comparing the duration of said detection signal with a predetermined time to produce an inferior signal when the duration of the detection signal is longer than said time.

5. An apparatus according to claim 2, further comprising a first gate mechanism provided in said electronic part feeding path between the inferior electronic part rejecting means and said pin correcting and cutting means, for retaining the successively supplied electronic parts and feeding again the electronic parts at a predetermined timing.

6. An apparatus according to claim 5, wherein said gate mechanism comprises a stopper selectively insertable into the electronic part feeding path, an air suction member for decelerating the electronic part fed along the electronic part feeding path and an air projecting member for projecting an air against the electronic part when the electronic part is fed from the gate mechanism into the pin correction and cut member to accelerate the electronic part.

7. An apparatus according to claim 1, further comprising means provided in the electronic part feeding path at a downstream position with respect to the pin correcting and cutting means for detecting the polarity of the electronic part and means for turning the electronic part over 180° when the detected polarity is opposite to that denoted by the electronic part data read out of the memory.

8. An apparatus according to claim 7, wherein said polarity detecting means comprises
    at least two electrodes which selectively contact at least two pins of the electronic part, means for applying across said electrodes a pulsatory voltage having positive and negative pulses having substantially equal amplitudes and durations, means for integrating an electric current passing through the electrodes and pins and means for detecting the polarity of the electronic part in accordance with a polarity of the integrated value.

9. An apparatus according to claim 7, wherein said turning means comprises a rotary rail portion rotatably arranged in the electronic part feeding path, means for stopping the electronic part on said rotary rail portion and means for rotating said rotary rail portion when the detected polarity is opposite to that of the electronic part data read out of the memory.

10. An apparatus according to claim 9, wherein said turning means further comprising an air projecting means for projecting an air flow against the electronic part so as to urge the electronic part against the stopping means.

11. An apparatus according to claim 10, wherein said turning means further comprising means for projecting an air flow against the electronic part in synchronism with the removal of the stopping means from the electronic part feeding path so as to accelerate the electronic part into a succeeding portion.

12. An apparatus according to claim 14, wherein said turning means further comprises means provided at an upstream position with respect to stopping means for sucking an air flow to decelerate the electronic part.

13. An apparatus according to claim 7, further comprising
    a second gate mechanism arranged in the electronic part feeding path between the pin correcting and cutting means and the polarity detecting means for retaining the electronic part and feeding the retained electronic part at a given timing; and a third gate mechanism provided in the electronic part feeding path between the polarity detecting means and the inserting means for retaining the electronic part and supplying the retained electronic part at a given timing.

14. An apparatus according to claim 13, wherein each of said second and third gate mechanism comprises a stopper selectively insertable into the electronic part feeding path, an air suction member for decelerating the electronic part fed along the electronic part feeding path and an air projecting member for projecting an air against the electronic part when the electronic part is fed from the gate mechanism.

15. An apparatus according to claim 1, wherein said pin correcting and cutting means comprises
   a pin correcting mechanism for correcting the shape and posture of the pins of an electronic part;
   a pin cutting mechanism for cutting the tips of pins into V-shape; and
   a control mechanism for independently driving said correcting mechanism and cutting mechanism.

16. An apparatus according to claim 15, wherein said pin correcting and cutting means further comprises a stopper mechanism selectively insertable into the electronic part feeding path to stop the electronic part at a given position.

17. An apparatus according to claim 16, further comprising means provided in the electronic part feeding path at a downstream location with respect to the pin correcting and cutting means for detecting the polarity of the electronic part and means for turning the electronic part over 180° when the detected polarity is opposite to that denoted by the electronic part data read out of the memory, said turning means including a rotary rail portion rotatably arranged in the electronic part feeding path, means for stopping the electronic part on said rotary rail portion, an air projecting means for projecting an air flow against the electronic part so as to urge the electronic part against the stopping means, and means for rotating said rotary rail portion when the detected polarity is opposite to that of the electronic part data read out of the memory.

18. An apparatus according to claim 1, wherein said means for discharging the electronic parts from the cassette comprises
   a first lever movable between a first position in which a front electronic part is retained at an outlet of the cassette and a second position in which the front electronic part is released, and a second lever movable in conjunction with the first lever between a third position in which a next electronic part is released when said first lever is in the first position and a fourth position in which the next electronic part is retained in position when said first lever is in the second position, whereby said first lever is moved into said second position while said second lever is in the fourth position.

19. An apparatus according to claim 1, further comprising means controlled by said controlling means for discharging an empty cassette from the cassette holding means.

20. An apparatus according to claim 1, wherein said inserting means comprises
   an insertion head having a mechanism for gripping the pins of an electronic part and arranged movably along an insertion axis with respect to the printed circuit board and rotatably over 90° about the insertion axis;
   first driving means for reciprocally moving the insertion head along the insertion axis; and
   second driving means for rotating the insertion head by 90° about the insertion axis in accordance with the electronic part data read out of the memory.

21. An apparatus according to claim 20, wherein said inserting means further comprises means for driving said pin gripping mechanism in synchronism with the movement of the insertion head along the insertion axis.

22. An apparatus according to claim 20, wherein said insertion head comprises
   cylindrical body arranged movably in the insertion axis and rotatably about the insertion axis, and
   a pusher arranged in said cylindrical body movably in said insertion axis.

23. An apparatus according to claim 20, wherein said inserting means further comprises a retract stand selectively insertable into the electronic part feeding path for stopping the electronic part at a given position in the insertion axis, whereby after the pins of an electronic part are gripped by the pin gripping mechanism, the retract stand is removed out of the insertion axis.

24. An apparatus according to claim 20, wherein the inserting means further comprises a clinch head arranged underneath the table movably in the insertion axis and rotatably by 90° about the insertion axis, whereby the clinch head is driven in synchronism with the insertion head.

25. An apparatus according to claim 24, wherein said clinch head comprises means for bending inwardly a plurality of pins inserted into the holes formed in the printed circuit board.

26. An apparatus according to claim 24, wherein said clinch head comprises means for detecting photoelectrically the pins inserted into the holes formed in the printed circuit board.

27. An apparatus according to claim 26, wherein said inserted pin detecting means comprises
   a light source;
   a first group of optical fibers having incident ends arranged to receive light emitted from the light source and exit ends arranged to project light beams toward the inserted pins;
   a second group of optical fibers having incident ends arranged to receive light beams reflected from the inserted pins and having exit ends; and
   light detectors arranged to receive light beams emitted from the exit ends of said optical fibers of second group.

28. An apparatus according to claim 20, further comprising
   first and second light sources for projecting first and second light beams along optical paths which are in parallel with the insertion axis and are separated from each other by a given distance determined in accordance with the rotation of the insertion head;
   a shutter mechanism selectively insertable in either one of said optical paths;
   four light detectors arranged to receive the light beam passed through a reference hole formed in the printed circuit board to produce electrical signals having amplitude proportional to amounts of the received light beam; and
   means for comparing the four electrical signals with each other to detect a deviation of the position of the reference hole with respect to a reference position related to the insertion axis.

29. An apparatus according to claim 1, further comprising
a light source for projecting a light beam along an optical path which is in parallel with the insertion axis and passes through a reference hole formed in the printed circuit board;
four light detectors for receiving the light beam and producing elecrical signals propertional to amounts of received light; and
means for comparing the electrical signals thus produced with each other to detect a deviation of the position of the reference hole with respect to a reference position related to the insertion axis.

30. An apparatus according to claim 1, wherein said table comprises a clamping mechanism for detachably holding the printed circuit board on the table, said clamping mechanism including a pusher arranged movably in a plane parallel with a mounting surface on which the printed circuit board is placed, a clamper arranged rotatably in a plane perpendicular to said plane, and a mechanism for rotating said clamper in conjunction with the movement of the pusher whereby the printed circuit board is urged against the table mounting surface by means of the clamper.

* * * * *